(12) United States Patent
Saito et al.

(10) Patent No.: US 6,607,641 B2
(45) Date of Patent: Aug. 19, 2003

(54) METHOD OF PRODUCING EXCHANGE COUPLING FILM AND METHOD OF PRODUCING MAGNETORESISTIVE SENSOR BY USING THE EXCHANGE COUPLING FILM

(75) Inventors: Masamichi Saito, Niigata-ken (JP); Naoya Hasegawa, Niigata-ken (JP); Yosuke Ide, Niigata-ken (JP); Kenichi Tanaka, Niigata-ken (JP)

(73) Assignee: Alps Electric Co., Ltd. (JP)

( * ) Notice: Subject to any disclaimer, the term of this patent is extended or adjusted under 35 U.S.C. 154(b) by 0 days.

(21) Appl. No.: 09/833,459

(22) Filed: Apr. 11, 2001

(65) Prior Publication Data

US 2001/0047930 A1 Dec. 6, 2001

(30) Foreign Application Priority Data

Apr. 12, 2000 (JP) .......................................... 2000-110616

(51) Int. Cl.[7] .......................... C23C 14/34; B05D 5/12; B05D 3/02
(52) U.S. Cl. .............................. 204/192.2; 204/192.15; 427/130; 427/131; 427/372.2
(58) Field of Search ...................... 204/192.12, 192.15, 204/192.2; 427/130, 131, 372.2; 428/694 TS, 694 TM; 360/313

(56) References Cited

U.S. PATENT DOCUMENTS

| | | | |
|---|---|---|---|
| 5,731,936 A | 3/1998 | Lee et al. .................... 360/113 |
| 5,768,067 A | 6/1998 | Saito et al. .................. 360/113 |
| 5,784,225 A | 7/1998 | Saito et al. .................. 360/113 |
| 6,023,395 A | 2/2000 | Dill et al. .................... 360/113 |
| 6,046,892 A | 4/2000 | Aoshima et al. ............. 360/113 |
| 6,083,632 A | * 7/2000 | Fujikata et al. .............. 428/611 |
| 6,411,476 B1 | 6/2002 | Lin et al. ................ 360/324.11 |
| 6,433,972 B1 | 8/2002 | Mao et al. ............. 360/324.11 |
| 6,452,763 B1 | 9/2002 | Gill ........................ 360/324.11 |
| 6,456,469 B1 | 9/2002 | Gill ........................ 360/324.11 |

FOREIGN PATENT DOCUMENTS

JP 8-88118 7/1996 ........... H01F/10/14

OTHER PUBLICATIONS

English translation of JP 11–191647.*

English translation of JP 9–69211.*

* cited by examiner

*Primary Examiner*—Steven H. VerSteeg
(74) *Attorney, Agent, or Firm*—Brinks Hofer Gilson & Lione

(57) ABSTRACT

An exchange coupling film includes a first antiferromagnetic layer formed on a pinned magnetic layer, and a second antiferromagnetic layer formed thereon. A composition ratio of an element X in the first antiferromagnetic layer is larger than that of the second antiferromagnetic layer. Preferably, a non-aligned state is created at an interface between the first antiferromagnetic layer and the pinned magnetic layer, whereby a large exchange coupling magnetic field is obtained upon heat-treatment.

78 Claims, 13 Drawing Sheets

METHOD OF PRODUCING EXCHANGE COUPLING FILM AND METHOD OF PRODUCING MAGNETORESISTIVE SENSOR BY USING THE EXCHANGE COUPLING FILM

Reference is hereby made to commonly-assigned, copending patent applications having the following titles, serial numbers, and docket numbers:

"Method of Producing Exchange Coupling Film and Method of Producing Magnetoresistive Sensor by Using the Exchange Coupling Film", application Ser. No. 09/833,306, docket number: 9281-3954.

"Exchange Coupling Film and Electroresistive Sensor Using the Same", application Ser. No. 09/833,756, docket number: 9281-3955.

"Exchange Coupling Film and Electroresistive Sensor Using the Same", application Ser. No. 09/834,105, docket number 9281-3957.

BACKGROUND

The present invention relates to methods of producing an exchange coupling film having an antiferromagnetic layer and a ferromagnetic layer, wherein the direction of magnetization of the ferromagnetic layer is fixed by an exchange coupling magnetic field produced at the interface between the antiferromagnetic layer and the ferromagnetic layer. More particularly, the present invention relates to methods of producing an exchange coupling film that provides a large exchange coupling magnetic field, to methods of producing a magnetoresistive sensor (spin-valve-type thin-film device, AMR device), and to methods of producing a thin-film magnetic head using the magnetoresistive sensor.

A spin-valve-type thin-film device is a kind of GMR (Giant Magnetoresistive) device which makes use of a giant magnetoresistive effect, which is used for detecting recording magnetic fields from a recording medium such as a hard disk.

The spin-valve-type thin-film device, relative to other GMR devices, has advantageous features such as simplicity of structure and ability to vary its magnetic resistance even under a weak magnetic field.

The simplest form of the spin-valve-type thin-film device includes an antiferromagnetic layer, a pinned magnetic layer, a non-magnetic intermediate layer, and a free magnetic layer.

The antiferromagnetic layer and the pinned magnetic layer are formed in contact with each other. The direction of the pinned magnetic layer is aligned in a single magnetic domain state and fixed by an exchange anisotropic magnetic field produced at the interface between the antiferromagnetic layer and the pinned magnetic layer.

The magnetization of the free magnetic layer is aligned in a direction which intersects the direction of magnetization of the pinned magnetic layer, by the effect of bias layers that are formed on both sides of the free magnetic layer.

Alloy films such as an Fe—Mn (Iron-Manganese) alloy films, Ni—Mn (Nickel-Manganese) alloy films and Pt—Mn (Platinum-Manganese) alloy films are generally usable materials for the antiferromagnetic layer. Of these, Pt—Mn alloy films are attracting attention for advantages such as high blocking temperature, superior corrosion resistance, and so forth.

It has been found that when a Pt—Mn alloy film is used for the antiferromagnetic layer, the antiferromagnetic layer deposited has a face-centered cubic crystalline structure in which atoms are irregularly aligned.

In order to develop the proper intensity of exchange coupling magnetic field between the antiferromagnetic layer and a ferromagnetic layer, it is necessary to transform the crystalline structure of the deposited antiferromagnetic layer from a face-centered cubic disordered lattice into a CuAu—I type face-centered cubic ordered lattice. This transformation is caused by effecting a heat-treatment.

In addition, it has been found that in a bulk type Pt—Mn alloy, a CuAu—I type face-centered lattice is easiest to obtain—and, therefore, antiferromagnetic properties are easiest to achieve—when the at % ratio between Pt and Mn is 50:50. Thus, to measure the intensity of an exchange coupling magnetic field developed between the antiferromagnetic layer and the ferromagnetic layer, the present inventors used a Pt—Mn alloy film with an at % ratio between Pt and Mn of approximately 50:50 as an antiferromagnetic layer in a spin-valve-type thin-film device.

It was found, however, that a sufficient intensity of the exchange coupling magnetic field could not be obtained, despite an ideal bulk type composition ratio of Pt to Mn. While it is not the Applicants' desire to be bound by a particular theory, it is believed that this results from an insufficient transformation of the crystalline structure of the antiferromagnetic layer from a disordered lattice into an ordered lattice even following a heat-treatment.

SUMMARY

Accordingly, an object of the present invention is to provide a method of producing an exchange coupling film having a large exchange anisotropic magnetic field by using an antiferromagnetic material comprising an element X (X is a platinum group element) and Mn as the antiferromagnetic layer, a method of producing a magnetoresistive sensor using the exchange coupling film, and a method of producing a thin-film magnetic head using the magnetoresistive sensor, thereby overcoming the above-described problems.

In accordance with a first aspect of the present invention, there is provided a method of producing an exchange coupling film comprising: forming a first antiferromagnetic layer which contacts a ferromagnetic layer at an interface therebetween from antiferromagnetic materials comprising an element X and Mn, and forming a second antiferromagnetic layer which contacts the first antiferromagnetic layer from antiferromagnetic materials comprising an element X and Mn, wherein the element X comprises one or more elements selected from the group consisting of Pt, Pd, Ir, Rh, Ru and Os, such that the second antiferromagnetic layer has a smaller composition ratio of the element X than the first antiferromagnetic layer; and effecting a heat-treatment whereby an exchange coupling magnetic field at the interface between the first antiferromagnetic layer and the ferromagnetic layer is developed.

As described above, when the at % ratio between Pt and Mn is 50:50, the crystalline structure is transformed into an ordered lattice, and antiferromagnetic properties are mostly exhibited. However, since it is difficult to create a non-aligned state at the interface between the antiferromagnetic layer and the ferromagnetic layer, transformation from a disordered lattice into an ordered lattice is not sufficiently effected by the heat-treatment; as a result, an insufficient exchange coupling magnetic field is obtained. The term "non-aligned state" means that atoms in the antiferromagnetic layer and atoms in the ferromagnetic layer differ in positional relationship and do not provide a one-to-one correspondence.

On the other hand, a Pt content below 50 at % makes it difficult to transform the crystalline structure into an ordered lattice by heat-treatment, and to achieve antiferromagnetic properties. At the same time, an aligned state at the interface between the antiferromagnetic layer and the ferromagnetic layer is strong, such that the exchange coupling magnetic field is considerably reduced.

On the one hand, a Pt content above 50 at % facilitates creation of a non-aligned state at the interface between the ferromagnetic layer and the antiferromagnetic layer but, on the other hand, makes it difficult to transform the crystalline structure into an ordered lattice by heat-treatment and to achieve antiferromagnetic properties. As a result, the exchange coupling magnetic field is considerably reduced.

Accordingly, when depositing the antiferromagnetic layer prior to heat-treatment, a thin layer of a Pt—Mn alloy with a high Pt content (referred to as the "first antiferromagnetic layer") is formed on the side of the antiferromagnetic layer adjacent to the ferromagnetic layer. In addition, a Pt—Mn alloy film having a composition ratio that is easily transformed from a disordered lattice into an ordered lattice upon heat-treatment (referred to as the "second antiferromagnetic layer"), and having a thickness larger than that of the first antiferromagnetic layer, is formed on the ferromagnetic layer through the intermediary of the first antiferromagnetic layer.

While it is not the Applicants' desire to be bound by a particular theory, it is believed that during the deposition and prior to heat-treatment, the high Pt content of the first antiferromagnetic layer eliminates the influence of crystalline structure and the like of the ferromagnetic layer at the interface between the ferromagnetic layer and the first antiferromagnetic layer. The second antiferromagnetic layer is properly transformed by heat-treatment, and a diffusion of component takes place in the first and second antiferromagnetic layers when the transformation is started. As a result, the Pt content varies and the deposited composition prior to heat-treatment is transformed into a composition which is easy to transform from a disordered lattice into an ordered lattice. Thus, the transformation is caused in the first antiferromagnetic layer.

More specifically, according to the production method heretofore described, the first antiferromagnetic layer which has a high Pt content and which is not influenced by the crystalline structure and the like of the ferromagnetic layer at the interface between the ferromagnetic layer and the first antiferromagnetic layer is provided between the second antiferromagnetic layer which is formed from an ideal composition for easily obtaining a CuAu—I type face-centered cubic ordered lattice and the ferromagnetic layer. As a result, the antiferromagnetic layers can be sufficiently transformed from a disordered lattice into an ordered lattice while maintaining the non-influenced state, thereby making it possible to obtain a greater exchange coupling magnetic field than heretofore.

In accordance with the present invention, the second ferromagnetic layer is formed from an antiferromagnetic material containing an element X and Mn, such that the composition ratio of the element X of the second antiferromagnetic layer is smaller than that of the first ferromagnetic layer. This allows the second antiferromagnetic layer to be properly transformed from a disordered lattice into an ordered lattice upon heat-treatment, thereby making it possible to obtain a large exchange coupling magnetic field.

Preferably, the lattice constant of the first antiferromagnetic layer is different from the lattice constant of the ferromagnetic layer at at least a part of the interface between the first antiferromagnetic layer and the ferromagnetic layer. In addition, the crystal orientation of the first antiferromagnetic layer may be different from the crystal orientation of the ferromagnetic layer at at least a part of the interface between the first antiferromagnetic layer and the ferromagnetic layer.

In accord with the present invention, a difference in crystal orientation is created between the first antiferromagnetic layer and the ferromagnetic layer after deposition.

For instance, when the (111) plane of the ferromagnetic layer has been preferentially oriented in a direction parallel to the interface, the (111) plane of the antiferromagnetic layer either has a smaller degree of orientation than that of the (111) plane of the ferromagnetic layer, or is altogether unoriented.

Alternatively, when the (111) plane of the antiferromagnetic layer has been preferentially oriented in a direction parallel to the interface, the (111) plane of the ferromagnetic layer either has a smaller degree of orientation than that of the (111) plane of the antiferromagnetic layer, or is altogether unoriented.

In another alternative, the degrees of orientation of the (111) faces of the antiferromagnetic layer and the ferromagnetic layer either have reduced degrees of orientation, or are altogether unoriented, with respect to the directions parallel to the interface between the antiferromagnetic layer and the ferromagnetic layer 3. Crystal planes other than the (111) planes are preferentially oriented with respect to the directions parallel to the interface, thereby creating a difference in crystal orientation between the antiferromagnetic layer and the ferromagnetic layer.

The degree of crystal orientation is controllable by varying the order of deposition of the layers, or by varying conditions such as presence or absence of an underlying layer, composition ratio, electrical power and gas pressure during sputtering.

Preferably, a non-aligned state is created at at least a part of the interface between the first antiferromagnetic layer and the ferromagnetic layer. It is possible to diminish a restraint force produced by the crystalline structure, etc. of the ferromagnetic layer on the interface by obtaining such a non-aligned state.

It is possible to facilitate creation of the non-aligned state at the interface between the antiferromagnetic layer and the ferromagnetic layer and to obtain a greater exchange coupling magnetic field than heretofore, by creating a difference in lattice constant or crystal orientation at the interface between the antiferromagnetic layer and the ferromagnetic layer, as described above.

In addition, it is preferred that at least a first antiferromagnetic layer which contacts a ferromagnetic layer at an interface therebetween, and a second antiferromagnetic layer which contacts the first antiferromagnetic layer are formed, the first and second antiferromagnetic materials comprising an element X, an element X' and Mn, wherein the element X is one or more elements selected from the group consisting of Pt, Pd, Ir, Rh, Ru, and Os, and the element X' comprises one or more elements selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb and a rare earth element, such that a composition ratio of the elements X–X' of the second antiferromagnetic layer is smaller than a composition ratio of the elements X+X' of the first antiferromagnetic layer. This also makes it possible to provide an exchange coupling film which can provide a larger exchange coupling magnetic field than conventional exchange coupling magnetic fields.

When the antiferromagnetic layer is formed from an X—Mn—X' alloy, it is preferable that the element X' be an element which would invade the interstices of the space lattice composed of the element X and Mn or an element which would substitute for a portion of the lattice points of the crystalline lattice constituted by Mn and the element X. This can enhance the lattice constants of the first and second antiferromagnetic layers. In particular, creation of a non-aligned state at the interface between the first antiferromagnetic layer and the ferromagnetic layer is facilitated, thereby making it possible to obtain a large exchange coupling magnetic field.

Preferably, the composition ratio of the element X or the composition ratio of the elements X+X' of the second antiferromagnetic layer is not less than 44 at % and not more than 57 at %, more preferably not less than 46 at % and not more than 5 at %.

Composition ratios within this range can properly transform from a disordered lattice into an ordered lattice upon heat-treatment, thus affording a large exchange coupling magnetic field.

Preferably, the composition ratio of the element X or the composition ratio of the elements X+X' of the first antiferromagnetic layer is not less than 53 at % and not more than 65 at %. Results of experiments which will be described hereinbelow show that composition ratios of the element X or composition ratios of the elements X+X' of the first antiferromagnetic layer within this range can provide an exchange coupling magnetic field of $7.9 \times 10^4$ A/m or greater.

In accordance with the present invention, it is preferred that the composition ratio of the element X and the composition ratio of the elements X+X' of the first antiferromagnetic layer are not less than 55 at % and not more than 60 at %, so that a greater exchange coupling magnetic field is obtained.

In accordance with the present invention, it is also preferred that the second antiferromagnetic layer has a thickness of 70 Å or greater. It has been found that an exchange coupling magnetic field of $7.9 \times 10^4$ A/m or greater can be obtained when the second antiferromagnetic layer has a thickness within this range.

It is also preferred that the first antiferromagnetic layer has a thickness not smaller than 3 Å and not greater than 30 Å. It has been found that an exchange coupling magnetic field of $7.9 \times 10^4$ A/m or greater can be obtained when the first antiferromagnetic layer has a thickness falling within this range.

In accordance with the present invention, it is preferred that the first and second antiferromagnetic layers are formed by a sputtering process, and that the sputtering gas pressure at which the first antiferromagnetic layer is formed is lower than the sputtering gas pressure at which the second antiferromagnetic layer is formed. This makes it possible to reduce the element X in the composition ratio of the elements X+X' of the second antiferromagnetic layer to be smaller than the element X in the composition ratio of the elements X+X' of the first antiferromagnetic layer.

In accordance with a second aspect of the present invention, there is provided a method of producing an exchange coupling film which develops an exchange coupling magnetic field at an interface between an antiferromagnetic layer and a ferromagnetic layer, the method comprising: forming the ferromagnetic layer; forming the antiferromagnetic layer on the ferromagnetic layer by a sputtering process in which an element X and Mn are used as sputtering targets, wherein the element X comprises one or more elements selected from the group consisting of Pt, Pd, Ir, Rh, Ru, and Os, and wherein a sputtering gas pressure is progressively increased in a direction away from the ferromagnetic layer during the forming of the antiferromagnetic layer, such that the composition ratio (atomic percent) of the element X is reduced in a direction away from the ferromagnetic layer; and effecting a heat-treatment after forming the antiferromagnetic layer and the ferromagnetic layer, such that an exchange coupling magnetic field is developed at the interface between the antiferromagnetic layer and the ferromagnetic layer.

Preferably, a difference in lattice constant is created between the antiferromagnetic layer and the ferromagnetic layer at at least a part of the interface between the antiferromagnetic layer and the ferromagnetic layer.

Alternatively, a difference in crystal orientation may be created between the antiferromagnetic layer and the ferromagnetic layer at at least a part of the interface between the antiferromagnetic layer and the ferromagnetic layer.

It is also preferred that a non-aligned state is created at at least a part of the interface between the antiferromagnetic layer and the ferromagnetic layer.

In this method according to the present invention, it is preferred that the antiferromagnetic layer is formed by a sputtering process in which elements X+X' and Mn are used as sputtering targets, wherein the element X' comprises one or more elements selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb and a rare earth element, and wherein the sputtering gas pressure is progressively increased in a direction away from the ferromagnetic layer 3 during the forming of the antiferromagnetic layer, such that the composition ratio (atomic percent) of the elements X+X' is reduced in a direction away from the ferromagnetic layer.

In addition, the element X' may preferably be an element which would invade the interstices of a space lattice composed of the element X and Mn or an element which would substitute for a portion of the lattice points of a crystalline lattice constituted by Mn and the element X.

In an alternative embodiment in accordance with the present invention, the antiferromagnetic layer may be composed of a single layer rather than the first and second ferromagnetic layers in the as-deposited state. The production method is characterized in that the composition ratio (at %) of the element X or the composition ratio (at %) of the elements X+X' of the antiferromagnetic layer is progressively decreased in a direction away from the ferromagnetic layer during deposition of the antiferromagnetic layer, while the sputtering gas pressure is changed. During deposition, an unaligned state is created at at least a part of the interface between the antiferromagnetic layer and the ferromagnetic layer. In addition, a difference in lattice constant and a difference in crystal orientation are created.

By effecting a heat-treatment, deformation from a disordered lattice to an ordered lattice is started in a region of the antiferromagnetic layer away from the interface. When the transformation is promoted, the elements actively diffuse through the antiferromagnetic layer, and the composition ratio (at %) of the element X or the composition ratio (at %) of the elements X+X' is decreased near the interface. As a result, proper transformation from a disordered lattice into an ordered lattice is effected.

Thus, in accordance with the present invention, the antiferromagnetic layer is not influenced by the restraint force of the crystalline structure and the like of the ferromagnetic layer at the interface between the ferromagnetic layer and the antiferromagnetic layer. Even in the deposition described above, the overall antiferromagnetic layer can be properly transformed from a disordered lattice into an ordered lattice, making it possible to obtain a greater exchange coupling magnetic field than was heretofore possible.

Preferably, the composition ratio of the element X or the elements X+X' of the antiferromagnetic layer to the total composition ratio (100 at %) of all the elements constituting the antiferromagnetic layer is not less than 44 at % and not more than 57 at %, more preferably not less than 46 at % and not more than 55 at % in a region of the antiferromagnetic layer opposite to the interface.

In addition, it is preferable that the composition ratio of the element X or the elements X+X' of the antiferromagnetic layer to the total composition ratio (100 at %) of all the elements constituting the antiferromagnetic layer is not less than 53 at % and not more than 65 at %, in the region near the interface between the antiferromagnetic layer and the ferromagnetic layer. It has been confirmed that a composition ratio within this range can provide an exchange coupling magnetic field of $7.9 \times 10^4$ A/m or greater.

It is more preferable that the composition ratio of the element X or the elements X+X' of the antiferromagnetic layer to the total composition ratio (100 at %) of all the elements constituting the antiferromagnetic layer is not less than 55 at % but not more than 60 at %, in the region of the antiferromagnetic layer near the interface.

In addition, the antiferromagnetic layer may preferably have a thickness of 73 Å or greater.

The methods of producing an exchange coupling film described above can be used for the production of a variety of types of magnetoresistive sensors.

The present invention also provides a method of producing a single-spin valve type magnetoresistive sensor comprising an antiferromagnetic layer, a pinned magnetic layer in contact with the antiferromagnetic layer which has a direction of magnetization fixed by an exchange anisotropic magnetic field with the antiferromagnetic layer, a non-magnetic intermediate layer between the pinned magnetic layer and a free magnetic layer, and a bias layer which aligns the direction of magnetization of the free magnetic layer in a direction that intersects the direction of magnetization of the pinned magnetic layer. The method comprises forming the antiferromagnetic layer and the pinned magnetic layer in contact therewith from the exchange coupling film described above.

The present invention also provides a method of producing a single-spin valve type magnetoresistive sensor comprising an antiferromagnetic layer, a pinned magnetic layer in contact with the antiferromagnetic layer which has a direction of magnetization fixed by an exchange anisotropic magnetic field with the antiferromagnetic layer, a non-magnetic intermediate layer between the pinned magnetic layer and a free magnetic layer having an upper side and a lower side, and an antiferromagnetic exchange bias layer on either the upper side or the lower side of the free magnetic layer, the antiferromagnetic exchange bias layer comprising a plurality of portions spaced from each other in the track width direction, the method comprising forming the exchange bias layer and the free magnetic layer from the exchange coupling film described above, such that the free magnetic layer is magnetized in a fixed direction.

The present invention also provides a method of producing a dual-spin valve type magnetoresistive sensor comprising a first antiferromagnetic layer; a first pinned magnetic layer overlying the first antiferromagnetic layer; a first non-magnetic layer overlying the first pinned magnetic layer; a free magnetic layer overlying the first non-magnetic layer; a second non-magnetic layer overlying the free magnetic layer; a second pinned magnetic layer overlying the second non-magnetic layer; a second antiferromagnetic layer overlying the second pinned magnetic layer, the first and second antiferromagnetic layers serving to fix directions of magnetization of the first and second pinned magnetic layers by exchange anisotropic magnetic fields; and a bias layer which aligns a direction of magnetization of the free magnetic layer to a direction that intersects the directions of the first and second pinned magnetic layers, the method comprising forming at least one of the first and second antiferromagnetic layers, and at least one of the first and second pinned magnetic layers in contact therewith, from the exchange coupling film described above.

Furthermore, the present invention provides a method of producing an AMR device comprising a magnetoresistive layer having an upper side and a lower side and a soft magnetic layer, the magnetoresistive layer and the soft magnetic layer being superposed through the intermediary of a non-magnetic layer, and an antiferromagnetic layer on the upper side or the lower side of the magnetoresistive layer, the antiferromagnetic layer comprising a plurality of portions spaced apart in the track width direction, the method comprising forming the antiferromagnetic layer and the magnetoresistive layer from the exchange coupling film described above.

A method in accord with the present invention for producing a thin-film magnetic head comprises forming, on each of the upper side and the lower side of one of the magnetoresistive sensors heretofore described, a shield layer across a gap layer.

A magnetoresistive sensor formed by using the large exchange coupling magnetic field has excellent thermal stability. The magnetoresistive sensor can be properly operated even at high ambient temperature during driving, and a large resistance variation ratio can be maintained.

DESCRIPTION OF THE PRESENTLY PREFERRED EMBODIMENTS

Figure 1:
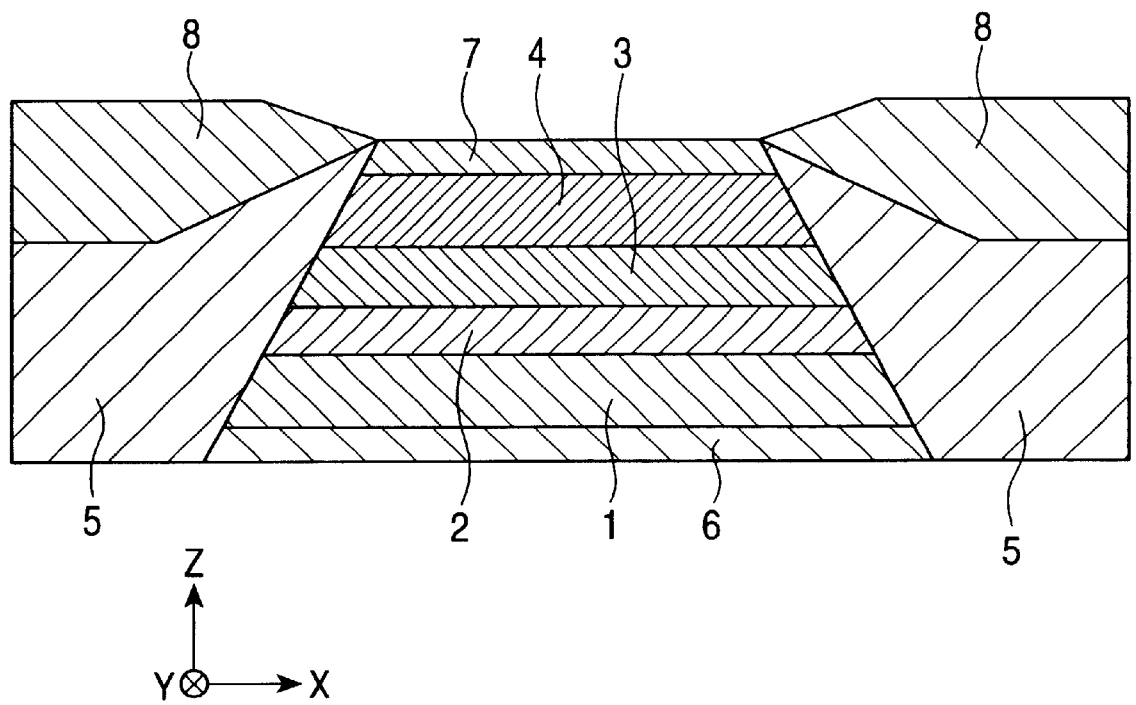
FIG. 1 is a sectional view of a single-spin valve type magnetoresistive sensor in accord with the present invention, viewed from the same side as an ABS surface.

FIG. 1 is a sectional view of a single-spin valve type magnetoresistive sensor constituting a first embodiment of the present invention, viewed from the same side as the ABS surface. In FIG. 1, only the central portion of the device extending in the X direction is shown.

This single-spin valve type magnetoresistive sensor can be provided on a trailing side end of a floating slider of a hard disk device, and can be used to detect the recording magnetic fields of the hard disk. A recording medium such as the hard disk moves in the Z direction, while the magnetic field leaks from the hard disk in the Y direction.

Figure 6:
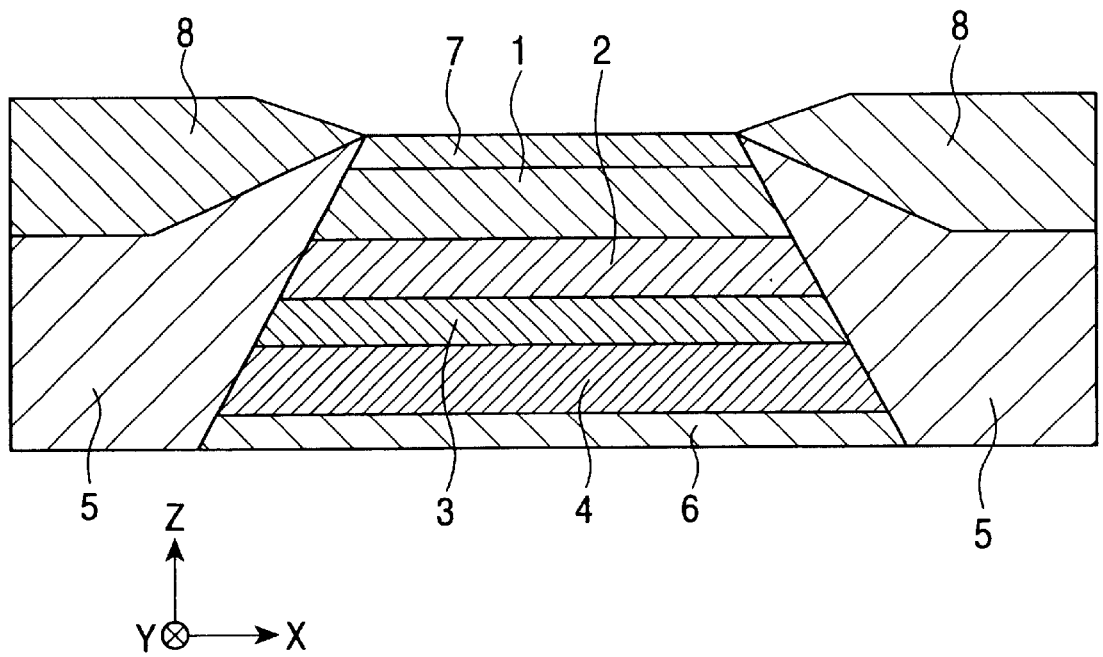
FIG. 6 is a sectional view of a single-spin valve type magnetoresistive sensor in accord with the present invention, viewed from the same side as an ABS surface.

Referring to FIG. 6, the lowermost layer, underlying layer 6, is made from a non-magnetic material containing one or more elements selected from the group consisting of Ta, Hf, Nb, Zr, Mo, and W. A free magnetic layer 1, a non-magnetic intermediate layer 2, a pinned magnetic layer 3, and an antiferromagnetic layer 4 are deposited on underlying layer 6. A protective layer 7 made from a non-magnetic material containing one or more elements selected from the group consisting of Ta, Hf, Nb, Zr, Ti, Mo, and W overlies antiferromagnetic layer 4.

As shown in FIG. 1, a hard bias layer 5 is formed on each end of the six-layered laminate composed of six layers from underlying layer 6 to protective layers 7 inclusive. A conductive layer 8 is deposited on each portion of the hard bias layer 5.

In accordance with the present invention, each of free magnetic layer 1 and pinned magnetic layer 3 is made from, for example, a Ni—Fe alloy, a Co—Fe alloy, Co, or a Co—Ni—Fe alloy.

In the structure shown in FIG. 1, the free magnetic layer 1 is formed from a single layer. However, free magnetic layer 1 may alternatively be multi-layered. For instance, free magnetic layer 1 may be formed of a laminate composed of layers of a Ni—Fe alloy and Co.

The non-magnetic intermediate layer 2 interposed between free magnetic layer 1 and pinned magnetic layer 3 is formed of Cu, for example. When the magnetoresistive sensor embodying the present invention is a tunnel-type magnetoresistive sensor (TMR sensor) which uses the tunneling effect, the non-magnetic intermediate layer 2 is made from an insulating material such as $Al_2O_3$. The hard bias layer 5 is formed of, for example, a Co—Pt (cobalt-platinum) alloy or a Co—Cr—Pt (cobalt-chromium-platinum) alloy. The conductive layer 8 is made from Cu, W, or the like. In the case of a tunnel-type magnetoresistive sensor, the conductive layer 8 is formed on both the lower side of the free magnetic layer 1 and the upper side of the antiferromagnetic layer 4.

A method of producing a magnetoresistive sensor in accord with the present invention, will be described, followed by a description of the features of the magnetoresistive sensor produced.

Figure 2:
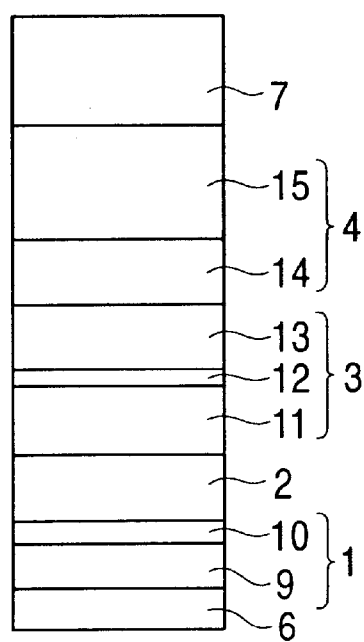
FIG. 2 is a schematic illustration of a laminate structure in accord with the present invention in a state after deposition and prior to heat-treatment.

FIG. 2 is a schematic illustration of a laminate structure which has, analogous to the structure shown in FIG. 1, a lowermost underlying layer 6 and an uppermost protective layer 7, with an antiferromagnetic layer 4 formed on the upper side of a pinned magnetic layer 3. The laminate structure shown in FIG. 2 is in a state after deposition and prior to heat-treatment.

Initially, underlying layer 6 of Ta or the like is formed on a substrate (not shown). By way of example, the underlying layer 6 is formed to have a thickness of 50 Å or so.

By way of example, a Ni—Fe alloy film 9 is formed on the underlying layer 6, and a Co film 10 is formed on the Ni—Fe alloy film 9. The Ni—Fe alloy film 9 and the Co film 10 together form free magnetic layer 1. By forming Co film 10 on the side of the free magnetic layer 1 that contacts non-magnetic intermediate layer 2, it is possible to prevent diffusion of the metal elements at the interface between free magnetic layer 1 and non-magnetic intermediate layer 2 and, therefore, to increase the resistance variation ratio ΔMR.

The Ni—Fe alloy film 9 is formed to contain, for example, 80 at % of Ni and 20 at % of Fe. The Ni—Fe alloy film 9 has a thickness of about 45 Å, while the Co film 10 has a thickness of about 5 Å.

Non-magnetic intermediate layer 2 formed, for example, of Cu overlies free magnetic layer 1. By way of example, non-magnetic intermediate layer 2 has a film thickness of about 25 Å.

Pinned magnetic layer 3 is formed on non-magnetic intermediate layer 2. In this embodiment, pinned magnetic layer 3 is composed of a triple-layered laminate structure.

By way of example, pinned magnetic layer 3 is composed of a first Co film 11, a Ru film 12, and a second Co film 13. Due to the exchange coupling magnetic field acting at the interface between pinned magnetic layer 3 and antiferromagnetic layer 4 (described below), Co film 11 and the Co film 13 are made to have directions of magnetization that are not parallel. This state is generally referred to as a ferromagnetic state, and it serves to stabilize the magnetization of pinned magnetic layer 3, while providing a greater exchange coupling magnetic field at the interface between pinned magnetic layer 3 and antiferromagnetic layer 4.

The Co film 11 is formed to have a thickness of about 20 Å, Ru film 12 is formed to have a thickness of about 8 Å, and Co film 13 is formed to have a thickness of about 15 Å.

Figure 3:
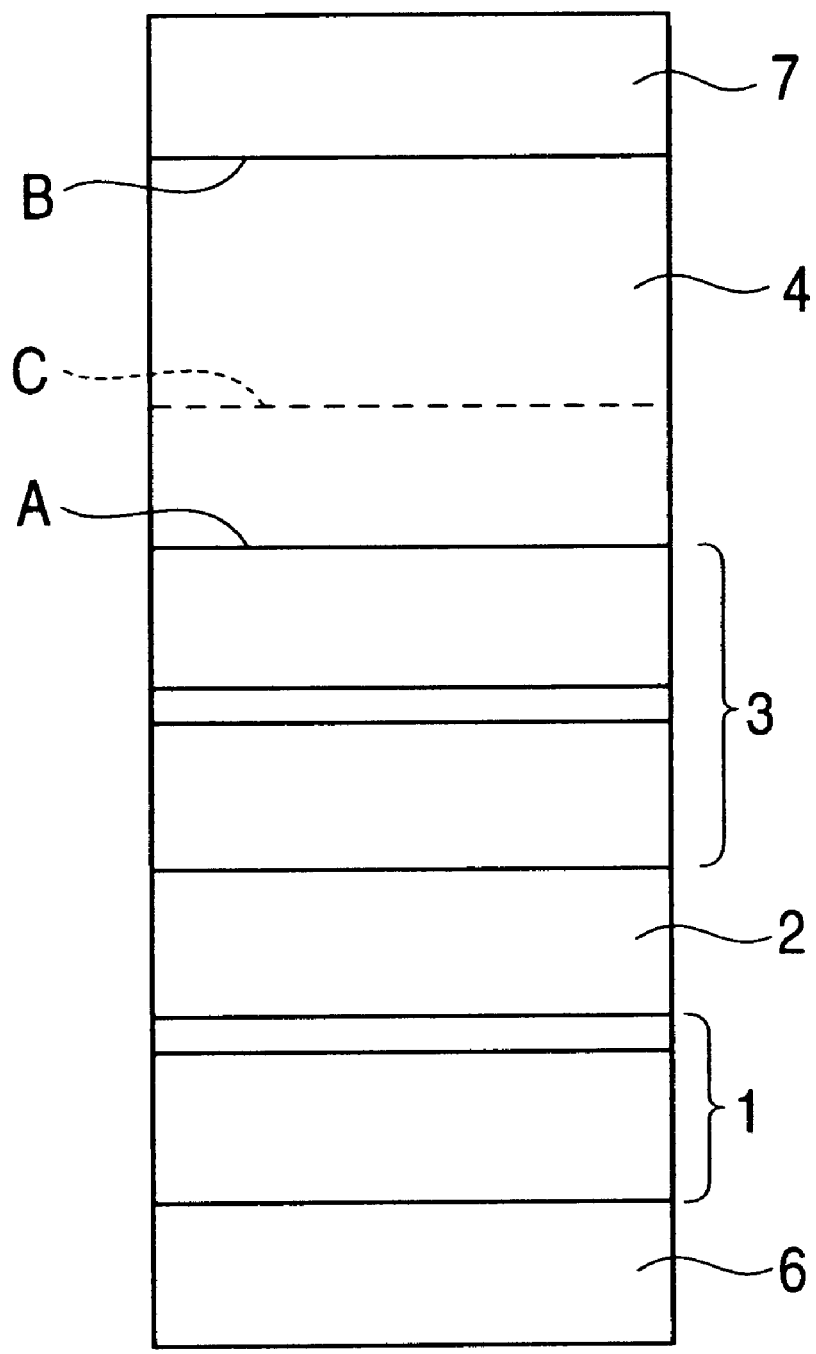
FIG. 3 is a schematic illustration of the laminate structure of FIG. 2 in a state after heat-treatment.

Antiferromagnetic layer 4 is formed on pinned magnetic layer 3. As shown in FIG. 3, a first antiferromagnetic layer 14 is formed on the pinned magnetic layer 3, and a second antiferromagnetic layer 15 is formed on the first antiferromagnetic layer 14.

In accordance with the present invention, each of the first antiferromagnetic layer 14 and the second antiferromagnetic layer 15 may be formed from an antiferromagnetic material which contains an element X and Mn, wherein X is one or more elements selected from the group consisting of Pt, Pd, Ir, Rh, Ru, and Os.

X—Mn alloys containing one or more platinum-group elements exhibit superior corrosion resistance and high blocking temperature, as well as superior properties required for antiferromagnetic materials, such as a a large exchange coupling magnetic field (Hex). Among the platinum group elements, Pt is preferred in the form, for example, of a binary-system Pt—Mn alloy.

In accordance with the present invention, each of the first antiferromagnetic layer 14 and the second antiferromagnetic layer 15 may also be formed from an antiferromagnetic material which contains an element X, an element X' and Mn, wherein the element X' is one or more elements selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb and a rare earth element.

Preferably, the element X' is an element that invades the interstices of a space lattice formed by the element X and Mn, or an element which substitutes for a portion of the lattice points of a crystalline structure formed by the element X and Mn. The term "solid solution" as used herein means a solid in which components are uniformly mixed over a wide region.

The formation of an interstitial solid solution or a substitutional solid solution enables the lattice constant of the X—Mn—X' alloy to be greater than the lattice constant of the aforementioned X—Mn alloy, which results in a larger difference in lattice constant relative to the lattice constant of the pinned magnetic layer 3, thereby facilitating creation of a non-aligned state at the interface between antiferromagnetic layer 4 and pinned magnetic layer 3. When the element X' forms a substitutional solid solution, too large of a composition ratio of the element X' will impair the antiferromagnetic properties, resulting in a smaller exchange coupling magnetic field at the interface between pinned magnetic layer 3 and antiferromagnetic layer 4. In accordance with the present invention, therefore, it is preferred that an inert rare gas element (one or more of Ne, Ar, Kr, and Xe) which forms an interstitial solid solution be used as the element X'. The rare gas element is inert, and does not significantly affect the antiferromagnetic properties even when it is present in the film. In addition, Ar is a gas conventionally used as a sputter gas in a sputtering apparatus and, therefore, can be easily contained in the film.

When the element X' is a gaseous element, it is difficult to incorporate a large amount of it in the film. However, a trace amount of a rare gas element X' drastically increases the exchange coupling magnetic field generated upon heat-treatment.

In accordance with the present invention, the composition ratio of the element X' preferably ranges from 0.2 at % to 10 at %, more preferably from 0.5 at % to 5 at %.

In accordance with the present invention, it is possible to use Pt as the element X and, hence, to use a Pt—Mn—X' alloy.

The element X and elements X+X' which form the first antiferromagnetic layer 14 and the antiferromagnetic layer 15 may be the same or different. For instance, it is possible to use a Pt—Mn—X' alloy to provide a large lattice constant as the material for the first antiferromagnetic layer 14, and a Pt—Mn alloy as the material for the second antiferromagnetic layer 15.

In the laminate structure after deposition (prior to heat-treatment) shown in FIG. 2, it is important that the composition ratio (at %) of element X in the first antiferromagnetic layer 14 be greater than the composition ratio (at %) of the element X in the second antiferromagnetic layer 15. When each of the first antiferromagnetic layer 14 and the second antiferromagnetic layer 15 is made from an X—Mn—X' alloy, the composition ratio (at %) of the elements X+X' in the first antiferromagnetic layer 14 is determined to be greater than the composition ratio (at %) of the elements X+X' in the second antiferromagnetic layer 15. When the first antiferromagnetic layer 14 is made of an X—Mn—X' alloy and the second antiferromagnetic layer 15 is made of an X—Mn alloy, the composition ratio (at %) of the elements X+X' in the first antiferromagnetic layer 14 is determined to be greater than the composition ratio (at %) of the element X in the second antiferromagnetic layer 15.

After the second antiferromagnetic layer 15 has been deposited in the first antiferromagnetic layer 14 and a heat-treatment has been conducted, first antiferromagnetic layer 14 weakens the restraint force of the crystalline structure of pinned magnetic layer 3, such that the second antiferromagnetic layer 15 is kept away from the restraint force, and the disordered lattice of antiferromagnetic layer 14 can be properly transformed into an ordered lattice.

In order to reduce the influence of the restraint force produced by the crystalline structure of pinned magnetic layer 3 at the interface between antiferromagnetic layer 4 and pinned magnetic layer 3, it is necessary that the composition ratio of element X or elements X+X' in the first antiferromagnetic layer be sufficiently large.

A large composition ratio of the element X or elements X+X' reduces the tendency of the composition to form an ordered lattice upon heat-treatment, but increases the difference in lattice constants relative to the pinned magnetic layer. Increased differences in lattice constants reduces the influence of the restraint force produced by the crystalline structure of pinned magnetic layer 3 on the first antiferromagnetic layer 14 and, hence, on the second antiferromagnetic layer 15.

In accordance with the present invention, it is preferred that a non-aligned state is created at part of the interface between the first antiferromagnetic layer 14 and the pinned magnetic layer 3. The presence of a non-aligned state at this interface further reduces the influence of the crystalline structure of pinned magnetic layer 3 on first antiferromagnetic layer 14.

As noted above, in a bulk type Pt—Mn alloy, a CuAu—I type face-centered cubic ordered lattice is easiest to obtain—and, therefore, antiferromagnetic properties are easiest to achieve—when the at % ratio between Pt and Mn is 50:50. Increasing the Pt content beyond 50 at % weakens the antiferromagnetic properties on the one hand, but increases the lattice constant of the Pt—Mn alloy on the other, thereby facilitating creation of non-aligned state at the interface between the pinned magnetic layer 3 and the antiferromagnetic layer 4.

Preferably, the composition ratio of the element X or the elements X+X' of the first antiferromagnetic layer 14 is not less than 53 at % and not greater than 65 at %. More preferably, this composition ratio is not less than 55 at % and not greater than 60 at %. Results of experiments which will be described hereinbelow show that an exchange coupling magnetic field of $7.9 \times 10^4$ A/m or greater is obtainable with such composition ratios.

It is to be understood that there are preferred thicknesses for the first antiferromagnetic layer 14. Too small a thickness weakens the non-aligned state at the interface between the first antiferromagnetic layer 14 and the pinned magnetic layer 3, making it impossible to obtain a proper intensity of exchange coupling magnetic field upon heat-treatment. The first antiferromagnetic layer 14 has a composition which inherently is not liable to transform from a disordered lattice into an ordered lattice and, hence, is less liable to possess antiferromagnetic properties upon heat-treatment. As a result, too large a thickness of first antiferromagnetic layer 14 increases the proportion of the region that is hard to transform, which in turn increases the region which remains disordered after heat-treatment, thereby drastically reducing the exchange coupling magnetic field.

In accordance with the present invention, the thickness of the first antiferromagnetic layer 14 is preferably not smaller than 3 Å and not greater than 30 Å. Results of experiments described below show that a thickness of the first antiferromagnetic layer 14 within the above-specified range provides a large exchange coupling magnetic field (Hex), specifically an exchange coupling magnetic field of $7.9 \times 10^4$ A/m or greater.

A second antiferromagnetic layer 15, which has a composition ratio of the element X or the elements X+X' which is smaller than that of the first antiferromagnetic layer 14, is formed on the first antiferromagnetic layer 14 after the deposition thereof.

Preferably, the composition ratio of the element X or the elements X+X' in the second antiferromagnetic layer 15 is not smaller than 44 at % and not greater than 57 at %, more preferably not smaller than 46 at % and not greater than 55 at %, and most preferably not smaller than 48 at % and not smaller than 53 at %.

It is also preferred that the composition ratio of the element X or the elements X+X' in the second antiferromagnetic layer 15 approximates an ideal composition ratio for causing transformation from a disordered lattice into an ordered lattice upon heat-treatment, so that heat-treatment executed after deposition of the second antiferromagnetic layer 15 causes the latter to properly transform its structure from a disordered lattice into an ordered lattice.

It is to be noted that there are preferred thicknesses of the second antiferromagnetic layer 15. It has been confirmed through experiment that too small a thickness of the second antiferromagnetic layer 15 causes a drastic reduction in the exchange coupling magnetic field (Hex).

In accordance with the present invention, it is preferred that the second antiferromagnetic layer 15 has a thickness not smaller than 70 Å. A thickness meeting this requirement makes it possible to obtain a large exchange coupling magnetic field, specifically $7.9 \times 10^4$ A/m or greater.

In accordance with the present invention, it is preferred that the first antiferromagnetic layer 14 and the second antiferromagnetic layer 15 are formed by a sputtering process.

In particular, when the first antiferromagnetic layer 14 or the second antiferromagnetic layer 15 is formed of an X—Mn—X' alloy, using sputtering to deposit the alloy enables deposition of a non-equilibrium state, so that the element X' invades the interstices of the space lattice constituted by the element X and Mn or substitutes for a portion of the lattice points of the crystalline lattice formed by the element X and Mn. As a result of the formation of an interstitial solid solution or a substitutional solid solution by the use of element X', the lattice is expanded and the lattice constant of the antiferromagnetic layer 4 is larger than in the absence of the element X'.

In accordance with the present invention, the deposition of the first antiferromagnetic layer 14 and the second antiferromagnetic layer by a sputtering process is preferably conducted such that in the deposition of the first antiferromagnetic layer 14, the sputtering gas pressure is maintained at a level lower than in the deposition of the second antiferromagnetic layer 15. Such a technique provides a composition ratio of the element X or the elements X+X' in the first antiferromagnetic layer 14 which is greater than that in the second antiferromagnetic layer 15.

Thus, in accordance with the present invention, it is preferred that the antiferromagnetic layer 4 has a laminate structure comprising the first antiferromagnetic layer 14 and the second antiferromagnetic layer 15, the first and second antiferromagnetic layers 14 and 15 being deposited such that the composition ratio of the element X or the elements X+X' in the first antiferromagnetic layer 14 is greater than in the second antiferromagnetic layer 15, such that the influence of the restraint force produced by the crystalline structure of pinned magnetic layer 3 on the first antiferromagnetic layer 14 at the interface between first antiferromagnetic layer 14 and pinned magnetic layer 3 is reduced. Thus, a non-aligned state is created at at least a part of the interface, thereby enabling proper transformation from a disordered lattice into an ordered lattice upon heat-treatment, and a large exchange coupling magnetic field between antiferromagnetic layer 4 and pinned magnetic layer 3.

In accordance with the present invention, as noted above, it is preferred that a non-aligned state is created at at least a part of the interface between the first antiferromagnetic layer 14 and the pinned magnetic layer 3 following deposition of the layers. Such a non-aligned state can be obtained by providing a first antiferromagnetic layer 14 and a second antiferromagnetic layer 15 with different lattice constants. It is sufficient to produce such a difference at only a part of the above-mentioned interface.

Alternatively, different crystal orientations are created at at least a part of the first antiferromagnetic layer 14 and the pinned magnetic layer 3. Creation of the above-mentioned non-aligned state at at least a part of the interface between the first antiferromagnetic layer 14 and the pinned magnetic layer 3 can also be facilitated by employing different crystal orientations.

For instance, when the (111) plane of pinned magnetic layer 3 has been preferentially oriented in a direction parallel to the film surface, the (111) plane of the first antiferromagnetic layer 14 is set to either have a smaller degree of orientation than the (111) plane of pinned magnetic layer 3, or to be altogether unoriented.

Alternatively, when the (111) plane of the first antiferromagnetic layer 3 has been preferentially oriented in a direction parallel to the film surface, the (111) plane of pinned magnetic layer 3 is either set to have a smaller degree of orientation than the (111) plane of the first antiferromagnetic layer 14, or the (111) plane of the first antiferromagnetic layer 14 altogether unoriented.

Alternatively, the degrees of orientation of the (111) faces of first antiferromagnetic layer 14 and pinned magnetic layer 3 are both reduced, or the faces are altogether unoriented, with respect to the directions parallel to the interface between the first antiferromagnetic layer 14 and pinned magnetic layer 3. The degree of crystal orientation is controllable by varying the order of deposition of the layers, or by varying conditions such as presence or absence of an underlying layer, composition ratio, electrical power and gas pressure during sputtering.

The laminate structure thus formed is then subjected to a heat-treatment. As a result of heat-treatment, an exchange coupling magnetic field is generated at the interface between the antiferromagnetic layer 4 and the pinned magnetic layer 3, so that the magnetization of pinned magnetic layer 3 is formed into a single magnetic domain in a predetermined direction, specifically in the vertical direction Y, as shown in FIG. 1.

As described above, the first antiferromagnetic layer 14 is not restrained by the crystalline structure of pinned magnetic layer 3 at the interface between first antiferromagnetic layer 14 and pinned magnetic layer 3. Preferably, a non-aligned state is created at at least a part of the interface, so that the second antiferromagnetic layer 15 formed on pinned magnetic layer 1 through the intermediary of the first antiferromagnetic layer starts to transform from a disordered lattice into an ordered lattice while the above-mentioned non-aligned state is maintained. This is because second antiferromagnetic layer 15 is formed from an antiferromagnetic material having a composition approximating the ideal composition for facile transformation from a disordered lattice into an ordered lattice, as described above.

While it is not the Applicants' desire to be bound by a particular theory, it is believed that diffusion of composition takes place at the interface between first antiferromagnetic layer 14 and second antiferromagnetic layer 15, once such a transformation is started. Such diffusion allows the elements of the second antiferromagnetic layer to migrate into the first antiferromagnetic layer 14, and the elements of the first antiferromagnetic layer 14 to migrate into the second antiferromagnetic layer 15, whereby an antiferromagnetic layer 4 without a distinct border is formed, in which elements of both the first antiferromagnetic layer 14 and the second antiferromagnetic layer 15 are mixed together.

While it is not the Applicants' desire to be bound by a particular theory, it is believed that in the region near the interface between first antiferromagnetic layer 14 and second antiferromagnetic layer 15, the composition ratio (at %) of the element X or the elements X+X' is smaller than that in the first antiferromagnetic layer 14 as initially deposited, due to the above-described diffusion. Consequently, when the second antiferromagnetic layer starts to be transformed into an ordered lattice upon heat-treatment, transformation is also promoted in the first antiferromagnetic layer. At the interface between the pinned magnetic layer and the antiferromagnetic layer 4, the first antiferromagnetic layer is freed from the influence of the restraint force of the crystalline structure of the pinned magnetic layer, whereby a transformation from a disordered lattice into an ordered lattice takes place over the whole antiferromagnetic layer 4, and a greater exchange coupling magnetic field than heretofore is achieved.

The laminate structure obtained after heat-treatment is shown schematically in FIG. 3. The configuration of the laminate structure from the lowermost underlying layer 6 to pinned magnetic layer 3 is not changed by heat-treatment. However, the structure of antiferromagnetic layer 4 is changed from the structure as deposited (prior to heat-treatment, as in FIG. 2) to the structure shown in FIG. 3.

The antiferromagnetic layer 4 shown in FIG. 3 is formed from an antiferromagnetic material comprising an element X and Mn, where the element X is one or more elements selected from the group consisting of Pt, Pd, Ir, Rh, Ru, and Os, or from an antiferromagnetic material comprising an element X, an element X' and Mn, where the element X' is one or more elements selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb and a rare earth element.

Preferably, the aforementioned X—Mn—X' alloy either has the form of an interstitial solid solution in which the element X' has entered interstices of the space lattice constituted by the element X and Mn, or the form of a substitutional solid solution in which the element X' has substituted for a portion of the lattice points of the crystal lattice formed of the element X and Mn. Thus, the X—Mn—X' alloy can have an expanded lattice constant over the X—Mn alloy, making it easier to create a non-aligned state at the interface between antiferromagnetic layer 4 and pinned magnetic layer after heat-treatment.

In accordance with the present invention, antiferromagnetic layer 4 has a region in which the ratio of the atomic percent of element X or elements X+X' to Mn increases towards pinned magnetic layer 3.

In addition, at least part of the crystalline structure of antiferromagnetic layer 4 has a CuAu—I type face-centered cubic lattice (ordered lattice). Preferably, an unaligned state is created at at least a part of the aforementioned interface A.

The reason for having a region in which the ratio of the atomic percent of element X or elements X+X' to Mn increases towards pinned magnetic layer 3 is that the diffusion experienced by the first antiferromagnetic layer 14 and the second antiferromagnetic layer 15 is imperfect, and the first antiferromagnetic layer 14 and second antiferromagnetic layer are not completely diffused in each other. Thus, the antiferromagnetic layer after heat-treatment does not have a completely uniform structure.

As explained above in reference to FIG. 2, the composition ratio of the element X or the elements X+X' in the first antiferromagnetic layer 14 at the interface adjacent to the pinned magnetic layer is greater than in the second antiferromagnetic layer 15.

As described above, the composition ratio of the element X or the elements X+X' in the second antiferromagnetic layer 15 is set to a value near 50 at % to enable transformation into an ordered lattice upon heat-treatment, requiring that the composition ratio of Mn is also around 50 at %. In contrast, the composition ratio of the element X or the elements X+X' in the first antiferromagnetic layer 14 is set to a value near 58 at % in order to reduce the influence of the restraint force of pinned magnetic layer 3 at the interface adjacent to pinned magnetic layer 3, requiring a smaller Mn content to be present than in the second antiferromagnetic layer 15.

Although the heat-treatment causes mutual diffusion of compositions between the first antiferromagnetic layer 14 and the second antiferromagnetic layer 15, the diffusion is still imperfect and antiferromagnetic layer 4 has such a gradient of composition ratio that the atomic percent of element X or elements X+X' to that of Mn increases progressively towards pinned magnetic layer 3.

While it is not the Applicants' desire to be bound by a particular theory, it is believed that a higher atomic percent of the element X or the elements X+X' is achieved in the region near the interface A than in the region near the side B opposite to the interface A, as a result of the above-described diffusion.

The antiferromagnetic layer 4 is transformed from a disordered lattice into an ordered lattice upon heat-treatment, so that at least part of the crystalline structure of the antiferromagnetic layer 4 has a CuAu—I type face-centered cubic lattice (ordered lattice). In addition, it is preferred that a non-aligned state is created at at least a part of the interface adjacent to pinned magnetic layer 3.

When the aforementioned antiferromagnetic layer 4 is formed of a Pt—Mn alloy, the ratio c/a between lattice constants "a" and "c" of antiferromagnetic layer 4 partly transformed into an ordered lattice, (i.e., antiferromagnetic layer 4 after heat-treatment), preferably fall within the range of 0.93 to 0.99.

A lattice constant ratio c/a below 0.93 allows almost the entirety of the crystalline structure of the antiferromagnetic layer to be transformed into an ordered lattice, producing undesirable effects such as delamination due to a reduction in adhesion between the antiferromagnetic layer 4 and the pinned magnetic layer 3.

Conversely, a lattice constant ratio c/a above 0.99 allows almost the entirety of the crystalline structure of the anti-ferromagnetic layer to remain in the state of an ordered lattice, thereby reducing the exchange coupling magnetic field at the interface between antiferromagnetic layer 4 and pinned magnetic layer 3.

In accordance with the present invention, it is preferred that a non-aligned state is created at at least a part of the interface between pinned magnetic layer 3 and antiferromagnetic layer 4. Creation of such a non-aligned state is facilitated by allowing pinned magnetic layer 3 and antiferromagnetic layer 4 at at least a part of the above-mentioned interface.

Thus, in accordance with the present invention, the structure after heat-treatment may be such that a region exists in which the ratio of the atomic percent of element X or elements X+X' to Mn increases towards pinned magnetic layer 3, and that at least a part of the crystalline structure of antiferromagnetic layer 4 has a CuAu—I type face-centered ordered lattice, while antiferromagnetic layer 4 and pinned magnetic layer 3 have different lattice constants at at least a part of interface A. These features in combination also provide a greater exchange coupling magnetic field than heretofore.

Alternatively, the structure after heat-treatment may be such that a region exists in which the ratio of the atomic percent of the element X or elements X+X' to Mn increases towards pinned magnetic layer 3, and that at least a part of the crystalline structure of antiferromagnetic layer 4 has a CuAu—I type face-centered ordered lattice, while the antiferromagnetic layer 4 and pinned magnetic layer 3 have different crystalline structures at at least a part of the interface A.

For instance, when the (111) plane of the pinned magnetic layer 3 has been preferentially oriented in the direction of the film plane, the (111) plane of the antiferromagnetic layer 4 either has a smaller degree of orientation than the (111) plane of the pinned magnetic layer 3, or is not oriented at all.

Conversely, if the (111) plane of the antiferromagnetic layer 4 has been preferentially oriented in a direction parallel to the interface, the (111) plane of the pinned magnetic layer 3 either has a smaller degree of orientation than the (111) plane of the antiferromagnetic layer 4, or is not oriented at all.

Alternatively, the degrees of orientation of the (111) planes of antiferromagnetic layer 4 and pinned magnetic layer 3 are either both reduced with respect to the direction parallel to the interface between antiferromagnetic layer 4 and the pinned magnetic layer 3, or are not oriented at all.

It is also possible to facilitate creation of the non-aligned state at the interface between pinned magnetic layer 3 and antiferromagnetic layer 4 and to obtain a greater exchange coupling magnetic field than heretofore, by employing different crystal orientations for pinned magnetic layer 3 and the antiferromagnetic layer 4.

The elements constituting antiferromagnetic layer 4 after heat-treatment depend on the composition elements employed in the deposition of the first antiferromagnetic layer 14 and the second antiferromagnetic layer 15 prior to heat-treatment. Therefore, when both the first antiferromagnetic layer 14 and the second antiferromagnetic layer 15 are deposited using the same elements, first antiferromagnetic layer 4 has the same elements over its entirety after heat-treatment.

It is preferred that first antiferromagnetic layer 14 is deposited with an antiferromagnetic material that affords a greater lattice constant, so that prior to heat-treatment, the non-aligned state at the interface is maintained. It is preferred that the second antiferromagnetic layer 15 is deposited with an antiferromagnetic material that permits a smooth transformation from a disordered lattice into an ordered lattice upon heat-treatment. Thus, antiferromagnetic materials having different composition elements may be used for the first antiferromagnetic layer 14 and the second antiferromagnetic layer 15.

For instance, when a Pt—Mn—Cr alloy is used as the material of the first antiferromagnetic layer 14 and a Pt—Mn alloy is used as the material of the second antiferromagnetic layer 15, or when a Pt—Mn—Cr alloy is used as the material of the first antiferromagnetic layer 14 and a Pd—Mn alloy is used as the material of the second antiferromagnetic layer 15, the kind of element X or elements X+X' constituting the portion of antiferromagnetic layer 4 near the interface A adjacent to pinned magnetic layer 3 may be partly the same as or different from that at the side B opposite to interface A.

As described above, the antiferromagnetic layer 4 after the heat-treatment has a region in which the ratio of atomic percent of the element X or the elements X+X' to Mn progressively increases towards pinned magnetic layer 3. It is, however, preferred that in the region near the interface A, the composition ratio of the element X or the elements X+X' is not less than 50 at % and not greater than 65 at %, where the total composition ratio of all the elements constituting the antiferromagnetic layer is expressed as 100 at %. This range of the composition ratio of the element X or the elements X+X' depends on the composition ratio of the element X or the elements X+X' of the first antiferromagnetic layer 14 as deposited (i.e., prior to the heat-treatment), and on the diffusion caused by heat-treatment.

More specifically, as described above, it is preferred that the composition ratio of the element X or the element X+X' is not less than 53 at % and not greater than 65 at %. It is considered that a diffusion of composition takes place also at the interface between the first antiferromagnetic layer 14 and the pinned magnetic layer 3. For these reasons, it is understood that the composition ratio of the element X or the elements X+X' in the region near the interface between antiferromagnetic layer 4 and pinned magnetic layer 3 is reduced from that obtained in the as-deposited state, thus allowing the composition ratio of the element X or the elements X+X' to fall below 53 at %. For this reason, the preferred composition ratio of the element X or the elements X+X' in the region near the interface A after heat-treatment is set to be at least 50 at % and not greater than 65 at %. A more preferred composition ratio of the element X or the elements X+X' is not less than 50 at % and not greater than 60 at %.

In accordance with the present invention, the composition ratio of the element X or the elements X+X' of the antiferromagnetic layer 4 near the surface opposite to interface A is preferably not less than 44 at % and not greater than 57 at %, where the total composition ratio of all the elements constituting the antiferromagnetic layer 4 is represented by 100 at %. The composition ratio of the element X or the elements X+X' in the region near the side B depends on the composition ratio of the element X or the elements X+X' of the second antiferromagnetic layer 15 in the as-deposited state (i.e., prior to the heat-treatment).

As stated above, it is preferred that the composition ratio of the element X or the elements X+X' of the second antiferromagnetic layer 15 is preferably not less than 44 at % and not greater than 57 at %. Therefore, the preferred range of the element X or the elements X+X' in the region near the side B opposite to interface A in the state after heat-treatment is set to be not less than 44 at % and not greater than 57 at %, as is the case for the composition ratio in second antiferromagnetic layer 15. A more preferred range of the element X or the elements X+X' is not less than 46 at % and not greater than 55 at %.

In accordance with the present invention, the region in antiferromagnetic layer 4 in which the composition ratio of the element X or the elements X+X' is not less than 46 at % and not greater than 53 at % is not less than 70% and not more than 95% in terms of the volume ratio to total volume of antiferromagnetic layer 4. The fact that the volume ratio of the above-mentioned region falls within the above-specified range means that the transformation of antiferromagnetic layer 4 from the disordered lattice to an ordered lattice upon heat-treatment has been properly completed, thus providing a greater exchange coupling magnetic field.

A description will now be given of a composition modulation occurring in the direction of thickness of antiferromagnetic layer 4. As described above, in accordance with the present invention, the antiferromagnetic layer has a region in which the ratio of the atomic percent of the element X or the element X+X' to Mn increases towards pinned magnetic layer 3. In addition, antiferromagnetic layer 4 may have a composition modulation as described below.

An imaginary boundary plane extends parallel to the interface within the thickness of antiferromagnetic layer 4, so as to divide antiferromagnetic layer 4 in the thicknesswise direction into a first region between the imaginary boundary plane and interface A and a second region between the imaginary boundary plane and the side opposite to interface A. In such a case, the above-mentioned ratio may linearly or non-linearly increase from the second region to the first region across the imaginary boundary plane.

For instance, the imaginary boundary mentioned above is represented by a broken line C. Thus, broken line C indicates the interface between first antiferromagnetic layer 14 and second antiferromagnetic layer 15 of the antiferromagnetic layer 4 as deposited (i.e., prior to the heat-treatment, as in FIG. 2).

In the as-deposited state, the composition ratio of the element X or the elements X+X' is greater in the first antiferromagnetic layer 14 than in the second antiferromagnetic layer 15. It is understood that heat-treatment causes diffusion of the composition across the interface between first antiferromagnetic layer 14 and second antiferromagnetic layer 15. After heat-treatment, therefore, the above-mentioned ratio is greater in the first region between interface A and the imaginary boundary (broken line C) than in the second region between the imaginary boundary (broken line C) and the side B opposite interface A. In addition, the above-mentioned ratio linearly or non-linearly increases from the second region to the first region within a transient region including the above-mentioned imaginary boundary. In particular, the non-linear increase of the above-mentioned ratio tends to occur when the composition ratio of the element X or the elements X+X' in the first antiferromagnetic layer 14 is significantly greater than in the second antiferromagnetic layer 15, in the as-deposited state.

In accordance with the present invention, the antiferromagnetic layer 4 preferably has a region in which the composition ratio (atomic percent) of the element X or the elements X+X' increases towards pinned magnetic layer 3. According to the present invention, in the antiferromagnetic layer as deposited (prior to heat-treatment), the composition ratio of the element X or the elements X+X' in the first antiferromagnetic layer 14 adjacent to pinned magnetic layer 3 is determined to be greater than in the second antiferromagnetic layer 15. It is therefore considered that, despite any composition modulation caused by heat-treatment in the region between first antiferromagnetic layer 14 and second antiferromagnetic layer 15, the composition ratio (atomic percent) of the element X or the elements X+X' in the portion adjacent to pinned magnetic layer that was constituted by the first antiferromagnetic layer before heat-treatment is still greater than in the region that was constituted by the second antiferromagnetic layer, whereby the above-mentioned composition modulation takes place at a certain portion.

In accordance with the present invention, it is preferred that a region exists near the interface A between antiferromagnetic layer 4 and pinned magnetic layer 3, in which the atomic percent of the element X or the elements X+X' decreases towards pinned magnetic layer 3.

While it is not the Applicants' desire to be bound by a particular theory, it is believed that a diffusion of composition takes place between antiferromagnetic layer 4 and pinned magnetic layer 3 in the region of antiferromagnetic layer 4 near interface A. Such a diffusion will result in a smaller composition ratio of the element X or the elements X+X' in the region near interface A than was achieved in the as-deposited state.

When antiferromagnetic layer 4 has a region in which the composition ratio of element X or element X+X' decreases towards pinned magnetic layer 3 in the region near interface A, as in the present invention, the transformation from a disordered lattice into an ordered lattice is properly effected by antiferromagnetic layer 4 in the region near interface A, whereby a large exchange coupling magnetic field is generated.

In the heat-treated antiferromagnetic layer 4, it is preferred that the composition ratio of element X or elements X+X' is maximized in the region which immediately underlies interface A adjacent to pinned magnetic layer 3. It is preferred this region has a thickness of not smaller than 3 Å and not greater than 30 Å, as measured from the interface A in the thicknesswise direction towards side B opposite interface A. This is the preferred range of thickness of first antiferromagnetic layer 14 in the as-deposited state prior to heat-treatment.

In accordance with the present invention, a protective layer 7 made of, for example, Ta or the like is formed on the side B of the antiferromagnetic layer 4 opposite to the interface A adjacent to pinned magnetic layer 3. It is considered that a composition modulation due to heat-treatment occurs also at the boundary between second antiferromagnetic layer 15 as deposited and protective layer 7.

Thus, in accordance with the present invention, a region may exist in the antiferromagnetic layer 4 near the side opposite pinned magnetic layer 3, in which the composition ratio of the element X or the elements X+X' decreases towards the above-mentioned side of antiferromagnetic layer 4.

In accordance with the present invention, the antiferromagnetic layer 4 preferably has a thickness not smaller than 73 Å. As explained above with reference to FIG. 2, the thickness of the first antiferromagnetic layer 14 should be at least 3 Å, while the thickness of second antiferromagnetic layer 15 should be at least 70 Å, so that the total thickness of antiferromagnetic layer 4 should be at least 73 Å.

Thus, in accordance with the present invention, the minimum thickness required for antiferromagnetic layer 4 is 73 Å, which is significantly smaller than that required in conventional structures. This means that the gap width can be reduced when the laminate structure of FIG. 3 is used as a thin-film magnetic head.

Although in the embodiment described above, the antiferromagnetic layer 4 as deposited (prior to heat-treatment) is composed of a dual-layer structure having first antiferromagnetic layer 14 and second antiferromagnetic layer 15, this is only illustrative and other production methods can be employed.

For instance, an exchange coupling magnetic field greater than those of conventional structures can be obtained even when antiferromagnetic layer 4 as deposited (prior to heat-treatment) is composed of a single layer, provided the production process described below is employed.

More specifically, in accordance with the present invention, antiferromagnetic layer 4 may be formed by a sputtering process in which an element X and Mn are used as sputtering targets, where the element X is one or more elements selected from the group consisting of Pt, Pd, Ir, Rh, Ru, and Os, while the sputtering gas pressure is progressively increased in the direction away from pinned magnetic layer 3 during deposition of antiferromagnetic layer 4. As a result, the composition ratio (atomic percent) of element X is reduced in the direction away from the side of antiferromagnetic layer 4 adjacent to pinned magnetic layer 3. When this method is used, it is preferred that a non-aligned state is obtained at at least a part of the interface between antiferromagnetic layer 4 and pinned magnetic layer 3.

Representing the composition ratio of all elements constituting the portion of antiferromagnetic layer 4 near the side opposite the interface, it is preferred that the composition ratio of element X is not less than 44 at % and not greater than 57 at %, more preferably not less than 46 at % and not more than 55 at %.

By virtue of these features, the portion of antiferromagnetic layer 4 near the interface between antiferromagnetic layer 4 and pinned magnetic layer 3 is freed from the influence of the restraint force produced by the crystalline structure of pinned magnetic layer 3. The remaining portion of antiferromagnetic layer 4 other than the region near the interface can have a composition ratio (at %) of element X which approaches an ideal composition for facilitating transformation from a disordered lattice into an ordered lattice upon heat-treatment.

It is therefore possible to effect a proper transformation of antiferromagnetic layer 4 as deposited from a disordered lattice into an ordered lattice by effecting a heat-treatment on the antiferromagnetic layer as deposited. Further, since the heat-treatment possibly causes diffusion of elements in antiferromagnetic layer 4, the transformation from a disordered lattice into an ordered lattice properly takes place in antiferromagnetic layer 4, thus providing a greater exchange coupling magnetic field than in conventional structures.

When a non-aligned state exists at the above-mentioned interface, the antiferromagnetic layer 4 is conveniently freed from the restraint force produced by the crystalline structure of pinned magnetic layer 3, so that the transformation of the whole antiferromagnetic layer 4 is promoted.

It is also preferred that antiferromagnetic layer 4 has a thickness not smaller than 73 Å. As explained above with reference to FIG. 2, this minimum value of 73 Å is the sum of the minimum thicknesses required for the combination of first antiferromagnetic layer 14 and second antiferromagnetic layer 15, which together form antiferromagnetic layer 4.

Referring again to FIG. 2, the minimum required thickness of first antiferromagnetic layer is 3 Å, while the minimum required thickness for second antiferromagnetic layer 15 is 70 Å, so that the minimum thickness required for the antiferromagnetic layer is set to be 73 Å.

The composition ratio of element X is preferably not smaller than 53 at % and not greater than 65 at %, more preferably not less than 55 at % and not greater than 60 at %, in the thicknesswise region of at least 3 Å as measured from the interface adjacent to pinned magnetic layer 3, even when antiferromagnetic layer 4 as deposited (prior to heat-treatment) is formed of a single layer. The composition ratio of all the elements in this region is expressed as 100 at %. The remaining region has a thickness of 70 Å or greater preferably has a composition ratio of element X not smaller than 44 at % and not greater than 57 at %, more preferably not less than 46 at % and not greater than 55 at %. With these features, it is possible to obtain an exchange coupling magnetic field of $7.9 \times 10^4$ A/m or greater, as in the case of the structure shown in FIG. 2.

In accordance with the present invention, antiferromagnetic layer 4 may also be formed by a sputtering process in which an element X, an element X' and Mn are used as sputtering targets, where the element X' is one or more elements selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb and a rare earth element, while the sputtering gas pressure is progressively increased in the direction away from pinned magnetic layer 3 during deposition of antiferromagnetic layer 4. As a result, the composition ratio (atomic percent) of the elements X+X' is reduced in the direction away from the side of antiferromagnetic layer 4 adjacent to pinned magnetic layer 3.

Preferably, the element X' invades the interstices of a space lattice formed by element X and Mn, or which substitutes for a portion of the lattice points of the crystalline structure formed of element X and Mn. Such an element X' allows the lattice constant of the X—Mn—X' alloy to be expanded over the lattice constant of the X—Mn alloy, thus making it easy to maintain a non-aligned state at the interface adjacent to pinned magnetic layer 3.

As stated above, according to the present invention, it is preferred that an unaligned state is created at at least a part of the interface between antiferromagnetic layer 4 and pinned magnetic layer 3. One of the methods for creating such a non-aligned state is to employ, at at least a part of the interface, different lattice constants for antiferromagnetic layer 4 and pinned magnetic layer 3.

Thus, the present invention may be carried out such that when the antiferromagnetic layer 4 is formed by a sputtering process using an element X and Mn as sputtering targets or using elements X+X' and Mn as sputtering targets, the sputtering gas pressure is progressively increased in the direction away from pinned magnetic layer 3 during deposition of antiferromagnetic layer 4. As a result, the composition ratio (atomic percent) of the element X or the elements X+X' is reduced in the direction away from the side of antiferromagnetic layer 4 adjacent to pinned magnetic layer 3. During deposition of antiferromagnetic layer 4, different lattice constants are employed for antiferromagnetic layer 4 and pinned magnetic layer 3 at at least a part of the interface therebetween.

Alternatively, the invention may be carried out such that when the antiferromagnetic layer 4 is formed by a sputtering process using an element X and Mn as sputtering targets or using elements X+X' and Mn as sputtering targets, the sputtering gas pressure is progressively increased in the direction away from pinned magnetic layer 3 during deposition of antiferromagnetic layer 4. As a result, the composition ratio (atomic percent) of the element X or the elements X+X' is reduced in the direction away from the side of antiferromagnetic layer 4 adjacent to pinned magnetic layer 3. During deposition of antiferromagnetic layer 4, different crystal orientations are employed for antiferromagnetic layer 4 and pinned magnetic layer 3 at at least a part of the interface between antiferromagnetic layer 4 and pinned magnetic layer 3. Creation of a non-aligned state at at least a part of the interface between antiferromagnetic layer 4 and pinned magnetic layer 3 is also facilitated by causing antiferromagnetic layer 4 and pinned magnetic layer 3 to have different crystal orientations.

By effecting a heat-treatment of the laminate structure formed by the described process, it is possible to obtain a laminate structure similar to that shown in FIG. 3.

Thus, the antiferromagnetic layer 4 after deposition is formed of an antiferromagnetic material containing an element X and Mn or, alternatively, elements X+X' and Mn, and has a region in which the ratio of the atomic percent of the element X or the elements X+X' increases towards the antiferromagnetic layer 3. The crystalline structure of at least a part of the antiferromagnetic layer has a CuAu—I type face-centered cubic ordered lattice, and a non-aligned state is created at at least part of the interface A.

Figure 4:
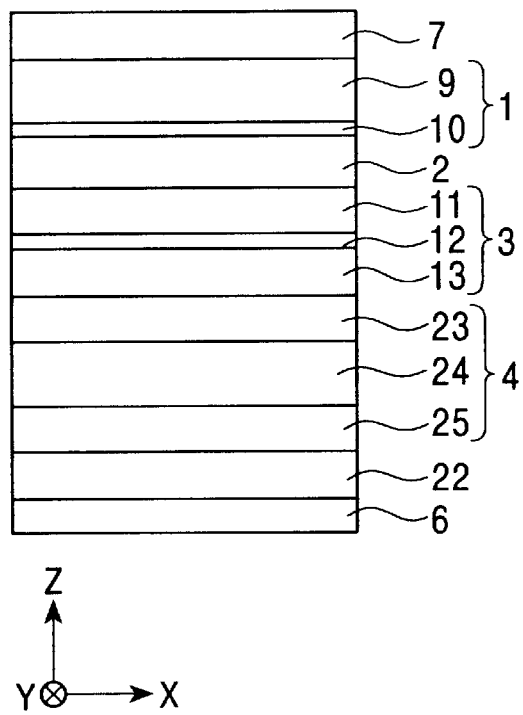
FIG. 4 is a schematic illustration of a laminate structure having a seed layer in accord with the present invention, in a state after deposition and prior to heat-treatment.
Figure 5:
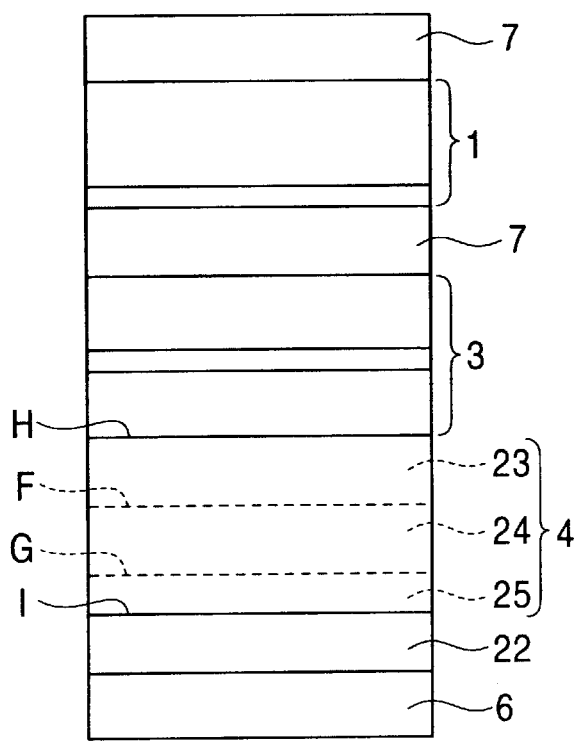
FIG. 5 is a schematic illustration of the laminate structure of FIG. 4 in a state after heat-treatment.

FIG. 4 shows a laminate structure employing a seed layer 22 in an as-deposited state (i.e., in a state prior to a heat-treatment) FIG. 5 shows the laminate structure obtained by effecting heat-treatment of the laminate structure shown in FIG. 4.

The laminate structure of FIG. 4 and, hence, the laminate structure of FIG. 5, are used in the production of a single-spin valve type magnetoresistive sensor having an antiferromagnetic layer 4 underlying a pinned magnetic layer 3. An example is shown in FIG. 6.

As the first step, a seed layer 22 is formed on an underlying layer 6, and then an antiferromagnetic layer 4 is formed on the seed layer 22.

The underlying layer 6 is preferably formed of at least one element selected from the group consisting of Ta, Hf, Nb, Zr, Ti, Mo, and W. The underlying layer 6 is intended to preferentially align the (111) plane of seed layer 22 in the direction parallel to the interface between underlying layer 6 and seed layer 22. The underlying layer has a thickness of, for example, 50 Å.

The seed layer 22 is mainly constituted by face-centered cubic crystals, with the (111) plane preferentially oriented in the direction parallel to the interface between the seed layer 22 and the antiferromagnetic layer 4. It is preferred that the seed layer is formed of a Ni—Fe alloy or a Ni—Fe—Y alloy, where Y is at least one element selected from the group consisting of Cr, Rh, Ta, Hf, Nb, Zr, and Ti. The seed layer 22 formed from such a material on underlying layer 6 serves to facilitate the preferential orientation of the (111) plane in the direction parallel to the interface adjacent antiferromagnetic layer 4.

Preferably, the seed layer 22 is formed of a non-magnetic material. The non-magnetic nature of the seed layer 22 serves to enhance the specific resistance of the seed layer 22. Shunting of the sense current into seed layer 22 causes an undesirable reduction in the ratio of resistance variation ($\Delta$MR), or the generation of Barkhausen noise.

When a non-magnetic material is used as the material of the seed layer 22, the Ni—Fe—Y alloy, Y being at least one element selected from the group consisting of Cr, Rh, Ta, Hf, Nb, Zr, and Ti, may be selected to be a non-magnetic material, from the materials mentioned above. Such a material has a face-centered crystalline structure. Moreover, the (111) plane of this material can easily be aligned in the direction preferentially parallel to the interface adjacent antiferromagnetic layer 4. The seed layer 22 has a thickness of, for example, about 30 Å.

As will be seen from FIG. 4, the antiferromagnetic layer 4 formed on seed layer 22 is composed of a laminate structure having a first antiferromagnetic layer 23, a second antiferromagnetic layer 24, and a third antiferromagnetic layer 25.

In accordance with the present invention, each of the first antiferromagnetic layer 23, second antiferromagnetic layer 24, and third antiferromagnetic layer 25 may be formed from an antiferromagnetic material which contains an element X and Mn, wherein X is one or more elements selected from the group consisting of Pt, Pd, Ir, Rh, Ru, and Os.

Alternatively, each of the first antiferromagnetic layer 23, second antiferromagnetic layer 24, and third antiferromagnetic layer 25 may be formed from an antiferromagnetic material which contains an element X, an element X' and Mn, wherein the element X' is one or more elements selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb and a rare earth element.

In each of the above-described structures, the X—Mn—X' alloy is preferably either an interstitial solid solution in which the element X' has entered the interstices of a space lattice formed by the element X and Mn, or a substitutional solid solution in which a portion of the lattice points of the crystal lattice formed by the element X and Mn has been substituted by the element X'. The X—Mn—X' alloy in the form of an interstitial solid solution or a substitutional solid solution has an expanded lattice constant compared to the X—Mn alloy.

In accordance with the present invention, the composition ratio of the element X or the elements X+X' in each of the first and third antiferromagnetic layers 23 and 25 is determined to be greater than that in the second antiferromagnetic layer 24.

The second antiferromagnetic layer 24 formed between the first and third antiferromagnetic layers 23 and 25 is made of an antiferromagnetic material which approximates an ideal composition for the transformation from a disordered lattice to an ordered lattice by heat-treatment.

The reason why the composition ratio of the element X or the elements X+X' in each of the first and third antiferromagnetic layers 23 and 25 is determined to be greater than that in the second antiferromagnetic layer 24 is the same as that described above with reference to FIG. 2. Namely, it is intended that restraint forces produced by the crystalline structures of the pinned magnetic layer 3 and the seed layer 22 that act at the respective interfaces are diminished, so as to allow an easy transformation of the antiferromagnetic layer 4 upon heat-treatment.

Preferably, the composition ratio of the element X or elements X+X' of each of the first antiferromagnetic layer 23 and the third antiferromagnetic layer 25 is not less than 53 at % and not greater than 65 at %, more preferably not less than 55 at % and not greater than 60 at %. Preferably, the thickness of each of the first antiferromagnetic layer 23 and the third antiferromagnetic layer 25 is not less than 3 Å and not greater than 30 Å. For instance, in the embodiment shown in FIG. 4, the thickness of each of the first antiferromagnetic layer 23 and the third antiferromagnetic layer 25 is about 10 Å.

Preferably, the composition ratio of the element X or elements X+X' of the second antiferromagnetic layer 24 is not less than 44 at % and not greater than 57 at %, more preferably not less than 46 at % and not greater than 55 at %. A composition ratio of the element X or the elements X+X' falling within this range permits easy transformation of the second antiferromagnetic layer 24 from a disordered lattice into an ordered lattice by heat-treatment. Preferably, the thickness of the second antiferromagnetic layer 24 is not less than 70 Å. For instance, in the embodiment shown in FIG. 4, the thickness of the second antiferromagnetic layer 24 is about 100 Å.

Preferably, each of the first, second and third antiferromagnetic layers 23, 24 and 25 is formed by sputtering. It is also preferred that the sputtering used for each of the first antiferromagnetic layer 23 and the third antiferromagnetic layer 25 is conducted at a lower sputter gas pressure than for the second antiferromagnetic layer 24. Such a lower sputtering gas pressure provides a greater composition ratio of the element X or the elements X+X' for each of the first and third antiferromagnetic layers 23 and 25 than for the second antiferromagnetic layer 24.

Alternatively, in accordance with the present invention, the antiferromagnetic layer 4, as deposited, is not formed of a three-layered laminate structure as described but of a single-layered structure in accordance with the process described below. Even when such a process is used, it is possible to create a suitable variation of the composition ratio (atomic percent) of the element X or the elements X+X' in the direction of thickness of the antiferromagnetic layer 4.

The antiferromagnetic layer 4 is deposited by using the element X and Mn or, alternatively, the elements X+X' and Mn, as sputtering targets, while the sputtering gas pressure is progressively increased in the direction away from seed layer 22. When the deposition has proceeded to about a half of the final thickness, the sputtering gas pressure is progressively decreased until the deposition of the antiferromagnetic layer is completed.

When such a deposition technique is used, the composition ratio (atomic percent) of the element X or the elements X+X' is progressively increased from the interface adjacent to seed layer 22 towards the thicknesswise central region of antiferromagnetic layer 4, and then progressively decreased towards the interface adjacent to pinned magnetic layer 3.

It is thus possible to form an antiferromagnetic layer 4 in which the composition ratio (atomic percent) of the element X or the elements X+X' is large at the interface adjacent to seed layer 22 and at the interface adjacent to pinned magnetic layer 3, and is small at the thicknesswise central region of antiferromagnetic layer 4.

Preferably, the composition ratio of the element X or the composition ratio of the elements X+X' of the antiferromagnetic layer to the total composition ratio (100 at %) of all the elements constituting the antiferromagnetic layer 4 is not less than 53 at % and not more than 65 at %, preferably not less than 55 at % and not more than 60 at %, in the region near the interface between antiferromagnetic layer 4 and the pinned magnetic layer, as well as in the region near antiferromagnetic layer 4 and seed layer 22.

In these methods of the present invention, it is also preferred that the composition ratio of the element X or the composition ratio of the elements X+X' of antiferromagnetic layer 4 is not less than 44 at % and not more than 57 at %, preferably not less than 46 at % and not more than 55 at %, in the thicknesswise central region of the antiferromagnetic layer 4 and the ferromagnetic layer. It is also preferred that the thickness of the antiferromagnetic layer is 76 Å or greater.

The pinned magnetic layer 3 is formed on antiferromagnetic layer 4, as shown in FIG. 4. In the embodiment shown in FIG. 4, the pinned magnetic layer 3 has a so-called ferromagnetic state constituted by three layers, as in the embodiment shown in FIG. 2, a Co film 11, a Ru film 12, and a Co film 13. The Co film 11 is formed to have a thickness of about 20 Å, the Ru film 12 is formed to have a thickness of about 8 Å, and the Co film 13 is formed to have a thickness of about 15 Å.

As a result of heat-treatment, the crystalline structure of antiferromagnetic layer 4 is properly transformed to change from a disordered lattice into an ordered lattice, without being restrained by the restraint forces produced by seed layer 22 and pinned magnetic layer 3 at the interfaces adjacent to seed layer 22 and pinned magnetic layer 3. As a result, an exchange coupling magnetic field is generated at the interface between antiferromagnetic layer 4 and pinned magnetic layer 3, and the magnetization of pinned magnetic layer 3 is formed into a single magnetic domain in the vertical direction Y.

In accordance with the present invention, a non-aligned state is created at at least a part of the interface between seed layer 22 and pinned magnetic layer 3. The presence of such a non-aligned state reduces the influence of the restraint forces produced by seed layer 22 and pinned magnetic layer 3 at the respective interfaces, thus promoting transformation of the antiferromagnetic layer 4 into an ordered structure.

In accordance with the present invention, the antiferromagnetic layer 4 has first and third antiferromagnetic layers 23 and 25 which are formed at the sides contacting seed layer 22 and pinned magnetic layer 3, each of which has a large composition ratio of the element X or the elements X+X'. A second antiferromagnetic layer 24 interposed between first antiferromagnetic layer 23 and third antiferromagnetic layer 25 has a composition which is easy to transform from a disordered lattice into an ordered lattice. Therefore, transformation proceeds at the second antiferromagnetic layer 24 as a result of heat-treatment, while diffusion of composition takes place at the boundaries between first antiferromagnetic layer 23 and second antiferromagnetic layer 24, and between second antiferromagnetic layer 24 and third antiferromagnetic layer 25. As a result, transformation from the disordered lattice into the ordered lattice takes place in the first antiferromagnetic layer 23 and in the third antiferromagnetic layer 25, while a nonaligned state is properly maintained at the interface between first antiferromagnetic layer 23 and seed layer 22, as well as at the interface between third antiferromagnetic layer 25 and pinned magnetic layer 3. Thus, a proper transformation occurs in the whole antiferromagnetic layer 4. In accordance with the present invention, it is possible to expect a proper transformation and, hence, a greater exchange coupling magnetic field, specifically an exchange magnetic coupling of $7.9 \times 10^4$ A/m or greater.

A non-magnetic intermediate layer 2 formed, for example, from Cu is formed on pinned magnetic layer 3, and a free magnetic layer 1 is formed on the non-magnetic intermediate layer 2.

The free magnetic layer 1 is formed of, for example, a Ni—Fe alloy film 9 and a Co film 10. The non-magnetic intermediate layer 2 has a thickness of, for example, 22 Å, while the Ni—Fe alloy film 9 has a thickness of about 45 Å. The Co film 10 has a thickness of about 5 Å.

Then, a protective layer 7 formed, for example, of Ta is formed on free magnetic layer 1, as shown in FIG. 4. The protective layer 7 has a thickness of, for example, about 30 Å.

In accordance with the present invention, as stated above, seed layer 22 is formed on the lower side of antiferromagnetic layer 4, i.e., on the side of antiferromagnetic layer 4 opposite to the interface adjacent pinned magnetic layer 3. The seed layer is constituted primarily of a face-centered crystalline structure, with the (111) plane oriented in a direction parallel to the interface adjacent antiferromagnetic layer 4. The seed layer is constituted primarily of a face-centered crystalline structure, with the (111) plane oriented in a direction parallel to the interface adjacent antiferromagnetic layer 4.

Therefore, the crystals of the layers on seed layer 22, starting from antiferromagnetic layer 4 and terminating in free magnetic layer 1, are also liable to be aligned such that their (111) planes are preferentially oriented in a direction parallel to the above-mentioned interface, thereby allowing growth of large crystal grains. Such large crystal grains increase the ratio of resistance variation (ΔMR), offering improved reproduction characteristics.

As described above, the embodiment shown in FIG. 4 provides not only improved ratio of resistance variation but also a large exchange coupling magnetic field. The ratio of resistance variation is reduced when the exchange coupling magnetic field is reduced. To a certain extent, exchange coupling magnetic field is also necessary from the viewpoint of improving in the ratio of resistance variation.

A heat-treatment is conducted after deposition of the layers, from underlying layer 6 up to protective layer 7, as shown in FIG. 4. FIG. 5 shows the structure of the layers after heat-treatment. Even in the structure shown in FIG. 5, the seed layer 22 formed on underlying layer 6 formed of Ta or the like still retains its crystalline structure primarily constituted by face-centered cubic crystals with the (111) plane oriented in a direction parallel to the interface adjacent antiferromagnetic layer 4.

The antiferromagnetic layer 4 formed on seed layer 22 has a crystalline structure at least part of which is formed of a CuAu—I type face-centered ordered lattice. Each of the layers from antiferromagnetic layer 4 to free magnetic layer 1 has its (111) planes preferentially oriented in the direction parallel to the interface. Further, a non-aligned state is created at at least a part of the interface I between antiferromagnetic layer 4 and the seed layer, and at at least a part of the interface H between antiferromagnetic layer 4 and pinned magnetic layer 3.

As described above, in the present invention, layers from antiferromagnetic layer 4 to free magnetic layer 1 have crystalline structures with their (111) planes oriented in the direction parallel to the interface and, at the same time, have large crystal grains, thus offering a greater resistance variation ratio (ΔMR).

As described above, seed layer 22 is preferably formed from a Ni—Fe alloy or a Ni—Fe—Y alloy, where Y is at least one element selected from the group consisting of Cr, Rh, Ta, Hf, Nb, Zr, and Ti, in particular from a non-magnetic alloy. The non-magnetic nature of seed layer 22 serves to enhance the specific resistance of the seed layer 22, so that shunting of a sense current from the conductive layer to seed layer 22 is suppressed, thereby affording a greater resistance variation ratio, while suppressing generation of Barkhausen noise.

Furthermore, in accordance with the present invention, a non-aligned state is created at at least a part of the interface I between antiferromagnetic layer 4 and seed layer 22, and at at least a part of the interface H between antiferromagnetic layer 4 and pinned magnetic layer 3. Moreover, the crystalline structure of at least a part of antiferromagnetic layer 4 has been transformed into a CuAu—I type face-centered cubic ordered lattice structure, suggesting that antiferromagnetic layer 4 has been properly transformed from a disordered lattice structure into an ordered lattice structure. Thus, a greater exchange coupling magnetic field between antiferromagnetic layer 4 and pinned magnetic layer 3 than heretofore possible, specifically an exchange coupling magnetic field of $7.9 \times 10^4$ A/m or greater, is obtained.

In accordance with the present invention, antiferromagnetic layer 4 and seed layer 22 may have different lattice constants at at least a part of interface I, and antiferromagnetic layer 4 and pinned magnetic layer 3 may have different lattice constants at at least a part of interface H. This permits a non-aligned state to be created at at least a part of interface I between antiferromagnetic layer 4 and seed layer 22 and at at least a part of interface H between antiferromagnetic layer 4 and pinned magnetic layer 3.

The heat-treatment causes a diffusion of composition at the interface F between first antiferromagnetic layer 23 and second antiferromagnetic layer 24, and at the interface G between third antiferromagnetic layer 25 and second antiferromagnetic layer 24, so that the interfaces F and G become obscure and indefinite after heat-treatment.

The antiferromagnetic layer 4 is preferably formed from an antiferromagnetic material containing an element X and Mn, where the element X is one or more elements selected from the group consisting of Pt, Pd, Ir, Rh, Ru, and Os, or from an antiferromagnetic element containing an element X, an element X' and Mn, where the element X' is one or more elements selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb and a rare earth element. The aforementioned X—Mn—X' alloy, when used as the material of the antiferromagnetic layer 4, preferably has the form of either an interstitial solid solution in which the element X' has entered interstices of the space lattice constituted by element X and Mn, or a substitutional solid solution in which the element X' has substituted for a portion of the lattice points of the crystal lattice formed of the element X and Mn. The X—Mn—X' alloy can expand the lattice constant over that of the X—Mn alloy, making it possible to properly maintain the non-aligned state at the interface between seed layer 22 and pinned magnetic layer 3.

Preferably, the antiferromagnetic layer 4 after heat-treatment has a region in which the ratio of the atomic percent of element X or elements X+X' increases towards seed layer 22.

The presence of such a composition modulation means that the transformation into the ordered lattice structure has been properly effected by heat-treatment. The region of the above-mentioned composition modulation can be achieved by determining the composition ratio of the element X or the elements X+X' in the third antiferromagnetic layer 25 to be greater than that in the second antiferromagnetic layer 24 in the as-deposited state (i.e., in the state shown in FIG. 4 prior to the heat-treatment), or by varying the sputter gas pressure during deposition of antiferromagnetic layer 4 such that the atomic percent of the element X or the elements X+X' is progressively decreased towards the thicknesswise center of antiferromagnetic layer 4. With this feature, it is considered that the transformation into the ordered lattice structure is properly performed at the interface I between seed layer 22 and antiferromagnetic layer 4, without being influenced by any restraint force produced by the crystalline structure of seed layer 22. Thus, a greater exchange coupling magnetic field than heretofore is obtained.

In addition to the above-described composition modulation, the antiferromagnetic layer 4 has a region in which the ratio of the atomic percent of element X or elements X+X' increases towards pinned magnetic layer 3. This can be achieved by determining the composition ratio of the element X or the elements X+X' in the first antiferromagnetic layer 23 to be greater than that in the second antiferromagnetic layer 24 in the as-deposited state (i.e., in the state shown in FIG. 4 prior to heat-treatment), or by varying the sputter gas pressure during deposition of antiferromagnetic layer 4 such that the composition ratio (atomic percent) of the element X or the elements X+X' is progressively decreased from the thicknesswise central region towards pinned magnetic layer 3.

Thus, the antiferromagnetic layer 4 adjoining seed layer 22 shown in FIG. 5 has a thicknesswise region between the thicknesswise central region and the pinned magnetic layer 3 in which the atomic percent of the element X or the elements X+X' to Mn progressively increases towards pinned magnetic layer 3, and a thicknesswise region between the thicknesswise central region and seed layer 22 in which the atomic percent of the element X or the elements X+X' to Mn progressively increases towards seed layer 22.

Representing by 100 at % the composition ratio of all elements constituting the region of first antiferromagnetic layer 2 near the interface I, as well as the region of first antiferromagnetic layer near the interface H, the composition ratio of the element X or the elements X+X' is preferably not less than 50 at % and not greater than 65 at %. This range is derived from the proper composition range (from 53 at % to 65 at %) of the first antiferromagnetic layer 23 and the third antiferromagnetic layer 25 in the as-deposited state prior to heat-treatment. Due to heat-treatment induced diffusions of compositions at the interface I between the antiferromagnetic layer 4 and the seed layer 22 and at the interface H between the antiferromagnetic layer 4 and the pinned magnetic layer 3, the minimum value (50 at %) of the composition ratio allowed in the antiferromagnetic layer 4 after heat-treatment is smaller than the above-mentioned minimum value (53 at %) allowed for the first antiferromagnetic layer 23 and the third antiferromagnetic layer 25. The composition ratio of the element X or the elements X+X' is preferably not less than 50 at % and not greater than 60 at % in each of the interface I adjacent seed layer 22 and the interface H adjacent pinned magnetic layer 3.

The composition ratio (atomic percent) of the element X or the elements X+X' after heat-treatment is preferably not less than 44 at % and not greater than 57 at % in the thicknesswise central region. This range of the composition ratio is derived from the preferred composition ratio (from 44 at % to 57 at %) of the element X or the elements X+X' of the second antiferromagnetic layer 24 in the as-deposited state (i.e., prior to heat-treatment). More preferably, the above-mentioned composition ratio of the element X or the elements X+X' is not less than 46 at % and not greater than 55 at %.

Two imaginary boundary planes extend parallel to the interfaces adjacent to pinned magnetic layer 3 and the seed layer 22, within the thickness of antiferromagnetic layer 4. The ratio of the atomic percent of the element X or the elements X+X' to Mn is greater in a third region and in a first region than in a second region, wherein the third region is a region between the interface H adjacent to pinned magnetic layer 3 and a second imaginary boundary plane adjacent to interface H, the first region is a region between interface I adjacent to seed layer 22 and a first imaginary boundary plane adjacent to interface I, and the second region is the region between the two imaginary boundary planes, with the above-mentioned ratio preferably increasing linearly or non-linearly from the second region towards the first region across the first imaginary boundary plane, and from the second region towards the third region across the second imaginary boundary regions.

For instance, it is assumed here that a broken line G as shown in FIG. 5 indicates the first imaginary boundary plane, while a broken line F shown in FIG. 5 indicates the second imaginary boundary plane. The broken lines F and G are drawn at thicknesswise positions where the interface between first antiferromagnetic layer 23 and second antiferromagnetic layer 24 and the interface between the second antiferromagnetic layer 24 and third antiferromagnetic layer 25 existed in the as-deposited state prior to heat-treatment.

In the as-deposited structure prior to heat-treatment, the composition ratio of the element X or the elements X+X' is greater in the first and third antiferromagnetic layers 23 and 25 than in the second antiferromagnetic layer 24. It is understood that a subsequent heat-treatment causes diffusions at the interfaces between second antiferromagnetic layer 24 and first and third antiferromagnetic layers 23, 25, so that in the state after heat-treatment, the ratio of the atomic percent of the element X or the elements X+X' to Mn in the third region between interface H facing pinned magnetic layer 3 and the second imaginary boundary plane (broken line F) adjacent interface H, as well as in the first region between the interface I facing the seed layer 22 and the first imaginary boundary pane (broken line G) adjacent interface I, is greater than the ratio of the atomic percent of the element X or the elements X+X' to Mn in the second region between these imaginary boundary planes. In addition, the ratio of atomic percent of the element X or the elements X+X' to Mn linearly or non-linearly increases from the second region towards the third region across the second imaginary boundary plane (broken line F) and, likewise, increases linearly or non-linearly from the second region towards the first region across the first imaginary boundary plane (broken line G). In particular, it is also considered that the non-linear change described above is liable to occur when the composition ratio of the element X or the elements X+X' is significantly greater in each of the first and third antiferromagnetic layers 23 and 25 than in the second antiferromagnetic layer 24.

It is thus understood that, in the antiferromagnetic layer 4 after heat-treatment, due to the fact that the composition ratio of the element X or the elements X+X' is greater in each of the first and third antiferromagnetic layers 23 and 25 than in the second antiferromagnetic layer 24, the composition ratio (atomic percent) of the element X or the elements X+X' increases from a certain thicknesswise central portion towards the interface H adjacent to pinned magnetic layer 3 and increases also from the above-mentioned thicknesswise central portion towards the interface I adjacent to seed layer 22.

While it is not the Applicants' desire to be bound to a particular theory, it is believed that heat-treatment causes diffusions of the compositions between antiferromagnetic layer 4 and pinned magnetic layer 3 across interface H, and between antiferromagnetic layer 4 and seed layer 22 across interface I. As a result, the composition ratio of the element X or the elements X+X' is decreased from that achieved in the as-deposited state, at each of the regions near interfaces H and I.

In accordance with the present invention, therefore, antiferromagnetic layer 4 preferably has a region near interface I adjacent to seed layer 22, in which the atomic percent of the element X or the elements X+X' decreases towards seed layer 22, as well as a region near interface H adjacent to pinned magnetic layer 3, in which the atomic percent of the element X or the elements X+X' decreases towards pinned magnetic layer 3.

The diffusion of compositions occurring at each of the interface H between antiferromagnetic layer 4 and pinned magnetic layer 3 and interface I between antiferromagnetic layer 4 and seed layer 22 causes the atomic percent of the element X or the elements X+X' to be decreased in the region near each of these interfaces H and I from the atomic percent that was achieved in the as-deposited state. As a result, a proper transformation from disordered lattice into an ordered lattice takes place in the regions near interfaces H and I, making it possible to produce a large exchange coupling magnetic field.

Preferably, in the heat-treated antiferromagnetic layer 4, the region in which the composition ratio (atomic percent) of the element X or the elements X+X' decreases towards interface H is a region which has a thickness not less than 3 Å and not greater than 30 Å, as measured from the interface H towards the thicknesswise center of the antiferromagnetic layer 4. The region in which the composition ratio (atomic percent) of the element X or the elements X+X' decreases towards interface I is a region which has a thickness not less than 3 Å and not greater than 30 Å, as measured from the interface I towards the thicknesswise center of antiferromagnetic layer 4. These thickness ranges are the preferred thicknesses of the first and third antiferromagnetic layers 23 and 25 in the as-deposited state prior to heat-treatment.

Preferably, the antiferromagnetic layer 4 has a thickness which is not smaller than 76 Å. As explained above, with reference to FIG. 4 and in connection with the production process, each of the first and third antiferromagnetic layers has the minimum thickness of 3 Å, while the minimum thickness required for the second antiferromagnetic layer 24 is 70 Å. Thus, the minimum required thickness of the whole antiferromagnetic layer 4 is 76 Å.

Thus, in accordance with the present invention, the minimum thickness required for antiferromagnetic layer 4 is as small as 76 Å, which is significantly smaller than that required for conventional structures.

A hard bias layer 5 for aligning the magnetization of free magnetic layer 1, as well as a conductive layer 8, are formed on each side of the laminate structure including lowermost underlying layer 6, topmost protective layer 7, and the layers intermediate therebetween, as shown in FIG. 1.

Although the laminate structure employing seed layer 22, as shown in FIG. 4, has antiferromagnetic layer 4 composed of three layers which serve to enhance the exchange coupling magnetic field, the present invention does not exclude the use of an antiferromagnetic layer 4 having a uniform X—Mn or a uniform X+X' composition. In such cases, it is preferred that a non-aligned state is created at at least a part of the interface between seed layer 22 and antiferromagnetic layer 4, or that seed layer 22 and antiferromagnetic layer 4 are made to have different lattice constants at at least a part of this interface.

More preferably, a non-aligned state is created at at least a part of the interface between seed layer 22 and antiferromagnetic layer 4 and, at the same time, seed layer 22 and antiferromagnetic layer 4 are made to have different lattice constants at at least a part of this interface.

For instance, a single-layered antiferromagnetic layer 4 is formed of a $Pt_{52}Mn_{48}$ alloy. The antiferromagnetic layer 4 made of such a Pt—Mn alloy exhibits a comparatively small degree of non-aligned state with respect to seed layer 22 and pinned magnetic layer 3, so that the exchange coupling magnetic field decreases correspondingly. Nevertheless, the resistance variation ratio is improved by virtue of the presence of seed layer 22, because the crystalline structure of at least a part of antiferromagnetic layer 4 has a CuAu—I type face-centered cubic ordered lattice and the above-mentioned layers have such crystal orientations that the (111) planes are preferentially oriented in a direction parallel to antiferromagnetic layer 4 and pinned magnetic layer 3 to create a non-aligned state at at least a part of the interface between antiferromagnetic layer 4 and seed layer 22.

In this case too antiferromagnetic layer 4 and seed layer 22 may have different lattice constants at at least a part of the interface therebetween.

In accordance with the invention, the antiferromagnetic layer 4 may be composed of second antiferromagnetic layer 24 and third antiferromagnetic layer 25, with first antiferromagnetic layer 23 adjacent to pinned magnetic layer 3 being omitted. In such a case, the restraint force produced by the crystalline structure of pinned magnetic layer 3 tends to provide a greater influence at the interface adjacent to pinned magnetic layer 3 to reduce the exchange coupling magnetic field. However, this problem is not critical if the interface adjacent to seed layer 22 is held in a state that avoids the influence of the restraint force produced by the crystalline structure of seed layer 22. The exchange coupling field is still greater compared to the case where a significant influence is caused by the restraint force produced by the crystalline structure of seed layer 22 at the interface adjacent to seed layer 22. The proper transformation of antiferromagnetic layer 4 from a disordered lattice into an ordered lattice is ensured to a certain degree, without impairing the large resistance variation ratio offered by the presence of seed layer 22. In this case, antiferromagnetic layer 4 has a composition modulation similar to that explained above with reference to FIG. 3; namely, it is preferred that antiferromagnetic layer 4 has a region in which the ratio of the atomic percent of the element X or the elements X+X' to Mn increases towards seed layer 22. Assuming a first imaginary boundary plane parallel to the interface adjacent to seed layer 22 on the same side of the thicknesswise central portion of antiferromagnetic layer 4 as seed layer 22, and a second imaginary boundary plane parallel to the interface adjacent to pinned magnetic layer 3 on the same side of the thicknesswise central portion as pinned magnetic layer 3, the aforementioned ratio is greater in the region between the interface adjacent to seed layer 22 and the first imaginary boundary plane than in the region between the first and second imaginary boundary planes. The ratio increases linearly or non-linearly across the first imaginary boundary plane towards the interface adjacent to seed layer 22. It is also preferred that a non-aligned state is created at at least a part of the interface between seed layer 22 and antiferromagnetic layer 4.

Preferably, antiferromagnetic layer 4 has a region starting from a certain thicknesswise position towards seed layer 22, in which the atomic percent of the element X or the elements X+X' increases towards seed layer 22. More preferably, antiferromagnetic layer 4 further has a region near the interface adjacent to seed layer 22, in which the atomic percent of the element X or the elements X+X' decreases towards seed layer 22.

In the case where the seed layer 22 is employed, the material of antiferromagnetic layer 4 is not limited to the X—Mn alloy or the X—Mn—X' alloy mentioned heretofore. For instance, it is possible to use a Ni—Mn alloy that has been conventionally used as an antiferromagnetic material, or other Mn-free antiferromagnetic materials. The large resistance variation ratio due to the presence of seed layer 22 is achievable even when such materials are used.

In addition, the three-layered structure of antiferromagnetic layer 4 shown in FIG. 4 may be employed even when the laminate structure lacks seed layer 22, as in FIG. 2. Assuming that antiferromagnetic layer 4 in FIG. 2 is composed of three layers and that the structure is subjected to heat-treatment, the antiferromagnetic layer 4 after heat-treatment will have a region in which the ratio of the atomic percent of the element X or the elements X+X' to Mn increases towards pinned magnetic layer 3 starting from a thicknesswise central portion, and a region in which the ratio of the atomic percent of the element X or the elements X+X' to Mn increases towards the protective layer starting from the above-mentioned thicknesswise central portion. The crystalline structure of at least a part of antiferromagnetic layer 4 has a CuAu—I type face-centered cubic ordered lattice. In this case too, it is preferred that a non-aligned state is created at at least a part of the interface adjacent to pinned magnetic layer 3 or that antiferromagnetic layer 4 and pinned magnetic layer 3 have different lattice constants at at least a part of the above-mentioned interface. The structure shown in FIG. 2 has the protective layer 7 made of a non-magnetic material such as one or more elements selected from the group consisting of Ta, Hf, Nb, Zr, Ti, Mo, and W, formed on the side of antiferromagnetic layer 4 opposite to pinned magnetic layer 3, so that it is conceivable that a diffusion of composition takes place between protective layer 7 and antiferromagnetic layer 4. As a result, a region in which the atomic percent of the element X or the elements X+X' progressively decreases is formed near the interface adjacent to protective layer 7.

Each of the laminate structures shown in FIGS. 2 to 5 can be employed in a variety of types of magnetoresistive sensors. In the laminate structures of FIGS. 2 and 3, the antiferromagnetic layer 4 may be deposited on the lower side of pinned magnetic layer 3, although the antiferromagnetic layer 4 is deposited on the upper side of pinned magnetic layer 3 in these Figures.

In such a case, the exchange coupling film is formed by sequentially depositing, starting from the lower side, second antiferromagnetic layer 15, first antiferromagnetic layer 14, and pinned magnetic layer 3. The thickness requirements for first and second antiferromagnetic layers 14 and 15 are the same as those described above with reference to FIG. 2.

The structure having antiferromagnetic layer 4 formed on the lower side of pinned magnetic layer 3 can be used as, for example, a single-spin valve type magnetoresistive sensor, as shown in FIG. 6.

The single-spin valve type magnetoresistive sensor shown in FIG. 6 has a laminate structure composed of an underlying layer 6, an antiferromagnetic layer 4, a pinned magnetic layer 3, a non-magnetic intermediate layer 2, a free magnetic layer 1, and a protective layer 7 which are deposited sequentially from the bottom up, and has a hard bias layer 5 and a conductive layer 8 formed on each side of the laminate structure.

In the production of the single-spin valve type magnetoresistive sensor of FIG. 6, the antiferromagnetic layer 4 may be deposited to have a three-layered structure similar to that explained above with reference to FIG. 4.

More specifically, the third antiferromagnetic layer 25, the second antiferromagnetic layer 24 and the first antiferromagnetic layer 23 are formed in this order on underlying layer 6. Materials, compositions and thicknesses of these antiferromagnetic layers may be the same as those described above in connection with FIG. 4.

A subsequent heat-treatment causes diffusion of compositions between these antiferromagnetic layers, so that the heat-treated antiferromagnetic layer 4 has a region in which the ratio of the atomic percent of the element X or the elements X+X' to Mn progressively increases towards pinned magnetic layer 3 starting from a thicknesswise central portion of antiferromagnetic layer 4, and a region in which the ratio of the atomic percent of the element X or the elements X+X' to Mn progressively increases towards underlying layer 6 starting from the above-mentioned thicknesswise central portion. The crystalline structure of at least a part of the antiferromagnetic layer 4 has a CuAu—I type face-centered cubic ordered lattice. Preferably, a non-aligned state is created at at least a part of the interface adjacent to pinned magnetic layer 3 or, alternatively, both layers on this interface employ different lattice constants.

The process for forming antiferromagnetic layer 4 described above is not exclusive. For example, it may be formed by varying the sputter gas pressure while using the same target, so that the atomic percent of the element X or the elements X+X' is progressively changed in the thicknesswise direction.

In the laminate structures shown in FIGS. 4 and 5 having seed layer 22, the antiferromagnetic layer 4 may be deposited on the upper side of pinned magnetic layer 3, although antiferromagnetic layer 4 is deposited on the lower side of pinned magnetic layer 3 in these Figures. Such a laminate structure can be used as a single-spin valve type magnetoresistive sensor of the type shown in FIG. 1.

The laminate structure is formed by sequentially depositing an underlying layer 6, a free magnetic layer 1, a non-magnetic intermediate layer 2, a pinned magnetic layer 3, an antiferromagnetic layer 4, a seed layer 22, and a protective layer 7, with a hard bias layer 5 and a conductive layer formed at each side of the laminate structure. Requirements concerning the crystalline structure and material of seed layer 22 are the same as those described above with reference to FIGS. 4 and 5.

Figure 7:
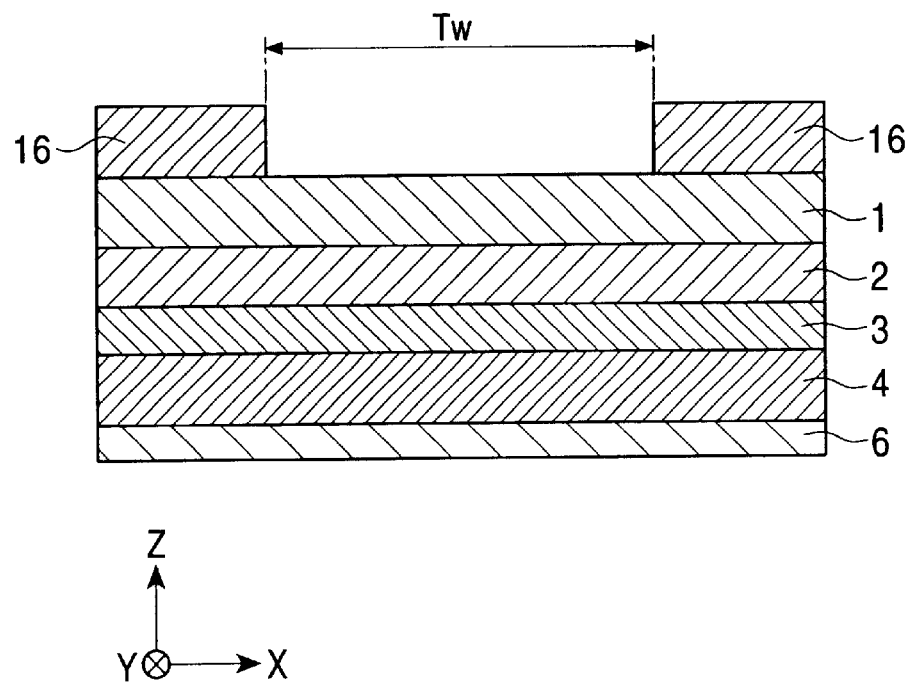
FIG. 7 is a sectional view of a single-spin valve type magnetoresistive sensor in accord with the present invention, viewed from the same side as an ABS surface.
Figure 8:
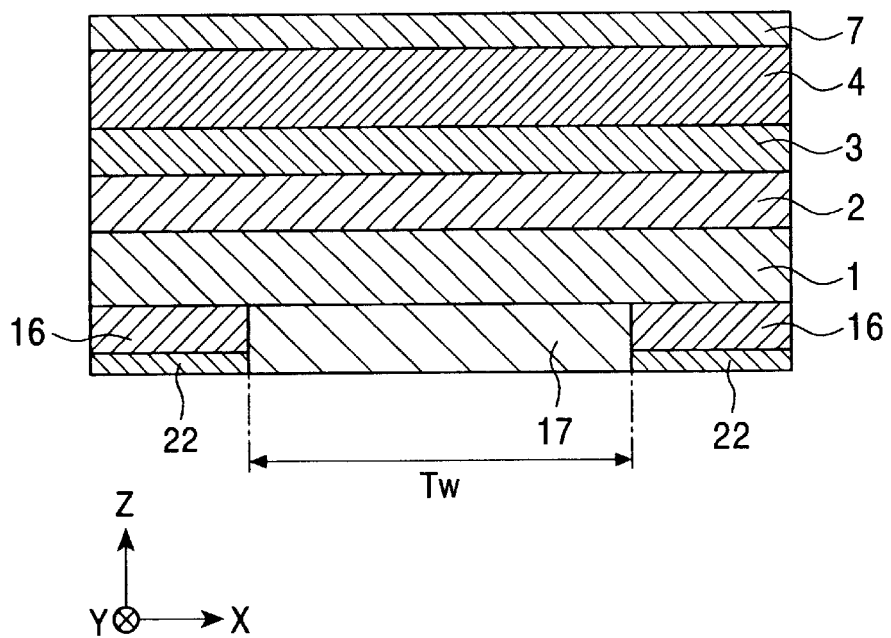
FIG. 8 is a sectional view of a single-spin valve type magnetoresistive sensor in accord with the present invention, viewed from the same side as an ABS surface.

FIGS. 7 and 8 are sectional views of different forms of the single-spin valve type magnetoresistive sensor in accordance with the present invention.

Referring to FIG. 7, an underlying layer 6, an antiferromagnetic layer 4, a pinned magnetic layer 3, a non-magnetic intermediate layer 2, and a free magnetic layer 1 are sequentially deposited from the bottom up. Thus, antiferromagnetic layer 4 is formed on the lower side of pinned magnetic layer 3 in this embodiment.

In the production of this magnetoresistive sensor, second antiferromagnetic layer 15 and first antiferromagnetic layer 14 are deposited on underlying layer 6, so as to form antiferromagnetic layer 4. Pinned magnetic layer 3 is formed on antiferromagnetic layer 4. Alternatively, antiferromagnetic layer 4 may have a three-layered structure such as that described above with reference to FIG. 4. Preferably, each of first antiferromagnetic layer 14 and second antiferromagnetic layer 15 is an X—Mn alloy (X is one or more elements selected from the group consisting of Pt, Pd, Ir, Rh, Ru, and Os), preferably a Pt—Mn alloy, or an X—Mn—X' alloy (X' is one or more elements selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb and a rare earth element).

In accordance with the present invention, it is preferred that a non-aligned state is created at at least a part of the interface between first antiferromagnetic layer 14 and pinned magnetic layer 3. The second antiferromagnetic layer 15 is formed of an antiferromagnetic material having a composition approximating an ideal composition for facilitating transformation from a disordered lattice structure into an ordered lattice structure upon heat-treated. The requirements concerning the composition ratios of the element X or the elements X+X' and the thickness of first antiferromagnetic layer 14 and second antiferromagnetic layer 15 are the same as those explained above with reference to FIG. 2.

The process for forming antiferromagnetic layer 4 described above is not exclusive. The first antiferromagnetic layer 4 may be formed by varying the sputter gas pressure while using the same target, so that the atomic percent of the element X or the elements X+X' is progressively changed in the thicknesswise direction.

A heat-treatment is conducted after deposition of antiferromagnetic layer 4. The heat-treatment causes a proper transformation from a disordered lattice structure into an ordered lattice structure in the second antiferromagnetic layer 15, as well as a diffusion of compositions at the boundary between first antiferromagnetic layer 14 and second antiferromagnetic layer 15. As a result, transformation from a disordered lattice structure into ordered lattice structure is properly effected in the first antiferromagnetic layer 14.

Preferably, the ratio of the atomic percent of the element X or the elements X+X' in the state after heat-treatment increases towards pinned magnetic layer 3, with the crystalline structure of at least a part of antiferromagnetic layer 4 having a CuAu—I type face-centered cubic ordered lattice, and with a non-aligned state being created at at least a part of the interface between antiferromagnetic layer 4 and pinned magnetic layer 3. It is also preferred that pinned magnetic layer 3 and antiferromagnetic layer 4 have different lattice constants or different crystal orientations at the interface therebetween.

When antiferromagnetic layer 4 has been deposited to have a three-layered structure, as shown in FIG. 4, or when antiferromagnetic layer 4 has been deposited such that the composition ratio of the element X or the elements X+X' progressively decreases towards the thicknesswise central portion from both interfaces on antiferromagnetic layer 4, the heat-treated antiferromagnetic layer 4 has a region in which the ratio of the atomic percent of the element X to Mn progressively increases towards pinned magnetic layer 3 starting from a thicknesswise central portion of the antiferromagnetic layer 4. In addition, the heat-treated antiferromagnetic layer 4 has a region in which the ratio of the atomic percent of the element X to Mn progressively increases towards underlying layer 6 starting from the above-mentioned thicknesswise central portion of antiferromagnetic layer 4. In addition, the crystalline structure of at least a part of antiferromagnetic layer 4 has a CuAu—I type face-centered cubic ordered lattice and, preferably, a non-aligned state is created at at a least part of the interface adjacent to pinned magnetic layer 3. Alternatively, both layers on the above-mentioned interface have different lattice constants or different crystal orientations.

As shown in FIG. 7, segments 16 of the exchange bias layer are formed on free magnetic layer 1, leaving therebetween a space corresponding to the track width Tw in the track width direction.

The exchange bias layer 16 is formed from an X—Mn alloy (X is one or more elements selected from the group consisting of Pt, Pd, Ir, Rh, Ru, and Os), preferably a Pt—Mn alloy, or from an X—Mn—X' alloy (X' is one or more elements selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb and a rare earth element).

Deposition of exchange bias layer 16 involves forming a first antiferromagnetic layer 14 on free magnetic layer 1, and forming a second antiferromagnetic layer 15 on first antiferromagnetic layer 14. First antiferromagnetic layer 14 and second antiferromagnetic layer 15 are the same as those shown in FIG. 2. The first antiferromagnetic layer 14 has a greater composition ratio of the element X or the elements X+X' than the second antiferromagnetic layer 15 and, in addition, the second antiferromagnetic layer 15 is formed of an antiferromagnetic material having a composition approximating an ideal composition for transforming easily from a disordered lattice structure into an ordered lattice structure upon heat-treatment.

As a result of the above-described heat-treatment, the exchange bias layer 16 is properly transformed from a disordered lattice structure into an ordered lattice structure, without undergoing the restraint force produced by the crystalline structure of pinned magnetic layer 3 at the interface adjacent to free magnetic layer 1. As a result, an exchange coupling magnetic field is generated at the interface between exchange bias layer 16 and free magnetic layer 1.

After heat treatment, the exchange bias layer 16 has a region in which the ratio of the atomic percent of the element X or elements X+X' to Mn increases towards free magnetic layer 1, the crystalline structure of at least a part of exchange bias layer 16 has a CuAu—I type face-centered cubic ordered lattice and, preferably, a non-aligned state is created at at least a part of the interface adjacent to free magnetic layer 1.

The exchange bias layer 16 may be formed to have a three-layered structure such as that described above with reference to FIG. 4. In such a case, exchange bias layer 16 has a region in which the ratio of the atomic percent of the element X or elements X+X' to Mn increases towards free magnetic layer 1 starting from a thicknesswise central portion of exchange bias layer 16, and a region in which the ratio of the atomic percent of the element X or elements X+X' to Mn increases in the direction away from free magnetic layer 1 starting from the above-mentioned thicknesswise central portion. In addition, the crystalline structure of at least a part of the exchange bias layer 16 has a CuAu—I type face-centered cubic ordered lattice. Preferably, a non-aligned state is created at at least a part of the interface adjacent to free magnetic layer 1. Alternatively, both layers on the above-mentioned interface have different lattice constants or different crystal orientations.

Both end portions of free magnetic layer 1 are formed into a single magnetic domain in the X direction by the effect of the exchange coupling magnetic field acting between exchange bias layer 16 and free magnetic layer 1. The region of free magnetic layer 1 extending over the width Tw corresponding to the track width has been properly aligned in the X direction to such a degree as to be sensitive to external magnetic fields.

In the single-spin valve type magnetoresistive sensor produced by the described process, the magnetization of free magnetic layer 1 at the region of the track width Tw changes from the X direction to the Y direction under the influence of an external magnetic field applied in the Y direction. Electric resistance is changed based on the relationship between the change of the magnetization in free magnetic layer 1 and the fixed direction (Y direction) of magnetization of pinned magnetic layer 3. The change in the electrical resistance causes a change in voltage, thus enabling sensing of a magnetic field leaking from a recording medium.

The single-spin valve type magnetoresistive sensor of FIG. 7 may have a seed layer 22 such as that explained above with reference to FIGS. 4 and 5.

In such a case, seed layer 22 is interposed between antiferromagnetic layer 4 and underlying layer 6. The seed layer has a crystalline structure primarily constituted by face-centered cubic crystals, with the (111) plane preferentially oriented in a direction parallel to the interface adjacent to antiferromagnetic layer 4. The use of such a seed layer 22 permits antiferromagnetic layer 4 and free magnetic layer 1, as well as intervening layers, to be aligned such that their (111) faces are preferentially oriented, thus allowing growth of large crystal grains. It is therefore possible to increase the ratio of the resistance variation.

The requirements concerning the material of seed layer 22 and the structure of antiferromagnetic layer 4 are the same as those described above with reference to FIGS. 4 and 5.

The seed layer 22 may be formed on the exchange bias layer 16.

FIG. 8 shows a single-spin valve type magnetoresistive sensor having a laminate structure deposited in an order reverse to that of the magnetoresistive sensor of FIG. 7.

Referring to FIG. 8, segments 16 of the exchange bias layer are formed so as to be spaced apart from each other by a distance corresponding to the track width Tw. The vacancy between segments 16 of the exchange bias layer is filled with an insulating layer 17 made of an insulating material such as $SiO_2$ or $Al_2O_3$.

A free magnetic layer 13 is formed to overlie exchange bias layer 16 and insulating layer 17. In this embodiment too, the exchange bias layer 16 as deposited (i.e., prior to heat-treatment), has a laminate structure composed of a first antiferromagnetic layer 14 and a second antiferromagnetic layer 15.

More specifically, the second antiferromagnetic layer 15 is deposited first, followed by the first antiferromagnetic layer 14. The widthwise central portion of first antiferromagnetic layer 14 and second antiferromagnetic layer 15 is removed by etching for example. The vacancy between segments 16 thus obtained is then filled with insulating layer 17, followed by deposition of the free magnetic layer 13 overlying exchange bias layer 16 and insulating layer 17. The first antiferromagnetic layer 14 constituting part of exchange bias layer 16 has a greater composition ratio of the element X or the elements X+X' than the second antiferromagnetic layer 15 which constitutes the other part of exchange bias layer 16. In addition, second antiferromagnetic layer 15 is formed of an antiferromagnetic material having a composition approximating an ideal composition for facilitating transformation from the disordered lattice structure into an ordered lattice structure. The requirement concerning the composition ratios of the element X or the elements X+X' and the thicknesses of the first antiferromagnetic layer 14 and the second antiferromagnetic layer 15 are the same as those explained above with reference to FIG. 2.

The laminate structure up to free magnetic layer 1 is subjected to a heat-treatment after deposition. As a result of heat-treatment, the exchange bias layer 16 is properly transformed to change its structure from a disordered lattice into an ordered lattice without being influenced by the restraint force of the crystalline structure of free magnetic layer 1 at the interface adjacent to free magnetic layer 1. An exchange coupling magnetic field is generated at the boundary between exchange bias layer 16 and free magnetic layer 1. The exchange bias layer 16 after heat-treatment has a region in which the ratio of the atomic percent of the element X or elements X+X' to Mn increases towards free magnetic layer 1. The crystalline structure of at least a part of exchange bias layer 16 has a CuAu—I type face-centered cubic ordered lattice and, preferably, a non-aligned state is created at at least a part of the interface adjacent to free magnetic layer 1. Both end portions of free magnetic layer 1 are formed into a single magnetic domain in the X direction by the effect of the above-mentioned exchange coupling magnetic field. The region of free magnetic layer 1 extending over the width Tw corresponding to the track width has been properly aligned in the X direction to such a degree as to be sensitive to external magnetic fields. The exchange bias layer 16 may be formed to have a three-layered structure such as that described above with reference to FIG. 4. In such a case, the exchange bias layer 16 has a region in which the ratio of the atomic percent of the element X or elements X+X' to Mn increases towards free magnetic layer 1 starting from a thicknesswise central portion of exchange bias layer 16, and a region in which the ratio of the atomic percent of the element X or elements X+X' to Mn increases in the direction away from free magnetic layer 1 starting from the above-mentioned thicknesswise central portion. In addition, the crystalline structure of at least a part of the exchange bias layer 16 has a CuAu—I type face-centered cubic ordered lattice. Preferably, a non-aligned state is created at at least a part of the interface adjacent to free magnetic layer 1. Alternatively, both layers on the above-mentioned interface have different lattice constants or different crystal orientations.

Then, non-magnetic intermediate layer 2, pinned magnetic layer 3, antiferromagnetic layer 4 and protective layer 7 are deposited sequentially free magnetic layer 1.

In the deposition process prior to heat-treatment, the first antiferromagnetic layer 14 is formed on pinned magnetic layer 3 and then second antiferromagnetic layer 15 is formed on first antiferromagnetic layer 14. In the as-deposited state, first antiferromagnetic layer 14 has a greater composition ratio of the element X or the element X+X' than second antiferromagnetic layer 15. Preferably, a non-aligned state is created at at least a part of the interface adjacent to pinned magnetic layer 3. In addition, the second antiferromagnetic layer 15 is formed from an antiferromagnetic material having a composition approximating an ideal composition for facilitating transformation from a disordered lattice structure into an ordered lattice structure upon heat-treatment.

The heat-treatment is executed after deposition of antiferromagnetic layer 14 and second antiferromagnetic layer 15. As a result of heat-treatment, antiferromagnetic layer 4 is properly transformed from its disordered lattice structure into an ordered lattice structure, without being influenced by the restraint force produced by the crystalline structure of pinned magnetic layer 3 at the interface adjacent to pinned magnetic layer 3. As a result, an exchange coupling magnetic field is generated at the interface between antiferromagnetic layer 4 and pinned magnetic layer 3. The exchange coupling magnetic field serves to fix the magnetization of pinned magnetic layer 3 in the direction Y shown in the drawings.

Since the influence of the restraint force produced by the crystalline structure of pinned magnetic layer 3 is diminished at the interface adjacent to pinned magnetic layer 3 during heat-treatment, and since the first antiferromagnetic layer 4 has a composition approximating an ideal composition for facilitating transformation from a disordered lattice structure into an ordered lattice structure, a greater exchange coupling magnetic field than in conventional devices, specifically $7.9 \times 10^4$ A/m or greater, is produced between first antiferromagnetic layer 4 and pinned magnetic layer 3. In the deposition process, antiferromagnetic layer 4 may be formed to have a three-layered structure such as that described above with reference to FIG. 4. In such a case, the antiferromagnetic layer 4 has a region in which the ratio of the atomic percent of the element X or elements X+X' to Mn increases towards pinned magnetic layer 3 starting from a thicknesswise central portion of antiferromagnetic layer 4, and a region in which the ratio of the atomic percent of the element X or elements X+X' to Mn increases towards protective layer 7 starting from the above-mentioned thicknesswise central portion. In addition, the crystalline structure of at least a part of antiferromagnetic layer 4 has a CuAu—I type face-centered cubic ordered lattice. Preferably, a non-aligned state is created at at least a part of the interface adjacent to pinned magnetic layer 3. Alternatively, both layers on the above-mentioned interface have different lattice constants or different crystal orientations.

This embodiment also may employ a seed layer 22. Such a seed layer is formed between antiferromagnetic layer 4 and protective layer 7. It is possible to enhance the exchange coupling magnetic field by the use of seed layer 22. The requirements concerning the material of seed layer 22 and the structure of antiferromagnetic layer 4 are the same as those described above with reference to FIGS. 4 and 5.

Preferably, the seed layer 22 is formed on the lower side of exchange bias layer 16, as shown in FIG. 8. By forming seed layer 22, it is possible to orderly align the crystal orientation of exchange bias layer 16, making it possible to properly generate an exchange coupling magnetic field between free magnetic layer 1 and exchange bias layer 16.

Figure 9:
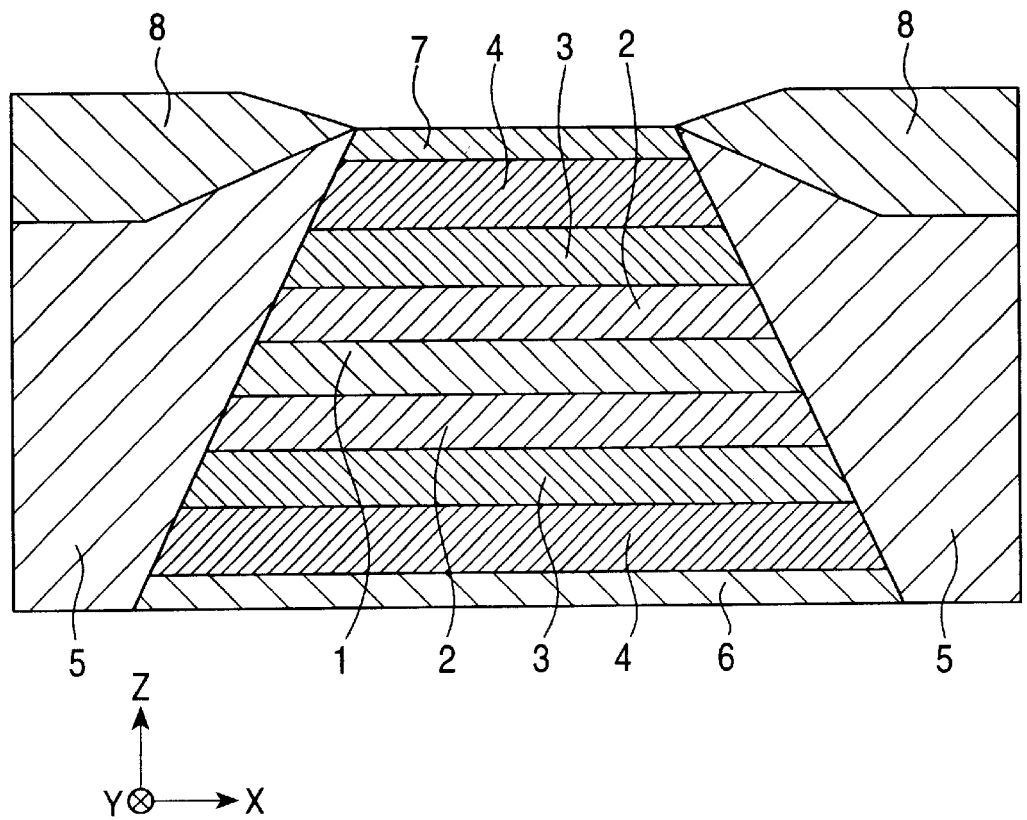
FIG. 9 is a sectional view of a single-spin valve type magnetoresistive sensor in accord with the present invention, viewed from the same side as an ABS surface.

FIG. 9 is a sectional view showing the structure of a dual-spin valve type magnetoresistive sensor in accordance with the present invention.

As is shown in FIG. 9, an underlying layer 6, an antiferromagnetic layer 4, a pinned magnetic layer 3, a non-magnetic intermediate layer 2, and a free magnetic layer 1 are sequentially deposited from the bottom up. Further, another non-magnetic intermediate layer 2, another pinned magnetic layer 3, another antiferromagnetic layer 4 and a protective layer 7 are sequentially deposited on free magnetic layer 1.

A hard bias layer 5 and a conductive layer 8 are formed on each side of the laminate structure starting from underlying layer 6 and terminating in protective layer 7. All of these layers are formed of materials that are the same as those described above with reference to FIGS. 1 to 7.

Figure 10:
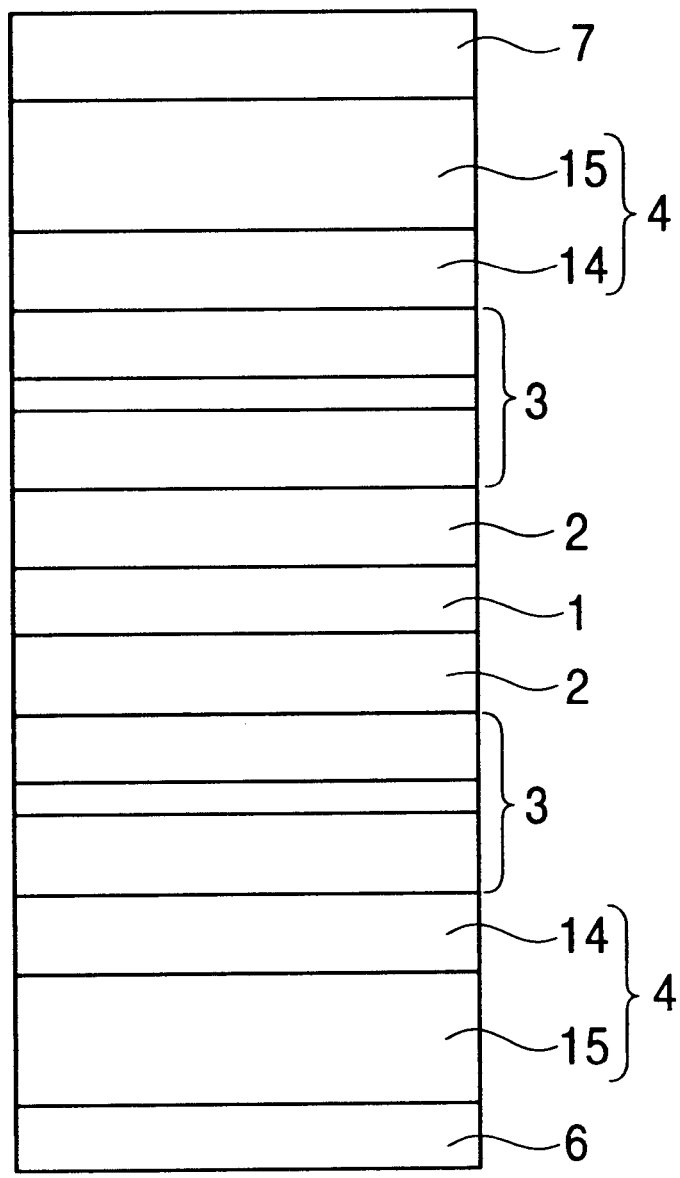
FIG. 10 is a schematic illustration of a dual-spin valve type laminate structure in a state after deposition.

A description will now be given of the production process, with reference to FIG. 10. In the deposition process, each of the two antiferromagnetic layers 4 is formed to have a two-layered structure composed of a first antiferromagnetic layer 14 and a second antiferromagnetic layer 15. The first antiferromagnetic layer 14 is formed in contact with pinned magnetic layer 3, and the second antiferromagnetic layer 15 is formed in contact with first antiferromagnetic layer 14. Each of the first antiferromagnetic layer 14 and the second antiferromagnetic layer 15 is formed from an X—Mn alloy or an X—Mn—X' alloy, as described above.

In the as-deposited state, the first antiferromagnetic layer 14 has a greater composition ratio of the element X or the element X+X' than the second antiferromagnetic layer 15. Preferably, a non-aligned state is created at at least a part of the interface adjacent to pinned magnetic layer 3. In addition, the second antiferromagnetic layer 15 is formed from an antiferromagnetic material having a composition approximating an ideal composition for facilitating transformation from a disordered lattice structure into ordered lattice structure upon heat-treatment. Requirements for the composition ratios of the element X or the elements X+X', and the thicknesses of the respective antiferromagnetic layers are the same as those described above with reference to FIG. 2.

The heat-treatment is executed after deposition of the antiferromagnetic layer 14 and second antiferromagnetic layer 15. As a result of heat-treatment, antiferromagnetic layer 4 is properly transformed to change its disordered lattice structure into an ordered lattice structure, without being influenced by the restraint force produced by the crystalline structure of pinned magnetic layer 3 at the interface adjacent to pinned magnetic layer 3. An exchange coupling magnetic field generated at the above-mentioned interface serves to fix the magnetization of pinned magnetic layer 3 in the direction Y shown in the drawings.

Since the first antiferromagnetic layer 14 is formed of a suitable material free from the influence of the restraint force produced by the crystalline structure of pinned magnetic layer 3 at the interface adjacent to pinned magnetic layer 3, and since the second antiferromagnetic layer 15 is formed from a material having a composition approximating an ideal composition for facilitating transformation from a disordered lattice structure into an ordered lattice structure, the transformation from a disordered lattice structure into an ordered lattice structure is properly effected by heat-treatment, while a non-aligned state is maintained between antiferromagnetic layer 4 and pinned magnetic layer 3. As a result, a greater exchange coupling magnetic field than in conventional devices can be obtained. Specifically, an exchange coupling magnetic field of $7.9 \times 10^4$ A/m or greater is expected in accordance with the present invention.

Figure 11:
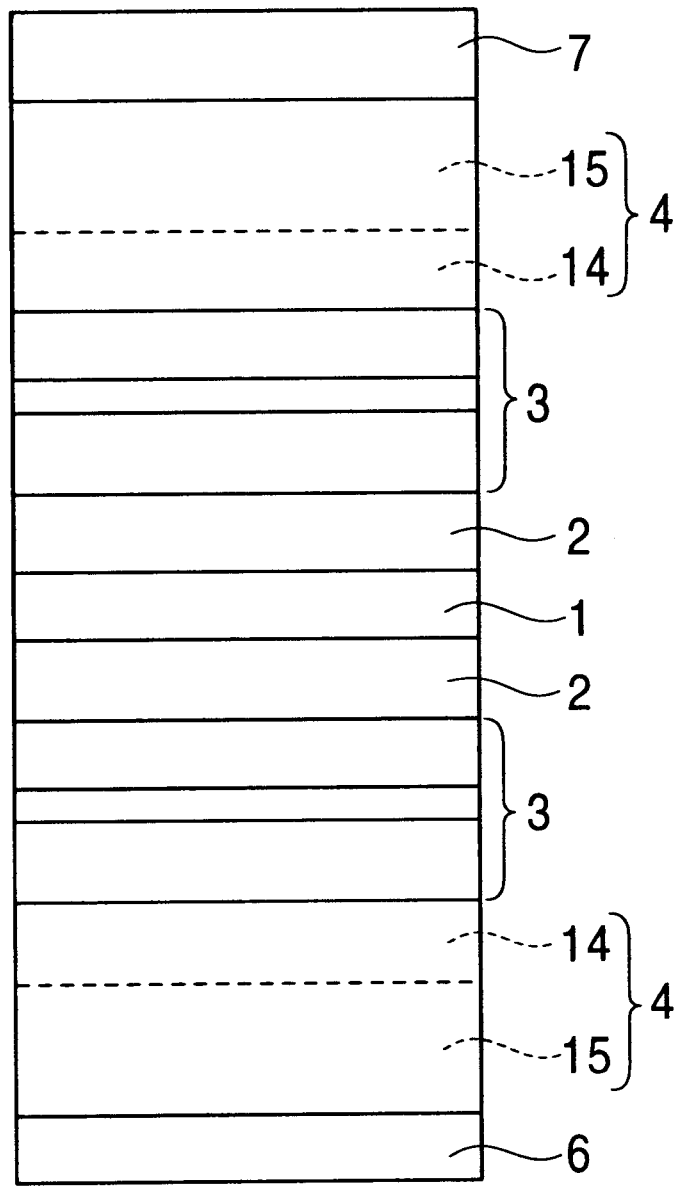
FIG. 11 is a schematic illustration of the laminate structure of FIG. 10 in a state after heat-treatment.

FIG. 11 shows the state of the structure after heat-treatment. The antiferromagnetic layer 4 shown in FIG. 11 has a region in which the ratio of the atomic percent of the element X or elements X+X' to Mn increases towards pinned magnetic layer 3, and the crystalline structure of at least a part of antiferromagnetic layer 4 has a CuAu—I type face-centered cubic ordered lattice. Preferably, a non-aligned state is created at at least a part of the interface adjacent to pinned magnetic layer 3. Both layers on the above-mentioned interface preferably have different lattice constants or different crystal orientations, in order that the non-aligned state is maintained.

The presence of the region in antiferromagnetic layer 4 in which the ratio of the atomic percent of the element X or elements X+X' to Mn increases towards pinned magnetic layer 3 is attributed to the fact that antiferromagnetic layer 4 is deposited to have a laminate structure composed of first antiferromagnetic layer 14 having a large atomic percent of the element X or the elements X+X' and second antiferromagnetic layer 15. More specifically, although the heat-treatment causes diffusion of composition between first antiferromagnetic layer 14 and second antiferromagnetic layer 15, diffusion does not proceed to such an extent as to provide a uniform composition of the entire antiferromagnetic layer 4. The region that was constituted by the first antiferromagnetic layer 14 still has a portion where the composition ratio of the element X or the elements X+X' is greater than in the region that was constituted by the second antiferromagnetic layer 15. As a result, a region is formed in which the ratio of the atomic percent of the element X or elements X+X' to Mn increases towards pinned magnetic layer 3.

While it is not the Applicants' desire to be bound by a particular theory, it is believed that the antiferromagnetic layer 4 has a region near the interface adjacent to pinned magnetic layer 3, in which the composition ratio of the element X or the elements X+X' in the antiferromagnetic layer 4 decreases towards pinned magnetic layer 3. This is attributable to the diffusion of compositions between antiferromagnetic layer 4 and pinned magnetic layer 3 caused by heat-treatment. Likewise, the diffusion of composition takes place between antiferromagnetic layer 4 and underlying layer 6, and between antiferromagnetic layer 4 and protective layer 7. It is therefore understood that antiferromagnetic layer 4 also has a region near the interface adjacent to underlying layer 6, as well as a region near the interface adjacent to protective layer 7, in which the composition ratio of the element X or the elements X+X' in antiferromagnetic layer 4 decreases towards the interface.

Requirements concerning the composition ratios of the element X or the elements X+X' of antiferromagnetic layer 4 at the interface adjacent to pinned magnetic layer 3 or at the side opposite to this interface, the thickness of antiferromagnetic layer 4, and so forth, are the same as described above in connection with FIG. 3.

Figure 12:
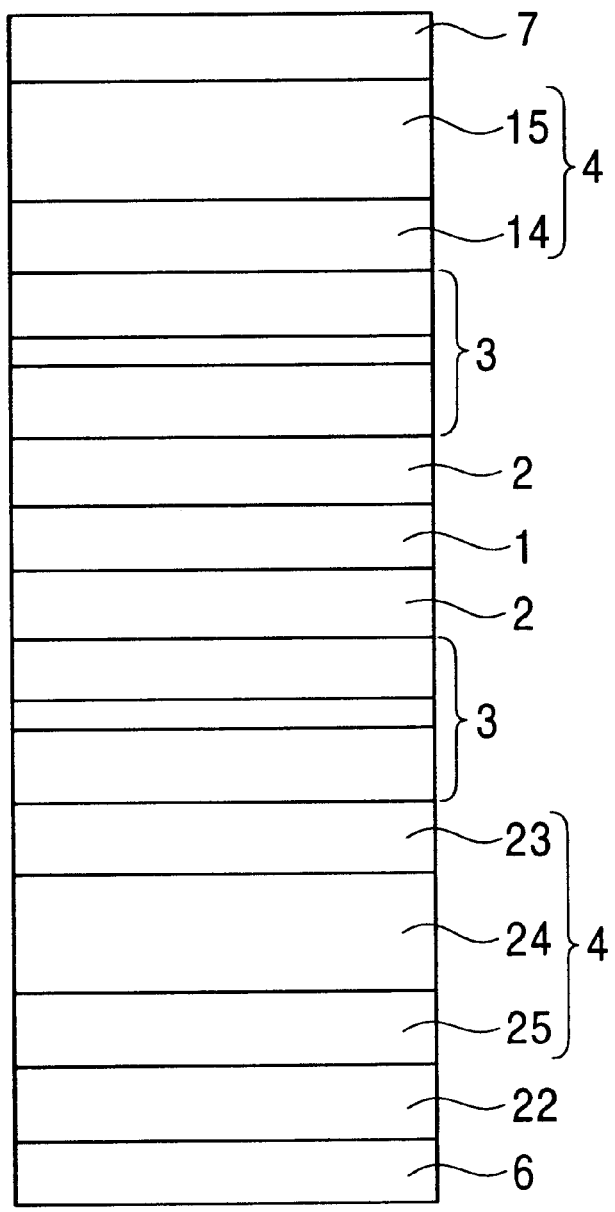
FIG. 12 is a schematic illustration of a dual-spin valve type laminate structure having a seed layer, in a state after deposition.

This embodiment also may employ a seed layer 22. The production process is shown in FIG. 12. Seed layer 22 is formed on underlying layer 6, and an antiferromagnetic layer 4 having a three-layered structure is deposited on seed layer 22. The structure of antiferromagnetic layer 4 is the same as that described above with reference to FIG. 10.

The antiferromagnetic layer 4 formed on seed layer 22 has a third antiferromagnetic layer 25 adjacent to seed layer 22, a first antiferromagnetic layer 23 adjacent to pinned magnetic layer 3, and a second antiferromagnetic layer 24 interposed between first antiferromagnetic layer 23 and third antiferromagnetic layer 25.

As described above with reference to FIG. 4, each of the first through third antiferromagnetic layers is formed from an X—Mn alloy or an X—Mn—X' alloy, wherein the composition ratio of the element X or the elements X+X' in the second antiferromagnetic layer 24 is determined to be smaller than in the remaining two antiferromagnetic layers. Such adjustment of the composition ratio makes it possible to create a non-aligned state at at least a part of the interface between seed layer 22 and third antiferromagnetic layer 25, as well as at the interface between pinned magnetic layer 3 and third antiferromagnetic layer 25. The layers facing each other across each of these interfaces may have different lattice constants.

The seed layer 22 has face-centered cubic crystals with the (111) planes preferentially oriented in the direction parallel to the interface adjacent to pinned magnetic layer 3. The layers formed on this seed layer have crystalline structures in which their (111) planes are oriented in the direction parallel to the above-mentioned interface. The material of seed layer 22 may be similar to that described above with reference to FIG. 4, although the material preferably has non-magnetic properties and a high specific resistance.

As will be seen from FIG. 12, antiferromagnetic layer 4 formed above free magnetic layer 1 has a two-layered structure, as in the case of the structure described above with reference to FIG. 2. This, however, is not essential, and the antiferromagnetic layer 4 formed above free magnetic layer 1 may have a three-layered structure as in the case of the antiferromagnetic layer 4 which is formed below free magnetic layer 1.

Figure 13:
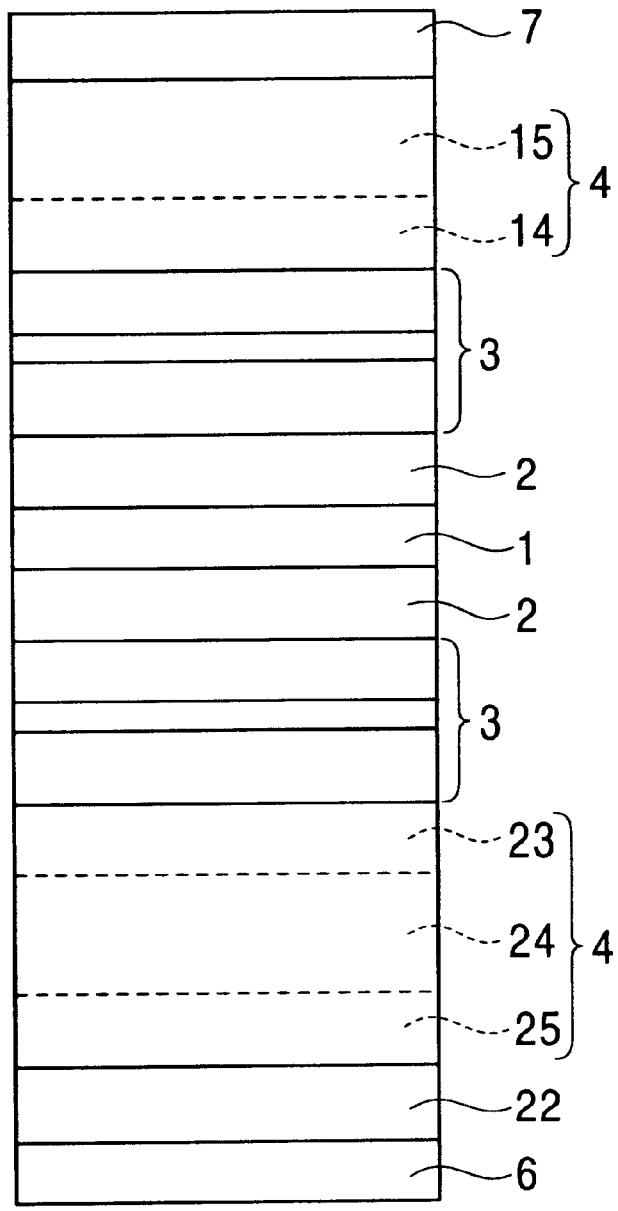
FIG. 13 is a schematic illustration of the laminate structure of FIG. 12 in a state after heat-treatment.

FIG. 13 schematically shows the dual-spin valve type magnetoresistive sensor obtained by heat-treatment.

Since second antiferromagnetic layers 24 and 15 have compositions apt to be transformed into ordered lattice structures, transformation into ordered lattice structures is commenced in the second antiferromagnetic layer 24 of the first antiferromagnetic layer 4 below free magnetic layer 1, and in the second antiferromagnetic layer 15 of the antiferromagnetic layer 4 above free magnetic layer 1. As a result of diffusions of compositions caused by heat-treatment, transformation also proceeds in other layers, while the non-aligned state is maintained. Thus, a greater exchange coupling magnetic field than in conventional devices can be achieved.

As a result of the above-described diffusions of compositions, the antiferromagnetic layer 4 beneath free magnetic layer 1 has a region in which the ratio of the atomic percent of the element X or the elements X+X' to Mn increases towards pinned magnetic layer 3, as well as a region in which this ratio increases towards seed layer 22. At the same time, the crystalline structure of at least a part of this antiferromagnetic layer 4 has a CuAu—I type face-centered crystalline structure. Preferably, a non-aligned state is created at at least a part of the interface adjacent to seed layer 22, as well as at at least a part of the interface adjacent to pinned magnetic layer 3.

Meanwhile, the antiferromagnetic layer 4 above free magnetic layer 1 has a region in which the ratio of the atomic percent of the element X or the elements X+X' to Mn increases towards pinned magnetic layer 3. At the same time, the crystalline structure of at least a part of this antiferromagnetic layer 4 has a CuAu—I type face-centered crystalline structure. Preferably, a non-aligned state is created at at least a part of the interface adjacent to pinned magnetic layer 3. The antiferromagnetic layer 4 formed above free magnetic layer 1 also has a crystal orientation in which the (111) planes are preferentially aligned.

In the antiferromagnetic layer 4 below free magnetic layer 1, it is believed that diffusion of composition takes place at the interface adjacent to seed layer 22 and at the interface adjacent to pinned magnetic layer 3, so that regions exist near the interface adjacent to seed layer 22 and near the interface adjacent to the pinned magnetic layer 3, respectively, in which the atomic percent of the element X or the elements X+X' in antiferromagnetic layer 4 decreases towards the respective interfaces. The presence of such regions indicates that antiferromagnetic layer 4 has been properly transformed into an ordered lattice structure at the interface adjacent to seed layer 22 and at the interface adjacent to pinned magnetic layer 3, thereby providing a large exchange coupling magnetic field.

While it is not the Applicants' desire to be bound by a particular theory, it is believed that in the antiferromagnetic layer 4 formed above free magnetic layer 1, a diffusion of compositions takes place at the interface adjacent to pinned magnetic layer 3. As a result, a region exists near the interface adjacent to pinned magnetic layer 3, in which the atomic percent of the element X or the elements X+X' in antiferromagnetic layer 4 decreases towards the above-mentioned interface. It is also conceivable that a diffusion of composition takes place at the boundary between antiferromagnetic layer 4 and the protective layer which is formed, for example, of Ta. If such a diffusion has taken place, a region exists in antiferromagnetic layer 4 near the interface adjacent to protective layer 7, in which the atomic percent of the element X or the elements X+X' in the antiferromagnetic layer 4 decreases towards this interface.

The presence of seed layer 22 serves to promote preferential orientation of the (111) planes in parallel with the film planes, and to increase the sizes of the crystal grains in antiferromagnetic layer 4 below free magnetic layer 1 and in antiferromagnetic layer 4 above free magnetic layer 1, as well as in the layers intervening between these two antiferromagnetic layers 4. It is therefore possible to obtain a greater exchange magnetic field and a greater ratio of resistance variation than in conventional devices.

In order to better improve the ratio of resistance variation, seed layer 22 is preferably formed between underlying layer 6 and the antiferromagnetic layer 4 below free magnetic layer 1, as shown in FIGS. 12 and 13. The seed layer 22, however, may be formed between protective layer 7 and antiferromagnetic layer 4 above free magnetic layer 1.

Figure 14:
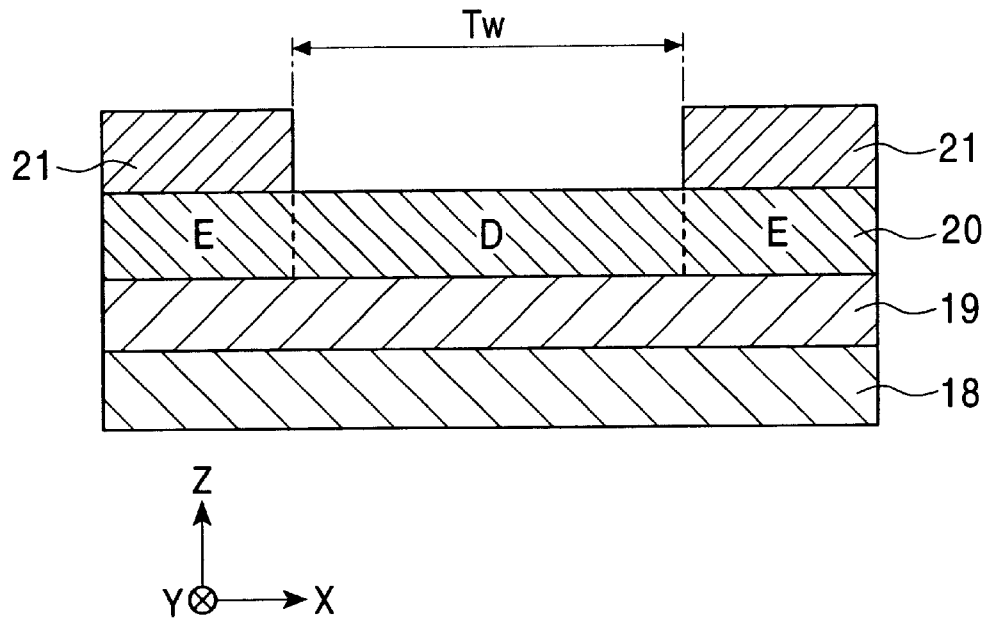
FIG. 14 is a sectional view of an AMR magnetoresistive sensor in accord with the present invention, viewed from the same side as the ABS surface.
Figure 15:
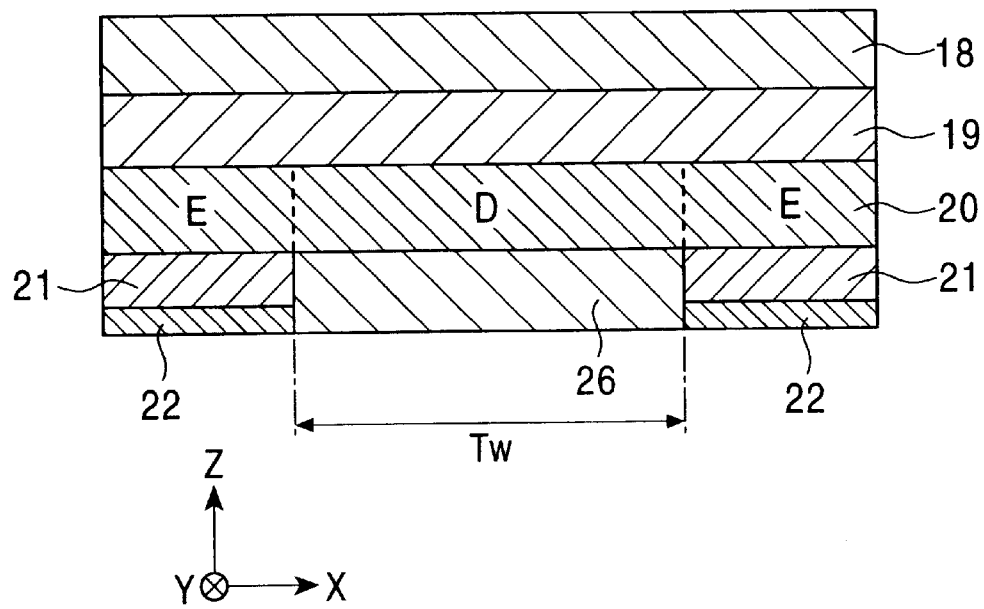
FIG. 15 is a sectional view of an AMR magnetoresistive sensor in accord with the present invention, viewed from the same side as the ABS surface.

FIGS. 14 and 15 are sectional views of AMR magnetoresistive sensors embodying features of the present invention.

Referring to FIG. 14, a soft magnetic layer (SAL layer) 18, a non-magnetic layer (SHUNT layer) 19, and a magnetoresistive layer (MR layer) are successively deposited.

By way of example, soft magnetic layer 18 is formed of a Fe—Ni—Nb alloy, while non-magnetic layer 19 is made from a Ta film. The magnetoresistive layer 20 is formed of a Ni—Fe alloy.

Segments 21 of an exchange bias layer (antiferromagnetic layer) spaced from each other in the direction of the track width (X direction) by a distance corresponding to the track width Tw, are formed on both end portions of magnetoresistive layer 20. Although not shown, a conductive layer is formed, for example, on the segments 21 of the exchange bias layer.

Referring to FIG. 15, segments 21 of the exchange bias layer are formed so as to be spaced apart from each other in the track width direction (X direction) by a distance corresponding to the track width Tw. The vacancy between these segments 21 of the exchange bias layer is filled with an insulating layer 26 made of an insulating material such as $SiO_2$ or $Al_2O_3$.

The exchange bias layer 21 and the insulating layer 26 are overlain by the magnetoresistive layer (MR layer) 20, the non-magnetic layer (SHUNT layer) 19 and the soft magnetic layer (SAL layer) 18.

In the production process, the exchange bias layer 21 is deposited to have a two-layered structure composed of first antiferromagnetic layer 14 and second antiferromagnetic layer 15.

The first antiferromagnetic layer 14 is formed in contact with magnetoresistive layer 20, and the second antiferromagnetic layer 15 is formed on magnetoresistive layer 20 with first antiferromagnetic layer 14 intervening therebetween.

As described above in connection with FIG. 2, the first antiferromagnetic layer 14 has a greater composition ratio of the element X or the element X+X' than the second antiferromagnetic layer 15. Preferably, a non-aligned state is created at at least a part of the interface adjacent to magnetoresistive layer 20, and second antiferromagnetic layer 15 is formed of an antiferromagnetic material having a composition approximating an ideal composition for facilitating transformation from the disordered lattice structure into an ordered lattice structure upon heat-treatment. The composition ratios of the element X or the elements X+X' in first antiferromagnetic layer 14 and second antiferromagnetic layer 15, as well as the thicknesses of these antiferromagnetic layers, are the same as those described above with reference to FIG. 2.

As a result of heat-treatment, the exchange bias layer 21 is properly transformed from the disordered lattice structure into an ordered lattice structure, while the non-aligned state is maintained at the interface adjacent to magnetoresistive layer 20. As a result, an exchange coupling magnetic field is produced at the interface between exchange bias layer 21 and magnetoresistive layer 20.

Since the first antiferromagnetic layer 14 is formed of a suitable material free from the influence of the restraint force produced by the crystalline structure of magnetoresistive layer 20 at the interface adjacent to layer 20, and since the second antiferromagnetic layer 15 is formed from a material having a composition approximating an ideal composition for facilitating transformation from a disordered lattice structure into an ordered lattice structure, the transformation from a disordered lattice structure into an ordered lattice structure is properly effected by heat-treatment, while a non-aligned state is maintained between antiferromagnetic layer 4 and magnetoresistive layer 20. As a result, a greater exchange coupling magnetic field than in conventional devices can be obtained. Specifically, an exchange coupling magnetic field of $7.9 \times 10^4$ A/m or greater is expected in accordance with the present invention.

In the deposition process, exchange bias layer 21 may be formed of a three-layered structure as in the embodiment described above with reference to FIG. 4. A first antiferromagnetic layer 23 is formed on magnetoresistive layer 20. A second antiferromagnetic layer 24 and a third antiferromagnetic layer 25 are deposited sequentially to overlie first antiferromagnetic layer 23. The composition ratio of the element X or the elements X+X' is determined to be smaller in the second antiferromagnetic layer 24 than in the first and third antiferromagnetic elements 23 and 25. Preferably, a non-aligned state is created at least a part of the interface between first antiferromagnetic layer 23 and magnetoresistive layer 20. Alternatively, both layers facing this interface are made to have different lattice constants or different crystal orientations at the interface.

When heat-treatment is effected on the exchange bias layer 21 thus formed, transformation into an ordered lattice structure is commenced in second antiferromagnetic layer 24, followed by transformation into ordered lattice structures in first antiferromagnetic layer 23 and third antiferromagnetic layer 25 due to diffusions of compositions. Consequently, the heat-treated exchange bias layer 21 has a region in which the ratio of atomic percent of the element X to Mn increases towards magnetoresistive layer 20 starting from a thicknesswise central portion of exchange bias layer 21, and a region in which the ratio of atomic percent of the element X to Mn increases in the direction away from magnetoresistive layer 20 starting from the above-mentioned thicknesswise central portion.

Requirements concerning the compositions of the first through third antiferromagnetic layers 23, 24 and 25 are the same as described above with reference to FIG. 4. The composition and thickness of exchange bias layer 21 after heat-treatment are the same as those of antiferromagnetic layer 4 shown in FIG. 5.

This embodiment also can employ a seed layer 22. In particular, the use of the seed layer 22 in the structure shown in FIG. 15 is preferred. When exchange bias layer 21 is formed on the lower side of magnetoresistive layer 20, seed layer 22 is formed on the lower side of exchange bias layer 21. The structure shown in FIG. 14 also may employ seed layer 22. In such a case, seed layer 22 is formed on the upper side of exchange bias layer 21. The use of such a seed layer 22 enhances the ratio of resistance variation. Requirements regarding the crystalline structure and material of seed layer 22, as well as the material, composition and film thickness of the exchange bias layer 21, are the same as those shown in FIGS. 4 and 5.

In each of the AMR devices shown in FIGS. 14 and 15, the regions E of magnetoresistive layer 20 are formed into a single magnetic domain in the X direction, due to the effect of the exchange coupling magnetic field produced at the interface between exchange bias layer 21, 21 and magnetoresistive layer 20. This causes the magnetization of the region D of magnetoresistive layer 20 to be aligned in the X direction. A magnetic field which is produced when a sense current flows through magnetoresistive layer 20 is applied to soft magnetic layer 18, so that a lateral bias magnetic field Y is applied to the region D of magnetoresistive layer 20 by the static magnetic coupling energy produced by soft magnetic layer 18. Thus, the lateral magnetic field is applied to the region D of the magnetoresistive layer 20 that has been formed into a single magnetic domain in the X direction. As a result, the region D of magnetoresistive layer 20 exhibits a linear change of resistance in response to a change in magnetic field, thus achieving linear magnetoresistive characteristics (i.e., a linear H-R effect characteristic).

A recording medium moves in the direction Z, so that a magnetic field leaking in the Y direction causes a change in the electrical resistance in the region D of magnetoresistive layer 20. Such a change is sensed as a change in voltage.

Figure 16:
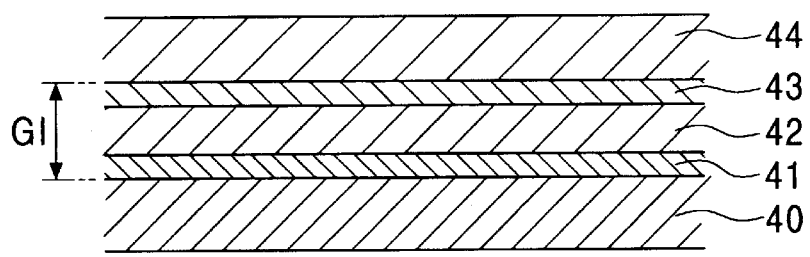
FIG. 16 is a fragmentary sectional view of a thin-film magnetic head (reproduction head) in accord with the present invention.

FIG. 16 is a sectional view of the structure of a reading head having any of the magnetoresistive sensors described heretofore with reference to FIGS. 1 to 11, as viewed from the surface opposing the recording medium.

Numeral 40 designates a lower shield layer formed of, for example, a Ni—Fe alloy, and overlain by a lower gap layer 41. A magnetoresistive sensor 42, which may be any one of those described heretofore with reference to FIGS. 1 to 15, is formed on the lower gap layer 41. The magnetoresistive sensor 42 is overlain by an upper gap layer 43 formed thereon. An upper shield layer 44 formed, for example, of a Ni—Fe alloy is formed on the upper gap layer 43.

The lower gap layer 41 and the upper gap layer 43 are formed of an insulating material such as $SiO_2$ or $Al_2O_3$ (alumina). The length between the extremities of the lower gap layer 41 and upper gap layer 43, as shown in FIG. 16, is the gap length Gl. The reading head with a smaller gap length Gl can be used at higher recording density.

As described above, the present invention makes it possible to achieve a large exchange coupling magnetic field, even with a reduced thickness of antiferromagnetic layer 4. It is therefore possible to reduce the thickness of the magnetoresistive sensor as compared with conventional devices and, therefore, to produce a thin-film magnetic head which has a narrower gap to cope with the demand for higher recording density.

EXAMPLES

Figure 20:
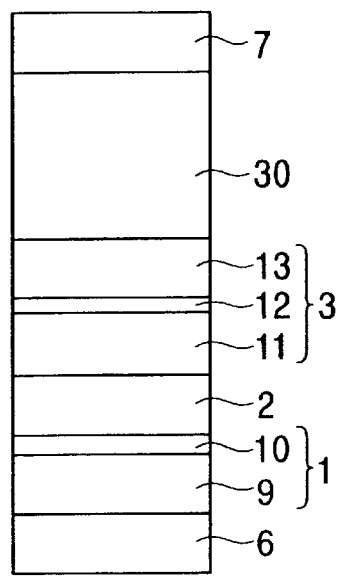
FIG. 20 is a schematic illustration a conventional single-spin valve type magnetoresistive sensor.

The following laminate structures were formed by deposition. Samples were prepared in which the antiferromagnetic layer 4 was formed by depositing two layers (first antiferromagnetic layer 14 and second antiferromagnetic layer 15) having different composition ratios as in FIG. 2 (Examples), in which the antiferromagnetic layer 30 was deposited to have a single layer, as shown in FIG. 20 (Comparative Examples). The samples were then subjected to heat-treatments conducted under the same conditions, and the exchange coupling magnetic field (Hex) and ratio of resistance variation ($\Delta$MR) were then measured. The heat-treatment was conducted for more than 2 hours at temperatures not lower than 200° C.

Example 1

The laminate structure was composed of the following layers, from the bottom up:
Underlying layer 6: Ta(50)
Free magnetic layer 1: [$Ni_{80}Fe_{20}$(45)/Co(5)]
Non-magnetic intermediate layer 2: Cu(25)
Pinned magnetic layer 3: [Co(20)/Ru(8)/Co(15)]
First antiferromagnetic layer 14: $Pt_{58}Mn_{42}$ (10)
Second antiferromagnetic layer: $Pt_{50}Mn_{50}$(110)
Protective layer 7: Ta(30)

Comparative Example 1

Underlying layer 6: Ta(50)
Free magnetic layer 1: [$Ni_{80}Fe_{20}$(45)/Co(5)]
Non-magnetic intermediate layer 2: Cu(25)
Pinned magnetic layer 3: [Co(20)/Ru(8)/Co(15)]
Antiferromagnetic layer 30: $Pt_{50}Mn_{50}$(120)
protective layer 7: Ta(30)

Comparative Example 2

Underlying layer 6: Ta(50)
Free magnetic layer 1: [$Ni_{80}Fe_{20}$(45)/Co(5)]

Non-magnetic intermediate layer 2: Cu(25)
Pinned magnetic layer 3: [Co(20)/Ru(8)/Co(15)]
Antiferromagnetic layer 30: $Pt_{46}Mn_{54}(120)$
Protective layer 7: Ta(30)

Comparative Example 3

Underlying layer 6: Ta(50)
Free magnetic layer 1: [$Ni_{80}Fe_{20}$(45)/Co(5)]
Non-magnetic intermediate layer 2: Cu(25)
Pinned magnetic layer 3: [Co(20)/Ru(8)/Co(15)]
Antiferromagnetic layer 30: $Pt_{50}Mn_{50}(120)$
Protective layer 7: Ta(30)

Comparative Example 4

Underlying layer 6: Ta(50)
Free magnetic layer 1: [$Ni_{80}Fe_{20}$(45)/Co(5)]
Non-magnetic intermediate layer 2: Cu(25)
Pinned magnetic layer 3: [Co(20)/Ru(8)/Co(15)]
Antiferromagnetic layer 30: $Pt_{52}Mn_{48}(X)$
Protective layer 7: Ta(30)

Values in parentheses indicate the layer thickness in Angstroms. The suffixes in the representations of Ni—Fe alloys and Pt—Mn alloys represent composition ratios in terms of at %.

Thus, all the samples had the same laminate structure, except for the structure of the antiferromagnetic layer. The thickness of the antiferromagnetic layers was 120 Å in all samples. In Example 1, this thickness is the sum of the thicknesses of first antiferromagnetic layer 14 and second antiferromagnetic layer 15.

the antiferromagnetic layer contacting the interface with the pinned magnetic layer was 58 at %, whereas the Pt content was smaller in each of the other samples, leading to the above-described results.

With regards to "Hex" which represents the exchange coupling magnetic field, Example 1 showed a very large exchange coupling magnetic field of $17.4 \times 10^4$ A/m, while the Comparative Examples showed much smaller values of exchange coupling magnetic field. In Comparative Examples 3 and 4, the values of the exchange coupling magnetic fields were greater than those in Comparative Examples 1 and 2, but were much smaller than that obtained with Example 1.

In order to obtain a large exchange coupling magnetic field, it is necessary that the antiferromagnetic layer is formed of a Pt—Mn alloy having a composition that approximates an ideal composition for facilitating transformation from a disordered lattice structure into an ordered lattice structure upon heat-treatment. The ideal composition herein refers to $Pt_{50}Mn_{50}$.

The use of the ideal composition alone is still insufficient. It is also important that the interface adjacent to the pinned magnetic layer is held in a non-aligned state. An aligned state of the interface impedes proper transformation of the antiferromagnetic layer during heat-treatment, due to the restraint force produced by the crystalline structure of the pinned magnetic layer.

Example 1 alone simultaneously met these two conditions. More specifically, in Example 1, the interface between the first antiferromagnetic layer and the pinned magnetic layer was held in the non-aligned state in the as-deposited state before heat-treatment, while the second antiferromagnetic layer had the ideal composition. In contrast, in Comparative example 1, antiferromagnetic properties could

TABLE 1

|  | Example 1 | Comp. Ex. 1 | Comp. Ex. 2 | Comp. Ex. 3 | Comp. Ex. 4 |
| --- | --- | --- | --- | --- | --- |
| Interface with ferro-magnetic layer | Non-alignment very strong | Non-alignment very strong | Non-alignment strong | Non-alignment weak | Non-alignment very strong |
| (Hex) | $17.4 \times 10^4$ A/m | $1.2 \times 10^4$ A/m | $0.79 \times 10^4$ A/m | $6.48 \times 10^4$ A/m | $8.37 \times 10^4$ A/m |
| Resistance variation ratio | 8.3% | 5.5% | 5.0% | 8.0% | 8.1% |
| Features of PtMn | With strong non-aligned state, bulk ideal composition (Pt50-Mn50) is used for 90% of more. | Non-aligned state is very strong advantageously, but antiferromagnetic properties can hardly be obtained due to too high a Pt content. | Antiferromagnetic properties can hardly be obtained due to strong non-alignment and due to small a Pt content. | Unsatisfactory due to weak non-alignment, although ideal bulk composition was used. | The non-aligned state was held rather strong, and composition approximates bulk ideal composition. Best composition among samples of single-layered type. |

Table 1 shows the results of experiments performed on samples after heat-treatment. With regards to "Interface with Ferromagnetic layer", both Example 1 and Comparative Example 1 had a very strong state of non-alignment, whereas Comparative Examples 2 and 3 showed greater tendencies towards alignment. In Comparative Example 4, the non-aligned state was not very strong.

In order to obtain a non-aligned interface structure, it is necessary to increase the Pt content in the Pt—Mn alloy. In Example 1 and Comparative Example 1, the Pt content of hardly be obtained despite heat-treatment, because the composition deviated from the ideal composition due to too large a Pt content even though the interface adjacent to the pinned magnetic layer was held in a non-aligned state. In Comparative example 2, antiferromagnetic properties could hardly be obtained despite heat-treatment, because the composition deviated from the ideal composition due to too small a Pt content, and due to the aligned state at the interface adjacent to the pinned magnetic layer. In the case of Comparative Example 3, a transformation from disordered lattice structure into an ordered lattice structure could hardly occur despite heat-treatment, due to the aligned state at the interface adjacent to the pinned magnetic layer, even though the ideal composition was employed. Comparative Example 4 employed a composition approximating the ideal composition and had the interface adjacent to the pinned magnetic layer which was comparatively easy to maintain in the non-aligned state. This Comparative example produced an exchange coupling magnetic field which is the greatest of all the other Comparative Examples but is still smaller than that of Example 1, due to the large Pt content and due to the non-aligned state which is not very strong.

In accordance with the present invention, transformation from a disordered lattice structure into an ordered lattice structure caused by heat-treatment was properly performed without losing the non-aligned state at the interface. This resulted from the facts that the antiferromagnetic layer as deposited had a first antiferromagnetic layer 14 facing the interface adjacent to the pinned magnetic layer, a composition was used in which it was easy to create the non-aligned state, and a second antiferromagnetic layer 15 had a composition approximating the ideal composition and formed on the pinned magnetic layer with first antiferromagnetic layer 14 intervening therebetween. Thus, a greater exchange coupling magnetic field than those of conventional devices was achieved. The data in the item "Resistance variation ratio" also shows the superiority of Example 1 to the Comparative examples.

Figure 17:
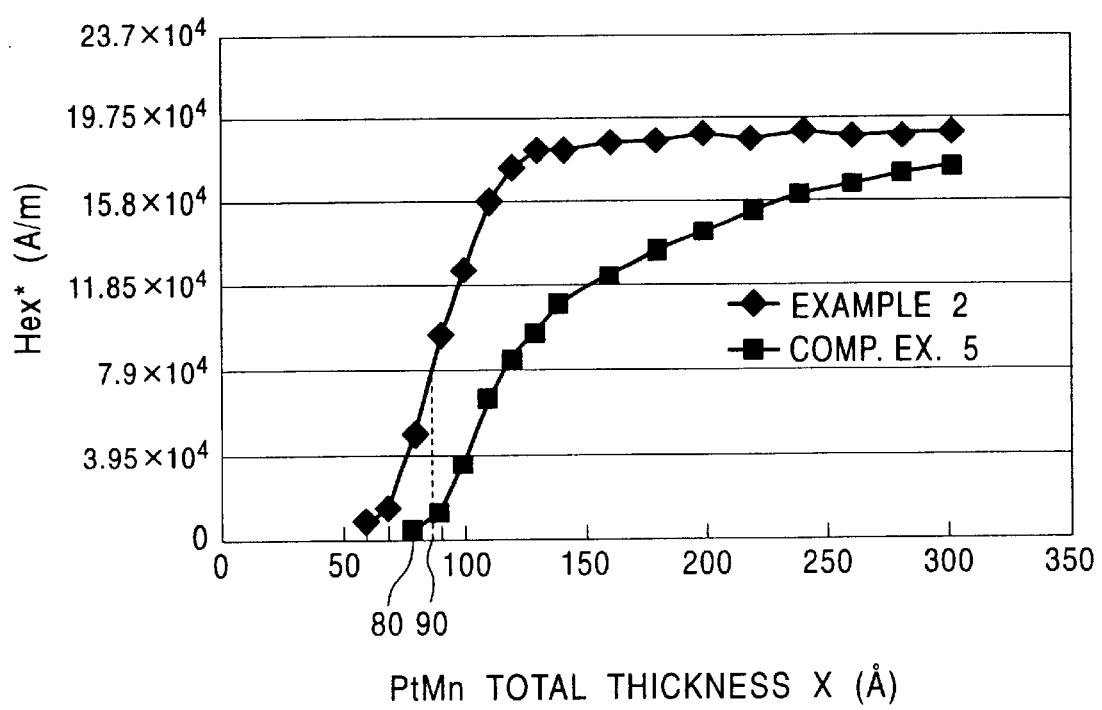
FIG. 17 is a graph showing the relationship between exchange coupling magnetic field (Hex) and total film thickness of an antiferromagnetic layer formed from a first antiferromagnetic layer and a second antiferromagnetic layer.

Then, the relationship between the total film thickness of the antiferromagnetic layer and the exchange coupling magnetic field (Hex) was examined (see FIG. 17). The following two samples in the as-deposited state (prior to heat-treatment) were prepared. The structure of Example 2 was the same as that shown in FIG. 2, while the structure of Comparative Example 5 was the same as that shown in FIG. 20.

Example 2

The laminate structure was composed of the following layers, from the bottom up:

Underlying layer 6: Ta(50)
Free magnetic layer 1: [$Ni_{80}Fe_{20}$(45)/Co(5)]
Non-magnetic intermediate layer 2: Cu(25)
Pinned magnetic layer 3: [Co(20)/Ru(8)/Co(15)]
First antiferromagnetic layer 14: $Pt_{58}Mn_{42}$(10)
Second antiferromagnetic layer: $Pt_{50}Mn_{50}$(X-10)
Protective layer 7: Ta(30)

Comparative Example 5

Underlying layer 6: Ta (50)
Free magnetic layer 1: [$Ni_{80}Fe_{20}$(45)/Co(5)]
Non-magnetic intermediate layer 2: Cu(25)
Pinned magnetic layer 3: [Co(20)/Ru(8)/Co(15)]
Antiferromagnetic layer 30: $Pt_{52}Mn_{48}$(X)
Protective layer 7: Ta(30)

Values in parentheses indicate layer thickness in Angstroms. The suffixes in the representations of Ni—Fe alloys and Pt—Mn alloys represent composition ratios in terms of at %.

In Example 2, the thickness of the first antiferromagnetic layer 14 was fixed at 10 Å, while the thickness of the second antiferromagnetic layer 15 was varied.

These samples were heat-treated and were subjected to measurement of the exchange coupling magnetic field (Hex). It will be seen that a greater total thickness of the Pt—Mn alloy layer provides a greater exchange coupling magnetic field, both in Example 2 and Comparative Example 5, as shown in FIG. 17.

When the total thickness of the Pt—Mn layer was increased, (i.e., when the thickness of the second antiferromagnetic layer 15 was increased), Example 2 of the invention showed a drastic increase in the exchange coupling magnetic field compared with that of Comparative Example 5. An exchange coupling magnetic field as large as $7.9 \times 10^4$ A/m or greater was provided when the total thickness reached and exceeded 80 Å.

An exchange coupling magnetic field of $7.9 \times 10^4$ A/m or greater was also obtainable with Comparative Example 5 when the thickness of the antiferromagnetic layer exceeded about 120 Å, suggesting that a greater thickness of antiferromagnetic layer 30 than in Example 2 was required for achieving the same exchange coupling magnetic field as produced in Example 2.

This experiment also shows that when the antiferromagnetic layer 4 is formed by depositing two layers, first antiferromagnetic layer 14 and second antiferromagnetic layer 15, as in Example 2, the second antiferromagnetic layer 15 that is formed by an antiferromagnetic material having a composition approximating the ideal composition for facilitating transformation from a disordered lattice structure into an ordered lattice structure should have a thickness greater than a predetermined thickness.

In accordance with the present invention, it is understood from the experiment results shown in FIG. 17 that a large exchange coupling magnetic field of $7.9 \times 10^4$ A/m or greater is obtainable when the total thickness of the antiferromagnetic layer is determined to be 80 Å or greater. Since the thickness of first antiferromagnetic layer 14 is 10 Å in this case, the thickness of second antiferromagnetic layer 15 is determined to be 70 Å or greater.

Figure 18:
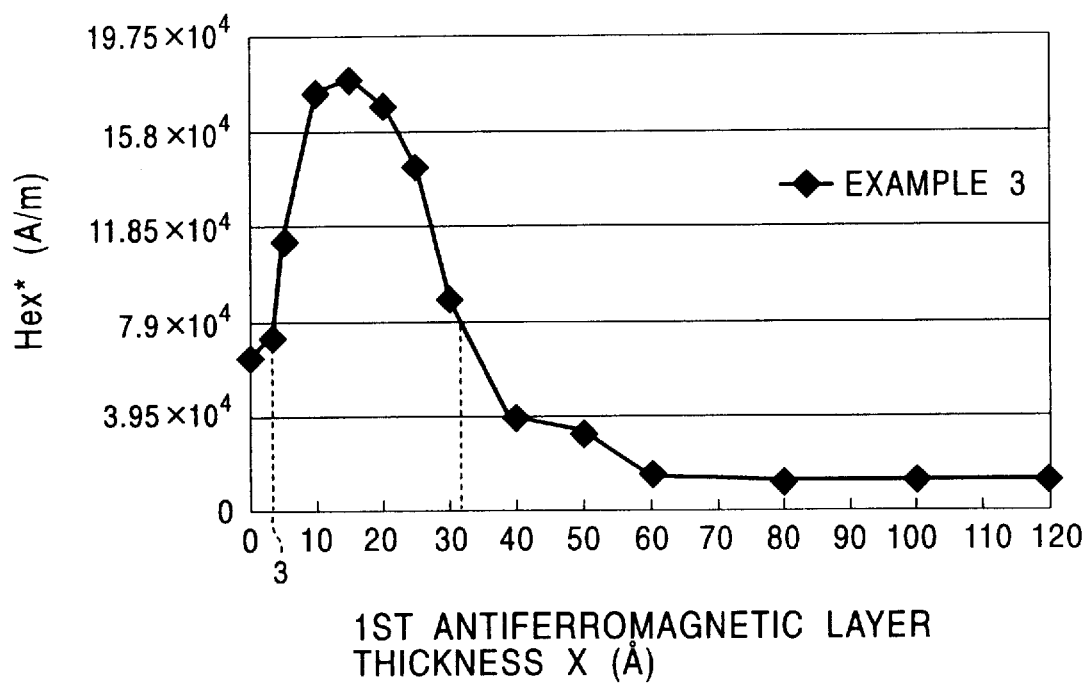
FIG. 18 is a graph showing the relationship between exchange coupling magnetic field (Hex), and the thickness of a first antiferromagnetic layer which, together with a second antiferromagnetic layer, forms an antiferromagnetic layer.

Then, the relationship was examined between thickness of the first antiferromagnetic layer and the exchange coupling magnetic field (Hex) in the structure in which the antiferromagnetic layer as deposited is composed of first antiferromagnetic layer 14 and second antiferromagnetic layer 15 (FIG. 18). The laminate structure used in this experiment was the same as that shown in FIG. 2.

Example 3

The laminate structure was composed of the following layers, from the bottom up:

Underlying layer 6: Ta(50)
Free magnetic layer 1: [$Ni_{80}Fe_{20}$(45)/Co(5)]
Non-magnetic intermediate layer 2: Cu(25)
Pinned magnetic layer 3: [Co(20)/Ru(8)/Co(15)]
First antiferromagnetic layer 14: $Pt_{58}Mn_{42}$(X)
Second antiferromagnetic layer: $Pt_{50}Mn_{50}$(120-X)
Protective layer 7: Ta(30)

Values in parentheses indicate the layer thickness in Angstroms. The suffixes in the representations of Ni—Fe alloys and Pt—Mn alloys represent composition ratios in terms of at %.

A plurality of samples having different thicknesses of first antiferromagnetic layer 14 were prepared and heat-treated, and the exchange coupling magnetic field was measured on each. From FIG. 18, it is understood that the exchange coupling magnetic field of $7.9 \times 10^4$ A/m or greater was obtainable when the thickness X of the first antiferromagnetic layer 14 ranged from 3 Å to 30 Å.

The first antiferromagnetic layer 14 had a large Pt content, in order to maintain the required non-aligned state at the interface adjacent to pinned magnetic layer 3. For instance, the Pt content was as large as 58 at % in the Example. A composition having such a high Pt content is not easy to transform from a disordered lattice structure into an ordered lattice structure when heat-treated. Therefore, such compositions can hardly exhibit antiferromagnetic properties, even though it effectively maintains the above-mentioned non-aligned state. Therefore, too large a thickness of the first antiferromagnetic layer 14 increases the ratio of the region which is hard to transform. As will be clearly seen from the experiment results shown in FIG. 18, this incurs a serious reduction in the exchange coupling magnetic field.

In contrast, the thickness of the first antiferromagnetic layer 14 ranging from 3 Å to 30 Å provides a large exchange coupling magnetic field, possibly for the reason that a diffusion of compositions takes place between first antiferromagnetic layer 14 and second antiferromagnetic layer 15 which is inherently easy to transform, throughout the whole thickness region of first antiferromagnetic layer 14 when the thickness of first antiferromagnetic layer 14 falls within the above-specified range. This diffusion causes the Pt content to be decreased in first antiferromagnetic layer 14 from that obtained in the as-deposited state, so that first antiferromagnetic layer 14 becomes easier to transform and a large exchange coupling magnetic field is provided.

Thus, in order to obtain a large exchange coupling magnetic field in accordance with the present invention, it is necessary that second antiferromagnetic layer 15—made of an antiferromagnetic material approximating an ideal composition which is easy to transform from a disordered lattice structure into an ordered lattice structure—is deposited to have a thickness of 70 Å or greater, as explained above with reference to FIG. 17, and that first antiferromagnetic layer 14, which has a high Pt content to maintain the non-aligned state at the interface adjacent to pinned magnetic layer—is deposited to have a thickness ranging from 3 Å to 30 Å, as explained above with reference to FIG. 18.

Thus, the exchange coupling magnetic field of $7.9 \times 10^4$ A/m or greater is obtainable when the thickness of the first antiferromagnetic layer 14 is set to be 3 Å or greater and the thickness of the second antiferromagnetic layer 15 is set to be 70 Å or greater, thus providing a total thickness of antiferromagnetic layer 4 of 73 Å. Based on the results of the experiment, in accordance with the present invention, the thickness of antiferromagnetic layer 4 after heat-treatment is set to be 73 Å or greater.

Thus, in accordance with the present invention, the minimum thickness required for antiferromagnetic layer 4 is 73 Å or greater, so that the thickness of the antiferromagnetic layer can be reduced compared with that in conventional devices, thus meeting the demand for narrower gaps.

Figure 19:
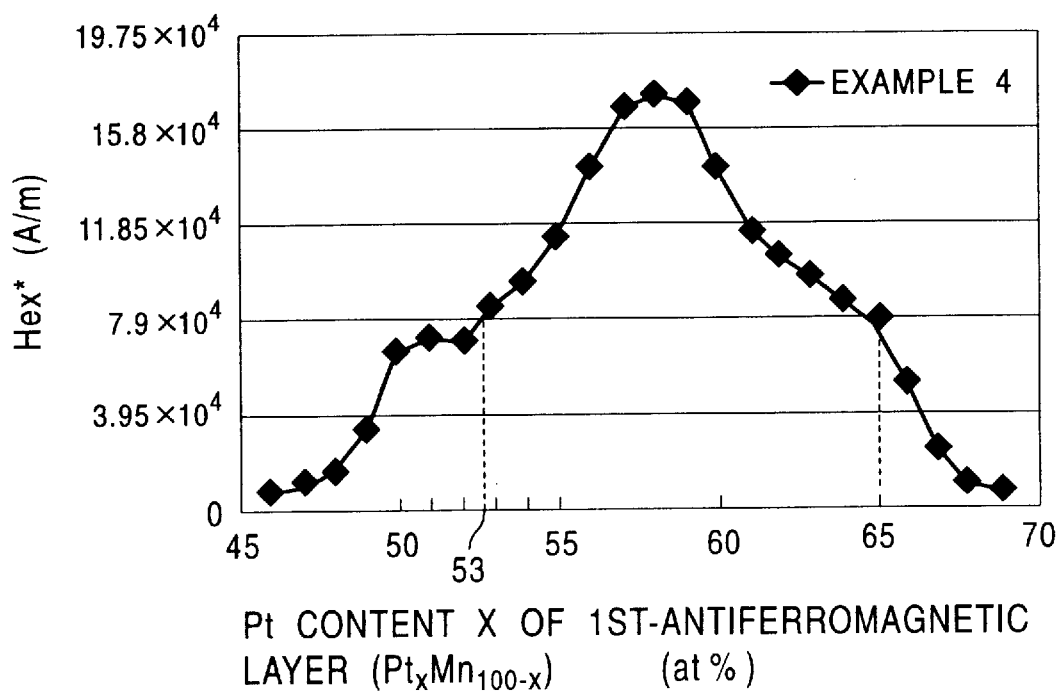
FIG. 19 is a graph showing the relationship between Pt content (x) and exchange coupling magnetic field (Hex) in a structure having an antiferromagnetic layer composed of a first antiferromagnetic layer and a second antiferromagnetic layer, the first antiferromagnetic layer having a composition expressed by $Pt_xMn_{100-x}$.

Next, the relationship was examined between the composition ratio of the first antiferromagnetic layer and the exchange coupling magnetic field (Hex) in the structure in which the antiferromagnetic layer as deposited is composed of first antiferromagnetic layer 14 and second antiferromagnetic layer 15 (FIG. 19). The laminate structure used in this experiment was the same as that shown in FIG. 2.

Example 4

The laminate structure was composed of the following layers, from the bottom up:

Underlying layer 6: Ta(50)
Free magnetic layer 1: [$Ni_{80}Fe_{20}$(45)/Co(5)]
Non-magnetic intermediate layer 2: Cu(25)
Pinned magnetic layer 3: [Co(20)/Ru(8)/Co(15)]
First antiferromagnetic layer 14: $Pt_{(X)}Mn_{(100-X)}$(10)
Second antiferromagnetic layer: $Pt_{50}Mn_{50}$(120-X)
Protective layer 7: Ta(30)

Values in parentheses indicate the layer thickness in Angstroms. The suffixes in the representations of Ni—Fe alloys and Pt—Mn alloys represent composition ratios in terms of at %.

A plurality of samples having different compositions of first antiferromagnetic layer 14 were prepared and heat-treated, and the exchange coupling magnetic field (Hex) was measured on each. The heat-treatment was conducted for more than 2 hours at temperatures not lower than 200° C. From FIG. 19, it is understood that the exchange coupling magnetic field of $7.9 \times 10^4$ A/m or greater is obtainable when the Pt content of the first antiferromagnetic layer 14 is not less than 53 at % and not greater than 65 at %.

A Pt content of first antiferromagnetic layer 14 ranging from 53 at % to 65 at % can adequately create a non-aligned state at the interface between first antiferromagnetic layer 14 and pinned magnetic layer 3. This is the reason why the large exchange coupling magnetic field is obtained.

It is understood, however, that the exchange coupling magnetic field starts to decrease when the Pt content exceeds 65 at %. It is considered that, when the first antiferromagnetic layer 14 as deposited contains such a large amount of Pt, the Pt content in the first antiferromagnetic layer is not decreased to such a level as to enable a proper transformation in the first antiferromagnetic layer 14, despite any diffusion of compositions between first antiferromagnetic layer 14 and second antiferromagnetic layer 15 caused upon heat-treatment. As a result, the exchange coupling magnetic field is reduced.

It is understood that a large exchange coupling magnetic field, specifically $11.85 \times 10^4$ A/m or greater, is obtainable when the Pt content is determined to be not less than 55 at % and not greater than 60 at %. A Pt content less than 53 at % causes a reduction in the exchange coupling magnetic field. Such a small Pt content makes the lattice constant of antiferromagnetic layer 4 approach that of pinned magnetic layer 3, so as to make it difficult to create the required non-aligned state.

Next, in accordance with the present invention, an experiment was conducted using samples prepared in Example 5, in which the antiferromagnetic layer 4 was deposited by a different method, and exchange coupling magnetic fields (Hex) after heat-treatment.

The materials and thicknesses of the layers other than antiferromagnetic layer 4 were the same as in Examples 1 to 3. In this experiment, the antiferromagnetic layer 4 in each sample was deposited on pinned magnetic layer 3 using a target formed of a Pt—Mn alloy, while the sputtering gas pressure was progressively changed from low to high. A measurement of the composition ratio along the thickness of antiferromagnetic layer 4 proved that a composition $Pt_{58}Mn_{42}$ was developed at the region near the interface adjacent to pinned magnetic layer 3, and that the Pt content progressively decreased in the direction away from the interface to develop a composition $Pt_{48}Mn_{52}$ in the region near the side of antiferromagnetic layer 4 opposite to the interface.

A laminate structure having an antiferromagnetic layer 30 was prepared in Comparative Example 5, the whole structure of antiferromagnetic layer 30 having a composition $Pt_{52}Mn_{48}$. Materials and thicknesses of the layers other than antiferromagnetic layer 30 were the same as in Comparative Examples 1 to 4.

Samples deposited in accordance with Example 5 and Comparative Example 5 were subjected to heat-treatment and subsequent measurement of the exchange coupling magnetic field. The results are shown in Table 2. The heat-treatment was conducted for more than 2 hours at temperatures not lower than 200° C.

TABLE 2

|  | Example 5 | Comp. Ex. 5 |
|---|---|---|
| Interface with ferro-magnetic layer | Non-alignment very strong | Non-alignment very strong |
| (Hex) | 16.43 × 10⁴A/m | 8.37 × 10⁴A/m |
| Resistance variation ratio | 8.4% | 8.1% |
| Features of PtMn | Composition modulation was effected while maintaining a very strong non-aligned state, so that most of film was constituted by composition approximating the ideal composition. | The non-aligned state was held rather strong, and composition approximates bulk ideal composition. Best composition among samples of single-layered type. |

With regards to "Interface with ferromagnetic layer," the non-aligned state in Example 5 was strongly held in the interface structure between antiferromagnetic layer 4 and pinned magnetic layer 3. In Comparative Example 5, the non-aligned state was not as strong as in Example 5, although this Comparative Example employed a composition which facilitated creation of the non-aligned state.

There was no significant difference in the resistance variation ratio (ΔMR) between Example 5 and Comparative Example 5.

A major difference between Example 5 and Comparative example 5 is that the former exhibited an exchange coupling magnetic field (Hex) two times as large as that of the latter.

Example 5 showed such a large exchange coupling magnetic field due to proper transformation of the antiferromagnetic layer 4. This was afforded by the high Pt content ($Pt_{58}Mn_{42}$) of antiferromagnetic layer 4 at the interface adjacent to the pinned magnetic layer. The non-aligned state is properly maintained at that interface, and by the composition modulation in the thicknesswise direction of antiferromagnetic layer 4, executed such that most of antiferromagnetic layer 4 was constituted by compositions approximating the ideal composition for facilitating transformation from a disordered lattice structure into a lattice structure upon heat-treatment.

Next, in accordance with the invention, samples were prepared in Example 6 in which antiferromagnetic layer 4 of a so-called dual-spin valve type magnetoresistive sensor was deposited to have a laminate structure composed of a first antiferromagnetic layer 14 and a second antiferromagnetic layer 15. Samples were also prepared in Comparative Example 6 in which the antiferromagnetic layer was composed of a single layer. Exchange coupling magnetic fields were measured on these samples.

Example 6

The laminate structure was composed of the following layers, from the bottom layer up:
Second antiferromagnetic layer: $Pt_{50}Mn_{50}(83)$
First antiferromagnetic layer 14: $Pt_{58}Mn_{42}(7)$
Pinned magnetic layer 3: [Co(15)/Ru(8)/Co(20)]
Non-magnetic intermediate layer 2: Cu(22)
Free magnetic layer 1: Co(20)
Non-magnetic intermediate layer 2: Cu(22)
Pinned magnetic layer 3: [Co(20)/Ru(8)/Co(15)]
First antiferromagnetic layer 14: $Pt_{58}Mn_{42}(7)$
Second antiferromagnetic layer: $Pt_{50}Mn_{50}(83)$
Protective layer 7: Ta(10)

Comparative Example 6

The laminate structure had the following layers from the bottom layer up:
Antiferromagnetic layer 30: $Pt_{50}Mn_{50}(90)$
Pinned magnetic layer 3: [Co(15)/Ru(8)/Co(20)]
Non-magnetic intermediate layer 2: Cu(22)
Free magnetic layer 1: Co (20)/
Non-magnetic intermediate layer 2: Cu(22)
Pinned magnetic layer 3: [Co(20)/Ru(8)/Co(15)]
Antiferromagnetic layer 30: $Pt_{50}Mn_{50}(90)$
Protective layer 7: Ta(10)

Values in parentheses indicate the layer thickness in Angstroms. The suffixes in the representations of Ni—Fe alloys and Pt—Mn alloys represent composition ratios in terms of at %.

The samples of Example 6 and Comparative Example 6 as deposited were subjected to heat-treatment and then to measurement of the exchange coupling magnetic field. The results are shown in Table 3. The heat-treatment was conducted for more than 2 hours at temperatures not lower than 200° C.

TABLE 3

|  | Example 6 | Comp. Ex. 6 |
|---|---|---|
| Interface with ferro-magnetic layer | Non-alignment very strong | Non-alignment very strong |
| (Hex) | 15.96 × 10⁴A/m | 10.59 × 10⁴A/m |
| Resistance variation ratio | 140% | 13.4% |
| Features of PtMn | With strong non-aligned state, bulk ideal composition (Pt50-Mn50) is used for 90% of more. | The non-aligned state was held rather strong, and composition approximates bulk ideal composition. Best composition among samples of single-layered type. |

With regards to "Interface with ferromagnetic layer," the non-aligned state in Example 6 was strongly held in the interface structure between antiferromagnetic layer 4 and pinned magnetic layer 3. In Comparative Example 6, the non-aligned state was not as strong as in Example 6, although this Comparative Example employed a composition which facilitated creation of the non-aligned state.

There was no significant difference in the resistance variation ratio (ΔMR) between Example 6 and Comparative Example 6.

A major difference between Example 6 and Comparative example 6 is that the former exhibited an exchange coupling magnetic field (Hex) much greater than that of the latter.

Example 6 showed such a large exchange coupling magnetic field due to the fact that the transformation from the disordered lattice structure into the ordered lattice structure was properly effected by heat-treatment, while the non-aligned state was maintained. This, in turn, is due to the fact that the interface adjacent to the pinned magnetic layer was held in the non-aligned state due to the formation of the first antiferromagnetic layer 14 and because second antiferromagnetic layer 15, having an ideal composition for facilitating transformation upon heat-treatment, was formed on pinned magnetic layer 3 through the first antiferromagnetic layer.

Figure 21:
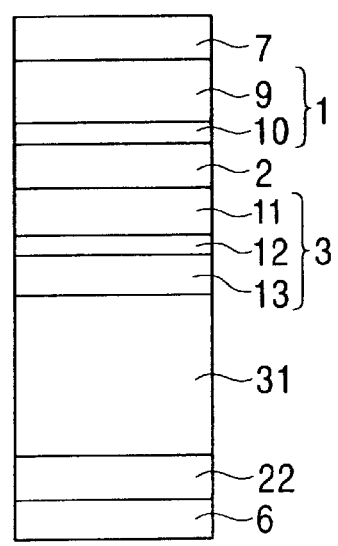
FIG. 21 is a schematic illustration of a conventional experimental single-spin valve type magnetoresistive sensor having a seed layer.

Next, in accordance with the present invention, four types of laminate structures each having a seed layer 22 explained above with reference to FIG. 4 were prepared, including two types of samples (Example 7 and Example 8) in which the interface adjacent to the seed layer was held in a non-aligned state, and two types of samples (Comparative Example 7 and Comparative Example 8) in which the interface adjacent to seed layer 22 was held in an aligned state. These samples were subjected to heat-treatment and subsequent measurement of the exchange coupling magnetic field (Hex) and resistance variation ratio (ΔMR). The structures of Examples 7 and 8 were the same as that shown in FIG. 8, while the structures of Comparative Examples 7 and 8 were the same as that shown in FIG. 21.

Example 7

The laminate structure had the following layers, from the bottom up:

Underlying layer 6: Ta(50)
Seed layer 22: $Ni_{80}Fe_{20}(30)$
Antiferromagnetic layer 4[third antiferromagnetic layer 25]: $Pt_{58}Mn_{42}(10)$
Second antiferromagnetic layer 24: $Pt_{50}Mn_{50}(100)$
First antiferromagnetic layer 23: $Pt_{58}Mn_{42}(10)$]
Pinned magnetic layer 3[Co(15)/Ru(8)/Co(20)]
Non-magnetic intermediate layer 2: Cu(22)
Free magnetic layer 1[Co(5)/$Ni_{80}Fe_{20}$(45)]
Protective layer 7: Ta(30)

Example 8

The laminate structure had the following layers, from the bottom up:

Underlying layer 6: Ta(50)
Seed layer 22: $Ni_{60}Fe_{10}Cr_{30}(30)$
Antiferromagnetic layer 4[third antiferromagnetic layer 25]: $Pt_{58}Mn_{42}(10)$
Second antiferromagnetic layer 24: $Pt_{50}Mn_{50}(100)$
First antiferromagnetic layer 23: $Pt_{58}Mn_{42}(10)$]
Pinned magnetic layer 3[Co(15)/Ru(8)/Co(20)]
Non-magnetic intermediate layer 2: Cu(22)
Free magnetic layer 1[Co(5)/$Ni_{80}Fe_{20}$(45)]
Protective layer 7: Ta(30)

Comparative Example 7

The laminate structure had the following layers, from the bottom layer up:

Underlying layer 6: Ta(50)
Seed layer 22: $Ni_{80}Fe_{20}(30)$
Antiferromagnetic layer 31: $Pt_{50}Mn_{50}(120)$
Pinned magnetic layer 3[Co(15)/Ru(8)/Co(20)]
Non-magnetic intermediate layer 2: Cu(22)
Free magnetic layer 1[Co(5)/$Ni_{80}Fe_{20}$(45)]
Protective layer 7: Ta(30)

Comparative Example 8

The laminate structure had the following layers, from the bottom up:

Underlying layer 6: Ta(50)
Seed layer 22: $Ni_{80}Fe_{20}(30)$
Antiferromagnetic layer 31: $Pt_{50}Mn_{50}(120)$
Pinned magnetic layer 3[Co(15)/Ru(8)/Co(20)]
Non-magnetic intermediate layer 2: Cu(22)
Free magnetic layer 1[Co(5)/$Ni_{80}Fe_{20}$(45)]
Protective layer 7: Ta(30)

Values in parentheses indicate layer thickness in Angstroms. The suffixes in the representations of Ni—Fe alloys and Pt—Mn alloys represent composition ratios in terms of at %.

These samples formed to have the above-mentioned structures were heat-treated, and the exchange coupling magnetic field (Hex) and resistance variation ratio (ΔMR) were measured. The results are shown in Table 4. The heat-treatment was conducted for more than 2 hours at temperatures not lower than 200° C.

TABLE 4

|  | Example 7 | Example 8 | Comp. Ex. 7 | Comp. Ex. 8 |
|---|---|---|---|---|
| Interface with seed layer | Non-alignment very strong | Non-alignment very strong | Almost aligned | Almost aligned |
| Saturation magnetic field of seed layer | 0.9T | Non-magnetic | 0.9T | Non-magnetic |
| specific resistance of seed layer | 25 μΩ · cm | 160 μΩ · cm | 25 μΩ · cm | 160 μΩ · cm |
| Crystalline structure of seed layer | Mostly face-centered cubes with strong (111) plane orientation | Mostly face-centered cubes with strong (111) plane orientation | Mostly face-centered cubes with strong (111) plane orientation | Mostly face-centered cubes with strong (111) plane orientation |
| Interface with ferro-magnetic layer | Non-alignment very strong | Non-alignment very strong | Almost aligned | Almost aligned |

TABLE 4-continued

|  | Example 7 | Example 8 | Comp. Ex. 7 | Comp. Ex. 8 |
|---|---|---|---|---|
| (Hex) | $18.2 \times 10^4$ A/m | $18.5 \times 10^4$ A/m | $6 \times 10^4$ A/m | $6.5 \times 10^4$ A/m |
| Resistance variation ratio | 7.8% | 10.29% | 8.1% | 10.3% |
| Role played by seed layer | Seed layer is composed mainly of face-centered cubic structure with the densest (111) plane strongly aligned, so that layers from Pt to free layer have rather strong (111) plane orientation and, accordingly, greater crystal grains, resulting in large resistance variation ratio. Alignment between seed layer and PtMn, however, makes it difficult to obtain large Hex on one hand, but on the other hand, significantly enhances the (111) planes of layers down to the free layer, resulting in greater crystal grain size and consequently greater resistance variation ratio. In order to simultaneously meet the requirements for greater Hex and greater resistance variation ratio, it is preferred that the (111) plane orientations are enhanced in the layers from the PtMn layer to the free layer, while maintaining a non-aligned state between the seed layer and the PtMn layer, as in Example 8. | | | |
| Features of PtMn | Bulk ideal composition (Pt50-Mn 50) used in the region around central region, while maintaining very strongly non-aligned state | Bulk ideal composition (Pt50-Mn 50) used in the region around central region, while maintaining very strongly non-aligned state | Insufficient due to almost-aligned state, although the composition is ideal | insufficient due to almost-aligned state, although the composition is ideal |
| Feature of resistance variation ratio | Variation ratio not large because of small specific resistance of seed layer | Variation ratio large because of large specific resistance of seed layer | Variation ratio not large because of small specific resistance of seed layer | Variation ratio large because of large specific resistance of seed layer |

As shown in Table 4, the same "Role of seed layer" was applicable to Examples 7 and 8, and Comparative Examples 7 and 8. The seed layer 22 in accordance with the present invention is primarily constituted by a face-centered cubic structure, with the (111) planes preferentially oriented in the direction parallel to the interface. Therefore, the layers formed on seed layer 22, from the antiferromagnetic layer to free magnetic layer 1, also have their (111) planes preferentially oriented in the direction parallel to the interfaces, thus causing greater crystal grains. For these reasons, large resistance variation ratios were obtained in all samples, as will be seen from FIG. 4.

Example 8 showed a greater resistance variation ratio than Example 7, and Comparative Example 8 showed a greater resistance variation ratio than Comparative Example 7. In Example 7 and Comparative Example 7, the seed layer 22 formed of $Ni_{80}Fe_{20}$ alloy had a low specific resistance, whereas in Example 8 and Comparative Example 8 the seed layer 22 containing non-magnetic Cr and having a composition $Ni_{60}Fe_{10}Cr_{30}$ had a high specific resistance.

In example 7 and Comparative Example 7, the sense current shunted into seed layer 22 due to the low specific resistance, whereas, in Example 8 and Comparative Example 8, such shunting did not take place. As a result, greater resistance variation ratios were obtained in Example 8 and Comparative Example 8 than in Example 7 and Comparative Example 7.

Referring now to the exchange coupling magnetic field, it is understood that Examples 7 and 8 showed much greater exchange coupling magnetic fields than those obtained in Comparative Examples 7 and 8. This is because in Examples 7 and 8, the interface adjacent to seed layer 22 and the interface adjacent to pinned magnetic layer 3 were held in the non-aligned state, by virtue of the presence of third antiferromagnetic layer 25 and first antiferromagnetic layer 23. In contrast, in Comparative Examples 7 and 8, transformation from the disordered lattice structure into the ordered lattice structure could hardly occur due to the aligned state at the interface adjacent to the seed layer and at the interface adjacent to pinned magnetic layer 3, even though antiferromagnetic layer 31 had an ideal composition for facilitating transformation from a disordered lattice structure into an ordered lattice structure upon heat-treatment. Thus, smaller values of the exchange coupling magnetic field resulted.

From the results of this experiment, it is understood that the requirements for high resistance variation ratio and exchange coupling magnetic field are satisfied when the following conditions are met. Namely, a large resistance variation ratio can be obtained when a seed layer 22 made of a non-magnetic material having a large specific resistance is formed on the side of the antiferromagnetic layer opposite to the interface adjacent pinned magnetic layer 3. At the same time, it is preferred that antiferromagnetic layer 4 is formed by depositing three layers, wherein first antiferromagnetic layer 23 contacting pinned magnetic layer 3, and third antiferromagnetic layer 25 contacting seed layer 22, are made to have a large Pt content so that the non-aligned state is maintained at the interfaces adjacent to pinned magnetic layer 3 and seed layer 22. The second antiferromagnetic layer 24 formed between first and second antiferromagnetic layers 23 and 25 is formed to have an ideal composition that is easy to transform from a disordered lattice structure into an ordered lattice structure upon heat-treatment. By using this antiferromagnetic layer, it is possible to enhance the exchange coupling magnetic field (Hex).

As in the case of the experiment results shown in FIGS. 18 and 19, the thicknesses of the first antiferromagnetic layer 23 and the third antiferromagnetic layer 25 are preferably not less than 3 Å and not greater than 30 Å. The composition ratios are preferably such that the Pt content is not less than 53 at % and not greater than 65 at %. The thickness of second antiferromagnetic layer 24 is preferably 70 Å or greater, as in the case of the experiment results shown in FIG. 17.

What is claimed is:

1. A method of producing an exchange coupling film comprising:

forming a first antiferromagnetic layer which contacts a ferromagnetic layer at an interface therebetween, and forming a second antiferromagnetic layer which contacts the first antiferromagnetic layer, the first and second antiferromagnetic layers comprising an element X and Mn, wherein the element X is selected from the group consisting of Pt, Pd, Ir, Rh, Ru, Os, and combinations thereof, such that a composition ratio of the element X of the second antiferromagnetic layer is smaller than a composition ratio of the element X of the first antiferromagnetic layer; and effecting a heat-treatment such that an exchange coupling magnetic field is developed at the interface between the first antiferromagnetic layer and the ferromagnetic layer.

2. The method of claim 1, wherein a lattice constant of the first antiferromagnetic layer is different from a lattice constant of the ferromagnetic layer at at least a part of the interface between the first antiferromagnetic layer and the ferromagnetic layer.

3. The method according to claim 1 or 2, wherein a crystal orientation of the first antiferromagnetic layer is different from a crystal orientation of the ferromagnetic layer at at least part of the interface between the first antiferromagnetic layer and the ferromagnetic layer.

4. The method of claim 3, wherein a non-aligned state is created at at least a part of the interface between the first antiferromagnetic layer and the ferromagnetic layer.

5. The method as in one of claims 1–2, wherein a non-aligned state is created at at least a part of the interface between the first antiferromagnetic layer and the ferromagnetic layer.

6. The method of claim 1, wherein the composition ratio of the element X of the second antiferromagnetic layer is not less than 44 at % and not more than 57 at %.

7. The method of claim 6, wherein the composition ratio of the element X of the second antiferromagnetic layer is not less than 46 at % and not more than 55 at %.

8. The method of claim 7, wherein the composition ratio of the element X of the first antiferromagnetic layer is not less than 53 at % and not more than 65 at %.

9. The method of claim 8, wherein the composition ratio of the element X of the first antiferromagnetic layer is not less than 55 at % and not more than 60 at %.

10. A method of producing a magnetoresistive sensor comprising an antiferromagnetic layer, a pinned magnetic layer in contact with the antiferromagnetic layer which has a direction of magnetization fixed by an exchange anisotropic magnetic field with the antiferromagnetic layer, a non-magnetic intermediate layer between the pinned magnetic layer and a free magnetic layer, and a bias layer which aligns a direction of magnetization of the free magnetic layer in a direction that intersects the direction of magnetization of the pinned magnetic layer, the method comprising:

forming an exchange coupling film by the method of claim 8; and forming the antiferromagnetic layer and the pinned magnetic layer in contact therewith from the exchange coupling film.

11. A method of producing a magnetoresistive sensor comprising an antiferromagnetic layer, a pinned magnetic layer in contact with the antiferromagnetic layer which has a direction of magnetization fixed by an exchange anisotropic magnetic field with the antiferromagnetic layer, a non-magnetic intermediate layer between the pinned magnetic layer and a free magnetic layer having an upper side and a lower side, and an antiferromagnetic exchange bias layer on either the upper side or the lower side of the free magnetic layer, the antiferromagnetic exchange bias layer comprising a plurality of portions spaced from each other in a track width direction the method comprising:

forming an exchange coupling film by the method of claim 8; and forming the exchange bias layer and the free magnetic layer from the exchange coupling film, such that the free magnetic layer is magnetized in a fixed direction.

12. A method of producing a magnetoresistive sensor comprising a first antiferromagnetic layer; a first pinned magnetic layer overlying the first antiferromagnetic layer; a first non-magnetic layer overlying the first pinned magnetic layer; a free magnetic layer overlying the first non-magnetic layer; a second non-magnetic layer overlying the free magnetic layer; a second pinned magnetic layer overlying the second non-magnetic layer; a second antiferromagnetic layer overlying the second pinned magnetic layer, the first and second antiferromagnetic layers serving to fix directions of magnetization of the first and second pinned magnetic layers by exchange anisotropic magnetic fields; and a bias layer which aligns a direction of magnetization of the free magnetic layer to a direction that intersects the directions of the first and second pinned magnetic layers, the method comprising:

forming an exchange coupling film by the method of claim 8; and forming at least one of the first and the second antiferromagnetic layers, and at least one of the first and the second pinned magnetic layers in contact therewith, from the exchange coupling film.

13. A method of producing a magnetoresistive sensor comprising a magnetoresistive layer having an upper side and a lower side and a soft magnetic layer, the magnetoresistive layer and the soft magnetic layer being superposed through the intermediacy of a non-magnetic layer, and an antiferromagnetic layer on the upper side or the lower side of the magnetoresistive layer, the antiferromagnetic layer comprising a plurality of portions spaced apart in a track width direction, the method comprising:

forming an exchange coupling film by the method of claim 8; and forming the antiferromagnetic layer and the magnetoresistive layer from the exchange coupling film.

14. The method of claim 6, wherein the composition ratio of the element X of the first antiferromagnetic layer is not less than 53 at % and not more than 65 at %.

15. The method of claim 14, wherein the composition ratio of the element X of the first antiferromagnetic layer is not less than 55 at % and not more than 60 at %.

16. The method of claim 1, wherein the composition ratio of the element X of the first antiferromagnetic layer is not less than 53 at % and not more than 65 at %.

17. The method of claim 16, wherein the composition ratio of the element X of the first antiferromagnetic layer is not less than 55 at % and not more than 60 at %.

18. A method of producing a magnetoresistive sensor comprising an antiferromagnetic layer, a pinned magnetic layer in contact with the antiferromagnetic layer which has a direction of magnetization fixed by an exchange anisotropic magnetic field with the antiferromagnetic layer, a non-magnetic intermediate layer between the pinned magnetic layer and a free magnetic layer, and a bias layer which aligns a direction of magnetization of the free magnetic layer in a direction that intersects the direction of magnetization of the pinned magnetic layer, the method comprising:

forming an exchange coupling film by the method of claim 16; and forming the antiferromagnetic layer and the pinned magnetic layer in contact therewith from the exchange coupling film.

19. A method of producing a magnetoresistive sensor comprising an antiferromagnetic layer, a pinned magnetic layer in contact with the antiferromagnetic layer which has a direction of magnetization fixed by an exchange anisotropic magnetic field with the antiferromagnetic layer, a non-magnetic intermediate layer formed between the pinned magnetic layer and a free magnetic layer having an upper side and a lower side, and an antiferromagnetic exchange bias layer on either the upper side or the lower side of the free magnetic layer, the antiferromagnetic exchange bias layer comprising a plurality of and portions spaced from each other in a track width direction, the method comprising:

forming an exchange coupling film by the method of claim 16; and forming the exchange bias layer and the free magnetic layer from the exchange coupling film, such that the free magnetic layer is magnetized in a fixed direction.

20. A method of producing a magnetoresistive sensor comprising a first antiferromagnetic layer; a first pinned magnetic layer overlying the first antiferromagnetic layer; a first non-magnetic layer overlying the first pinned magnetic layer; a free magnetic layer overlying the first non-magnetic layer; a second non-magnetic layer overlying the free magnetic layer; a second pinned magnetic layer overlying the second non-magnetic layer; a second antiferromagnetic layer overlying the second pinned magnetic layer, the first and second antiferromagnetic layers serving to fix directions of magnetization of the first and second pinned magnetic layers by exchange anisotropic magnetic fields; and a bias layer which aligns a direction of magnetization of the free magnetic layer to a direction that intersects the directions of the first and second pinned magnetic layers, the method comprising:

forming an exchange coupling film by the method of claim 16; and forming at least one of the first and the second antiferromagnetic layers, and at least one of the first and the second pinned magnetic layers in contact therewith, from the exchange coupling film.

21. A method of producing a magnetoresistive sensor comprising a magnetoresistive layer having an upper side and a lower side and a soft magnetic layer, the magnetoresistive layer and the soft magnetic layer being superposed through the intermediacy of a non-magnetic layer, and an antiferromagnetic layer on the upper side or the lower side of the magnetoresistive layer, the antiferromagnetic layer comprising a plurality of portions spaced apart in a track width direction, the method comprising:

forming an exchange coupling film by the method of claim 16; and forming the antiferromagnetic layer and the magnetoresistive layer from the exchange coupling film.

22. The method of claim 1, wherein the second antiferromagnetic layer has a thickness of 70 Å or greater.

23. The method of claim 22, wherein the first antiferromagnetic layer has a thickness not smaller than 3 Å and not greater than 30 Å.

24. The method of claim 1, wherein the first antiferromagnetic layer has a thickness not smaller than 3 Å and not greater than 30 Å.

25. The method of claim 1, wherein the first and second antiferromagnetic layers are formed by a sputtering process, and wherein a sputtering gas pressure at which the first antiferromagnetic layer is formed is lower than a sputtering gas pressure at which the second antiferromagnetic layer is formed.

26. A method of producing a magnetoresistive sensor comprising an antiferromagnetic layer, a pinned magnetic layer in contact with the antiferromagnetic layer which has a direction of magnetization fixed by an exchange anisotropic magnetic field with the antiferromagnetic layer, a non-magnetic intermediate layer between the pinned magnetic layer and a free magnetic layer, and a bias layer which aligns a direction of magnetization of the free magnetic layer in a direction that intersects the direction of magnetization of the pinned magnetic layer, the method comprising:

forming an exchange coupling film by the method of claim 1; and forming the antiferromagnetic layer and the pinned magnetic layer in contact herewith from the exchange coupling film.

27. A method of producing a magnetoresistive sensor comprising an antiferromagnetic layer, a pinned magnetic layer in contact with the antiferromagnetic layer which has a direction of magnetization fixed by an exchange anisotropic magnetic field with the antiferromagnetic layer, a non-magnetic intermediate layer formed between the pinned magnetic layer and a free magnetic layer having an upper side and a lower side, and an antiferromagnetic exchange bias layer on either the upper side or the lower side of the free magnetic layer, the antiferromagnetic exchange bias layer comprising a plurality of and portions spaced from each other in a track width direction, the method comprising:

forming an exchange coupling film by the method of claim 1; and forming the exchange bias layer and the free magnetic layer from the exchange coupling film, such that the free magnetic layer is magnetized in a fixed direction.

28. A method of producing a magnetoresistive sensor comprising a first antiferromagnetic layer; a first pinned magnetic layer overlying the first antiferromagnetic layer; a first non-magnetic layer overlying the first pinned magnetic layer; a free magnetic layer overlying the first non-magnetic layer; a second non-magnetic layer overlying the free magnetic layer; a second pinned magnetic layer overlying the second non-magnetic layer; a second antiferromagnetic layer overlying the second pinned magnetic layer, the first and second antiferromagnetic layers serving to fix directions of magnetization of the first and second pinned magnetic layers by exchange anisotropic magnetic fields; and a bias layer which aligns a direction of magnetization of the free magnetic layer to a direction that intersects the directions of the first and second pinned magnetic layers, the method comprising:

forming an exchange coupling film by the method of claim 1; and forming at least one of the first and the second antiferromagnetic layers, and at least one of the first and the second pinned magnetic layers in contact therewith, from the exchange coupling film.

29. A method of producing a magnetoresistive sensor comprising a magnetoresistive layer having an upper side and a lower side and a soft magnetic layer, the magnetoresistive layer and the soft magnetic layer being superposed through the intermediacy of a non-magnetic layer, and an antiferromagnetic layer on the upper side or the lower side of the magnetoresistive layer, the antiferromagnetic layer comprising a plurality of portions spaced apart in a track width direction, the method comprising:

forming an exchange coupling film by the method of claim 1, and forming the antiferromagnetic layer and the magnetoresistive layer from the exchange coupling film.

30. A method of producing an exchange coupling film comprising:

forming a first antiferromagnetic layer which contacts a ferromagnetic layer at an interface therebetween, and forming a second antiferromagnetic layer which contacts the first antiferromagnetic layer, the first and second antiferromagnetic layers comprising an element X, an element X' and Mn, wherein the element X is selected from the group consisting of Pt, Pd, Ir, Rh, Ru, Os, and combinations thereof, and the element X' selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, a rare earth element, and combinations thereof, such that a composition ratio of the elements X+X' of the second antiferromagnetic layer is smaller than a composition ratio of the elements X+X' of the first antiferromagnetic layer; and effecting a heat-treatment such that an exchange coupling magnetic field is developed at the interface between the first antiferromagnetic layer and the ferromagnetic layer.

31. The method of claim 30, wherein a lattice constant of the first antiferromagnetic layer is different from a lattice constant of the ferromagnetic layer at at least a part of the interface between the first antiferromagnetic layer and the ferromagnetic layer.

32. The method according to claim 31, wherein a crystal orientation of the first antiferromagnetic layer is different from a crystal orientation of the ferromagnetic layer at at least a part of the interface between the first antiferromagnetic layer and the ferromagnetic layer.

33. The method according to claim 30, wherein a crystal orientation of the first antiferromagnetic layer is different from a crystal orientation of the ferromagnetic layer at at least a part of the interface between the first antiferromagnetic layer and the ferromagnetic layer.

34. The method of claim 30, wherein a non-aligned state is created at at least a part of the interface between the first antiferromagnetic layer and the ferromagnetic layer.

35. The method of claim 30, wherein the element X' is selected from the group consisting of an element which invades interstices of a space lattice composed of the element X and the Mn, and an element which substitutes for a portion of lattice points of a crystalline lattice constituted by the Mn and the element X.

36. The method of claim 30, wherein the composition ratio of the elements X+X' of the second antiferromagnetic layer is not less than 44 at % and not more than 57 at %.

37. The method of claim 36, wherein the composition ratio of the elements X+X' of the second antiferromagnetic layer is not less than 46 at % and not more than 55 at %.

38. The method of claim 37, wherein the composition ratio of the elements X+X' of the first antiferromagnetic layer is not less than 53 at % and not more than 65 at %.

39. The method of claim 38, wherein the composition ratio of the elements X+X' of the first antiferromagnetic layer is not less than 55 at % and not more than 60 at %.

40. The method of claim 36, wherein the composition ratio of the elements X+X' of the first antiferromagnetic layer is not less than 53 at % and not more than 65 at %.

41. The method of claim 40, wherein the composition ratio of the elements X+X' of the first antiferromagnetic layer is not less than 55 at % and not more than 60 at %.

42. The method of claim 30, wherein the composition ratio of the elements X+X' of the first antiferromagnetic layer is not less than 53 at % and not more than 65 at %.

43. The method of claim 42, wherein the composition ratio of the elements X+X' of the first antiferromagnetic layer is not less than 55 at % and not more than 60 at %.

44. The method of claim 30, wherein the second antiferromagnetic layer has a thickness of 70 Å or greater.

45. The method of claim 44, wherein the first antiferromagnetic layer has a thickness not smaller than 3 Å and not greater than 30 Å.

46. The method of claim 30, wherein the first antiferromagnetic layer has a thickness not smaller than 3 Å and not greater than 30 Å.

47. The method of claim 30, wherein the first and second antiferromagnetic layers are formed by a sputtering process, and wherein a sputtering gas pressure at which the first antiferromagnetic layer is formed is lower than a sputtering gas pressure at which the second antiferromagnetic layer is formed.

48. A method of producing a magnetoresistive sensor comprising an antiferromagnetic layer, a pinned magnetic layer in contact with the antiferromagnetic layer which has a direction of magnetization fixed by an exchange anisotropic magnetic field with the antiferromagnetic layer, a non-magnetic intermediate layer between the pinned magnetic layer and a free magnetic layer, and a bias layer which aligns a direction of magnetization of the free magnetic layer in a direction that intersects the direction of magnetization of the pinned magnetic layer, the method comprising:

forming an exchange coupling film by the method of claim 30; and forming the antiferromagnetic layer and the pinned magnetic layer in contact therewith from the exchange coupling film.

49. A method of producing a magnetoresistive sensor comprising an antiferromagnetic layer, a pinned magnetic layer in contact with the antiferromagnetic layer which has a direction of magnetization fixed by an exchange anisotropic magnetic field with the antiferromagnetic layer, a non-magnetic intermediate layer between the pinned magnetic layer and a free magnetic layer having an upper side and a lower side, and an antiferromagnetic exchange bias layer on either the upper side or the lower side of the free magnetic layer, the antiferromagnetic exchange bias layer comprising a plurality of portions spaced from each other in a track width direction the method comprising:

forming an exchange coupling film by the method of claim 30; and forming the exchange bias layer and the free magnetic layer from the exchange coupling film, such that the free magnetic layer is magnetized in a fixed direction.

50. A method of producing a magnetoresistive sensor comprising a first antiferromagnetic layer; a first pinned magnetic layer overlying the first antiferromagnetic layer; a first non-magnetic layer overlying the first pinned magnetic layer; a free magnetic layer overlying the first non-magnetic layer; a second non-magnetic layer overlying the free magnetic layer; a second pinned magnetic layer overlying the second non-magnetic layer; a second antiferromagnetic layer overlying the second pinned magnetic layer, the first and second antiferromagnetic layers serving to fix directions of magnetization of the first and second pinned magnetic layers by exchange anisotropic magnetic fields; and a bias layer which aligns a direction of magnetization of the free magnetic layer to a direction that intersects the directions of the first and second pinned magnetic layers, the method comprising:

forming an exchange coupling film by the method of claim 30; and forming at least one of the first and the second antiferromagnetic layers, and at least one of the first and the second pinned magnetic layers in contact therewith, from the exchange coupling film.

51. A method of producing a magnetoresistive sensor comprising a magnetoresistive layer having an upper side and a lower side and a soft magnetic layer, the magnetoresistive layer and the soft magnetic layer being superposed through the intermediacy of a non-magnetic layer, and an antiferromagnetic layer on the upper side or the lower side of the magnetoresistive layer, the antiferromagnetic layer comprising a plurality of portions spaced apart in a track width direction, the method comprising:

forming an exchange coupling film by the method of claim 30; and forming the antiferromagnetic layer and the magnetoresistive layer from the exchange coupling film.

52. A method of producing an exchange coupling film which develops an exchange coupling magnetic field at an interface between an antiferromagnetic layer and a ferromagnetic layer, the method comprising:

forming the ferromagnetic layer;

forming the antiferromagnetic layer on the ferromagnetic layer by a sputtering process in which an element X and Mn are used as sputtering targets, wherein the element X is selected from the group consisting of Pt, Pd, Ir, Rh, Ru, Os, and combinations thereof, and wherein a sputtering gas pressure is progressively increased in a direction away from the ferromagnetic layer during the forming of the antiferromagnetic layer, such that a composition ratio of the element X is reduced in a direction away from the ferromagnetic layer; and effecting a heat-treatment after forming the antiferromagnetic layer and the ferromagnetic layer, such that an exchange coupling magnetic field is developed at the interface between the antiferromagnetic layer and the ferromagnetic layer.

53. The method of claim 52, wherein a difference in lattice constant is created between the antiferromagnetic layer and the ferromagnetic layer at at least a part of the interface between the antiferromagnetic layer and the ferromagnetic layer.

54. The method of claim 52, wherein a difference in crystal orientation is created between the antiferromagnetic layer and the ferromagnetic layer at at least a part of the interface between the antiferromagnetic layer and the ferromagnetic layer.

55. The method of claim 52, wherein a non-aligned state is created at at least a part of the interface between the antiferromagnetic layer and the ferromagnetic layer.

56. The method of claim 52, further comprising: forming the antiferromagnetic layer by a sputtering process in which elements X+X' and Mn are used as sputtering targets, wherein the element X' is selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, a rare earth element, and combinations thereof, and wherein the sputtering gas pressure is progressively increased in a direction away from the ferromagnetic layer during the forming of the antiferromagnetic layer, such that a composition ratio of the elements X+X' is reduced in a direction away from the ferromagnetic layer.

57. The method of claim 56, wherein a difference in lattice constant is created between the antiferromagnetic layer and the ferromagnetic layer at at least a part of the interface between the antiferromagnetic layer and the ferromagnetic layer.

58. The method of claim 56, wherein a difference in crystal orientation is created between the antiferromagnetic layer and the ferromagnetic layer at at least a part of the interface between the antiferromagnetic layer and the ferromagnetic layer.

59. The method of claim 56, wherein a non-aligned state is created at at least a part of the interface between the antiferromagnetic layer and the ferromagnetic layer.

60. The method of claim 56, wherein the element X' is selected from the group consisting of an element which invades interstices of a space lattice composed of the element X and the Mn, and an element which substitutes for a portion of lattice points of a crystalline lattice constituted by the Mn and the element X.

61. The method of claim 56, wherein the composition ratio of the elements X+X' of the antiferromagnetic layer to a total composition ratio of the antiferromagnetic layer is not less than 44 at % and not more than 57 at %, in a region of the antiferromagnetic layer opposite to the interface.

62. The method of claim 61, wherein the composition ratio of the elements X+X' of the antiferromagnetic layer to a total composition ratio of the antiferromagnetic layer is not less than 46 at % and not more than 55 at %, in a region of the antiferromagnetic layer opposite the interface.

63. The method of claim 62, wherein the composition ratio of the elements X+X' of the antiferromagnetic layer to a total composition ratio of the antiferromagnetic layer is not less than 53 at % and not more than 65 at %, in a region near the interface of the antiferromagnetic layer and the ferromagnetic layer.

64. The method of claim 63, wherein the composition ratio of the elements X+X' of the antiferromagnetic layer to a total composition ratio of the antiferromagnetic layer is not less than 55 at % and not more than 60 at %, in a region of the antiferromagnetic layer near the interface.

65. The method of claim 61, wherein the composition ratio of the elements X+X' of the antiferromagnetic layer to a total composition ratio of the antiferromagnetic layer is not less than 53 at % and not more than 65 at %, in a region near the interface of the antiferromagnetic layer and the ferromagnetic layer.

66. The method of claim 65, wherein the composition ratio of the elements X+X' of the antiferromagnetic layer to a total composition ratio of the antiferromagnetic layer is not less than 55 at % and not more than 60 at %, in a region of the antiferromagnetic layer near the interface.

67. The method of claim 56, wherein the composition ratio of the elements X+X' of the antiferromagnetic layer to a total composition ratio of the antiferromagnetic layer is not less than 53 at % and not more than 65 at %, in a region near the interface of the antiferromagnetic layer and the ferromagnetic layer.

68. The method of claim 67, wherein the composition ratio of the elements X+X' of the antiferromagnetic layer to a total composition ratio the antiferromagnetic layer is not less than 55 at % and not more than 60 at %, in a region of the antiferromagnetic layer near the interface.

69. The method of claim 56, wherein the antiferromagnetic layer has a thickness of 73 Å or greater.

70. The method of claim 52, wherein the composition ratio of the element X of the antiferromagnetic layer to a total composition ratio of the antiferromagnetic layer is not less than 44 at % and not more than 57 at %, in a region of the antiferromagnetic layer opposite to the interface.

71. The method of claim 70, wherein the composition ratio of the element X of the antiferromagnetic layer to a total composition ratio of the antiferromagnetic layer is not less than 46 at % and not more than 55 at %, in a region of the antiferromagnetic layer opposite to the interface.

72. The method of claim 71, wherein the composition ratio of the element X of the antiferromagnetic layer to a total composition ratio of the antiferromagnetic layer is not less than 53 at % and not more than 65 at %, in a region near the interface of the antiferromagnetic layer and the ferromagnetic layer.

73. The method of claim 72, wherein the composition ratio of the element X of the antiferromagnetic layer to a total composition ratio of the antiferromagnetic layer is not less than 55 at % and not more than 60 at %, in a region of the antiferromagnetic layer near the interface.

74. The method of claim 70, wherein the composition ratio of the element X of the antiferromagnetic layer to a total composition ratio of the antiferromagnetic layer is not less than 53 at % and not more than 65 at %, in a region near the interface of the antiferromagnetic layer and the ferromagnetic layer.

75. The method of claim 74, wherein the composition ratio of the element X of the antiferromagnetic layer to a total composition ratio of the antiferromagnetic layer is not less than 55 at % and not more than 60 at %, in a region of the antiferromagnetic layer near the interface.

76. The method of claim 52, wherein the composition ratio of the element X of the antiferromagnetic layer to a total composition ratio of the antiferromagnetic layer is not less than 53 at % and not more than 65 at %, in a region near the interface of the antiferromagnetic layer and the ferromagnetic layer.

77. The method of claim 76, wherein the composition ratio of the element X of the antiferromagnetic layer to a total composition ratio of the antiferromagnetic layer is not less than 55 at % and not more than 60 at %, in a region of said antiferromagnetic layer near the interface.

78. The method of claim 52, wherein the antiferromagnetic layer has a thickness of 73 Å or greater.

* * * * *

UNITED STATES PATENT AND TRADEMARK OFFICE
CERTIFICATE OF CORRECTION

PATENT NO.        : 6,607,641 B2                                      Page 1 of 1
APPLICATION NO.   : 09/833459
DATED             : August 19, 2003
INVENTOR(S)       : Masamichi Saito et al.

It is certified that error appears in the above-identified patent and that said Letters Patent is hereby corrected as shown below:

In the Claims

Columns 59-60, in claim 11, line 12, immediately after "width direction" insert --,-- (comma).

Column 62, in claim 26, line 14, delete "herewith" and substitute --therewith-- in its place.

Column 66, in claim 68, line 3, insert --of-- after "composition ratio".

Signed and Sealed this

Fifth Day of December, 2006

JON W. DUDAS
*Director of the United States Patent and Trademark Office*